US012723874B2

(12) United States Patent
Najafi et al.

(10) Patent No.: US 12,723,874 B2
(45) Date of Patent: Sep. 1, 2026

(54) THREE DIMENSIONAL STACKED MICROSTRUCTURES FOR USE IN GYROSCOPES AND OTHER DEVICES

(71) Applicant: THE REGENTS OF THE UNIVERSITY OF MICHIGAN, Ann Arbor, MI (US)

(72) Inventors: Khalil Najafi, Ann Arbor, MI (US); Sajal Singh, Ann Arbor, MI (US); Jae Yoong Cho, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 336 days.

(21) Appl. No.: 18/209,454

(22) Filed: Jun. 13, 2023

(65) Prior Publication Data

US 2024/0019249 A1 Jan. 18, 2024

Related U.S. Application Data

(62) Division of application No. 17/205,562, filed on Mar. 18, 2021, now Pat. No. 11,703,331.

(Continued)

(51) Int. Cl.
*G01C 19/5783* (2012.01)
*B81B 3/00* (2006.01)

(Continued)

(52) U.S. Cl.
CPC ........ *G01C 19/5783* (2013.01); *B81B 3/0021* (2013.01); *B81C 1/00444* (2013.01);

(Continued)

(58) Field of Classification Search
None
See application file for complete search history.

(56) References Cited

U.S. PATENT DOCUMENTS 7,360,423 B2 4/2008 Ayazi et al.
8,011,246 B2 9/2011 Stewart (Continued)

OTHER PUBLICATIONS

Farrokh Ayazi, "The HARPSS process for fabrication of precision MEMS inertial sensors", Mechatronics 12 (2002) pp. 1185-1199. School of Electrical and Computer Engineering, Georgia Institute of Technology, Atlanta, GA.

(Continued)

*Primary Examiner* — Mark A Shabman
(74) *Attorney, Agent, or Firm* — Harness, Dickey & Pierce, P.L.C.

(57) ABSTRACT

Three-dimensional (3D) micro-scale shells are presented with selectively removed regions/openings and which can be used in sensors and actuators, including gyroscopes. Example shells consisting of a suspended ring-shaped resonator that is supported using multiple beams that are not in the plane of the ring and are attached to a support post can be formed. Shells with various sizes and geometries of selectively removed regions and openings allow the creation of micro electromechanical systems (MEMS) sensors and actuators with a wide range of engineered mechanical and electrical properties. These shells can be used to form stacked 3D structures for various types of MEMS sensor and actuator devices, such as resonant gyroscopes, with sense and drive electrodes that conform to the curved profile of the resonant shell using for gyroscopes. 3D shells formed from a starting parent substrate are released and separated from their parent substrate using a number of techniques.

13 Claims, 52 Drawing Sheets

Related U.S. Application Data

(60) Provisional application No. 62/991,390, filed on Mar. 18, 2020, provisional application No. 62/991,338, filed on Mar. 18, 2020, provisional application No. 62/991,419, filed on Mar. 18, 2020.

(51) Int. Cl.

| | |
|---|---|
| ***B81C 1/00*** | (2006.01) |
| ***G01C 19/00*** | (2013.01) |
| ***G01C 19/5684*** | (2012.01) |
| ***G01C 19/5691*** | (2012.01) |
| ***H03H 3/007*** | (2006.01) |
| ***H03H 9/02*** | (2006.01) |
| ***H03H 9/24*** | (2006.01) |

(52) U.S. Cl.

CPC ....... *G01C 19/005* (2022.01); *G01C 19/5684* (2013.01); *G01C 19/5691* (2013.01); *H03H 3/0072* (2013.01); *H03H 9/02259* (2013.01); *H03H 9/2405* (2013.01); *B81B 2201/0242* (2013.01); *B81B 2201/0271* (2013.01); *B81C 2201/0143* (2013.01); *H03H 2009/02496* (2013.01)

(56) References Cited

U.S. PATENT DOCUMENTS

| | | | | |
|---|---|---|---|---|
| 8,631,702 | B2 | 1/2014 | Horning et al. | |
| 9,139,417 | B2 | 9/2015 | Trusov et al. | |
| 9,494,425 | B2 | 11/2016 | Najafi et al. | |
| 9,796,586 | B2 | 10/2017 | Najafi et al. | |
| 10,532,943 | B2 | 1/2020 | Najafi et al. | |
| 10,730,748 | B2 | 8/2020 | Najafi et al. | |
| 2010/0083758 | A1* | 4/2010 | Vandebeuque | G01C 19/5691 310/300 |
| 2011/0083508 | A1* | 4/2011 | Ragot | G01C 19/5691 73/504.12 |
| 2011/0290021 | A1* | 12/2011 | Horning | G01C 19/5691 29/592.1 |
| 2012/0216620 | A1* | 8/2012 | Vandebeuque | G01C 19/56 73/649 |
| 2014/0360266 | A1 | 12/2014 | Su et al. | |
| 2016/0032449 | A1 | 2/2016 | Painter | |
| 2016/0047653 | A1* | 2/2016 | Shkel | G01C 19/5691 73/504.13 |
| 2016/0344368 | A1 | 11/2016 | Ayazi et al. | |
| 2017/0016742 | A1* | 1/2017 | Shkel | G01C 25/00 |
| 2017/0248422 | A1* | 8/2017 | Najafi | G01D 5/34 |
| 2018/0188030 | A1* | 7/2018 | Shang | G01C 19/5691 |
| 2020/0309527 | A1* | 10/2020 | Shkel | B81C 1/00182 |

OTHER PUBLICATIONS

A. Vafanejad, E.S. Kim, "Sub-degree Angle Detection Using Micromachined Dome-Shaped-Diaphragm Resonator with Wine-Glass Mode Vibration", Solid-State Sensors, Actuators and Mircosystems Workshop, Hilton Head, South Carolina, Jun. 8-12, 2014. Department of Electrical Engineering, University of Southern California, Los Angeles, CA.

Arash Vafanejad, Eun Sok Kim "Effect of Diaphragm Perforation on Quality Factor of Hemispherical Resonator Gyroscope", Transducers 2015, Anchorage, Alaska, Jun. 21-25, 2015. Department of Electrical Engineering, University of Southern California, Los Angeles, CA.

Jonathan J Bernstein et al., High Q diamond hemispherical resonators: fabrication and energy loss mechanisms, Journal of Micromechanics and Microengineering 25 085006 (2015).

Asadian, Mohammad et al., "Fused Quartz Dual Shell Resonator", 2019 IEEE International Symposium on Inertial Sensors and Systems (INERTIAL), Apr. 1, 2019.

Singh, Sajal et al., "Shell-in-Shell (SiS): 3D Shell Resonator with 3D Conformal Shell Electrodes", 2020 IEEE International Symposium on Inertial Sensors and Systems.

* cited by examiner

Prior Art Approach – II
Laser Cutting

THREE DIMENSIONAL STACKED MICROSTRUCTURES FOR USE IN GYROSCOPES AND OTHER DEVICES

CROSS-REFERENCE TO RELATED APPLICATIONS

This application is a divisional of U.S. patent application Ser. No. 17/205,562, filed Mar. 18, 2021. This application claims the benefit of U.S. Provisional Application No. 62/991,418 filed on Mar. 18, 2020; U.S. Provisional Application No. 62/991,338 filed on Mar. 18, 2020; and U.S. Provisional Application No. 62/991,390 filed on Mar. 18, 2020. The entire disclosure of each of the above applications is incorporated herein by reference.

GOVERNMENT CLAUSE

This invention was partially made with government support under N66001-16-1-4029 awarded by the Space and Naval Warfare Systems Center, Pacific. The government has certain rights in the invention.

FIELD

The present disclosure relates to three-dimensional microstructures with selectively removed regions, and the use of these structures in sensors and devices such as gyroscopes, and relating methods.

BACKGROUND

Advancement in microelectromechanical systems (MEMS) technologies has enabled the fabrication of different types of sensors and actuators for myriad applications. When these sensors are either small, in the range of a few microns to a few millimeters, or when they are fabricated using technologies that are compatible with volume manufacturing and provide precision structures or features, sometimes they are referred to as MEMS devices. There is an ever-growing commercial interest in MEMS sensors, actuators, and other components because of their low cost, small size, light weight and low power characteristics. Furthermore, the need for better resolution, better signal sensitivity, larger bandwidth, lower noise, lower temperature/vibration/shock sensitivity and lower cost from these sensors is also growing.

One such device is a gyroscope which is used to measure rotation rate or angle of rotation around one or multiple axes. Other sensor devices are those used for measuring acceleration, or pressure, or density, or chemical/gaseous species, or force, or fluid flow/density, or other parameters. There are also other devices that are actuators, for example mechanically resonating structures that can be used as mechanical oscillators for time references, or micromirrors that can be moved. There are also other component devices/structures that are not sensors or actuators but are just structures that can be used as optical/acoustic lenses, as packages or capsules for protection of other devices. The above are just a few examples.

Three-dimensional (3D) structures, like a wine glass 132 in FIG. 1 or a cylinder closed at the bottom 131 in FIG. 1 or a hemispherical shell 136 in FIG. 1, could be used in various sensing and actuation applications, such as, for example only, in chemical/biological sensors, resonators for inertial sensors, resonators for precision clocks, or other sensors or devices that utilize either the changes in resonance characteristics of a mechanical resonator or changes in other properties, such as optical properties, electrical/magnetic properties, or displacement of the device for sensing different parameters, or for producing different functions or effects. FIG. 1 shows cross-sectional views of a few examples of some of these 3D shell structures, although other shapes or geometries could also be used. The shells 131, 132, 133, 134, 135, 136 are anchored at 108 to a support substrate (not shown), and in some cases, like 132 and 137 through at least one support post 140, or sometimes connected to a support substrate around their perimeter 108 in 135 in FIG. 1. They could also be anchored at two points either to a single substrate, or to two substrates, one located below and one above the shell. FIG. 2A shows 3D perspective 200 and cross sectional view 202 of an inverted birdbath shell that is anchored (attached) 208 to a substrate (not shown) through a support post 207 at the center. This shape is also referred to herein as hemi-toroidal. FIG. 2B shows a bell-shaped shell 230 also anchored to a support substrate (not shown) through a support post at the center. Both of these example shells have a continuous surface with no openings or selectively removed regions on their surface. These 3D shells are typically symmetrical around their central axis. These shells can be fabricated from a variety of materials, including dielectrics such as silicon oxide and silicon nitride or different glasses or fused silica (quartz), or from semiconductors such as silicon or polysilicon, or from metals such as gold or nickel. There are also other materials such as metal and glass alloys that could be used. In some applications, these structures can be mechanically resonated, and the resonant shell can be used for sensing different parameters, such as angular rotation rate or angle of rotation. When used for mechanical Coriolis force sensing gyroscopes, the shells are mechanically resonated.

The 3D shell provides several advantages when used as a mechanical resonator, including high symmetry, good resonance quality (high quality-factor Q and low loss through the anchor where the resonator is attached to its support substrate), good tolerance to vibration and shock, and robust performance even when the temperature fluctuates. When fabricated from thermally insulating materials (i.e., materials with low thermal conductivity) such as fused silica or different kinds of glasses or silicon dioxide, they undergo less thermoelastic damping. Fused silica is especially attractive because in addition to providing very low thermal conductivity and low coefficient of thermal expansion (leading to low thermoelastic dissipation), it also has very low internal material losses when used in mechanically vibrating structures, and can therefore provide very high mechanical quality-factor Q. This high Q is very advantageous and desirable in high performance resonant structures used in a variety of sensors, actuators, and other devices mentioned above. Fabricating high precision 3D structures using materials such as fused silica (fused-quartz), which has a high melting temperature around 1800° C., is not straightforward at the micro-scale and specialized techniques are needed. A reflowing technique using a blow torch has been developed to make 3D fused silica structures of different shapes and sizes for use in gyroscopes as discussed in U.S. Pat. Nos. 9,796,586; 10,532,943; and 10,730,748. Other reflowing techniques for forming fused silica and other similar high-melting-temperature materials have also been presented, for example in U.S. Pat. Nos. 9,139,417 and 9,494,425.

One approach for making these 3D shells uses a mold that is fabricated by techniques such as isotropic etching of 3D regions in a substrate (such as a silicon wafer, although other materials like glass can also be potentially used), or physical machining (like laser ablation, micromilling, ultrasonic machining, electro discharge machining, etc.) of 3D features in a substrate like silicon or fused-silica. This mold is then used to support a deposited sacrificial layer. The sacrificial layer is patterned so that it can be removed in selected regions, such as those where a final 3D shell has to be anchored or attached to the supporting mold substrate. This step is followed by the deposition and the patterning of a device structural layer, which can be polysilicon, diamond, silicon oxide, silicon nitride, or even melted glass such as Pyrex, or other materials. After this step, the sacrificial layer is removed (without removing either the substrate or the structural material), leaving behind the device structure. The device which takes the shape of the mold is now released from the substrate, except in areas where it is attached to, for example as shown in US 2016/0344368 A1. Electrodes are needed to drive and sense the motion of the shell in resonance. Electrodes for shells made using the above thin-film approach can be formed in or on the substrate before the deposition of the device structural layer. This approach allows for very small and uniform air gaps and at the same time leads to conformal overlap between the resonator and the electrodes due to the curved nature of the electrodes and the fact that the deposited structural layer follows the profile of the mold. However, resonators fabricated using this approach have generally failed to achieve high Q (Q<<1 Million), due to a combination of factors related to increased energy loss due to structure, size, and material quality. Moreover, because of the limited aspect ratio (meaning small height to radius ratio) and small size (usually these are smaller than about 1 mm in diameter), the drive, sense and tuning capacitance is small even though the electrodes are conformal.

Another approach uses a blowtorch for molding/deformation of the 3D structure. In this approach, shown in FIG. 3, a blowtorch or other heating methods may be used to deform the structural substrate. A blowtorch 332 is useful because it can easily and quickly generate a very high temperature. A high temperature is needed to deform or soften some of the high-quality materials, such as fused silica (fused quartz), for high performance device applications. This process often begins at 300 with a substantially flat structural substrate 302 that is made from materials such as fused silica or other high-quality materials. This substrate might already have been patterned in some regions to reduce its thickness. The substrate is then placed on a graphite mold 306. The mold has a recessed region 309 with a specific shape that will determine the shape of the final three-dimensional structure. For example, if a hollow hemisphere is to be made out of the structural substrate, a cylindrical cavity is created within the mold. The cylindrical cavity has a diameter approximately equal to the outside diameter of the desired hemisphere.

The structural substrate may be placed on the mold and a blowtorch 332 with a fuel-oxygen gas mixture that can be used to produce the high temperature flame needed to soften/melt the structural substrate is brought close to the substrate. A pressure difference is also created across the substrate between the cylindrical cavity 309 in the mold 306, which is now substantially sealed by the substrate placed on top of it, and the outside. This pressure difference can be created by pulling vacuum in the cylindrical cavity in the mold through holes 311 provided at the bottom of the mold. When the substrate is sufficiently heated at 330 by the blowtorch and softens, the pressure difference causes those portions of it that are suspended over the mold cavity to deform 334 and settle down into the mold cavity. Note that it is not necessary that the deformed part of the substrate touch the mold, and in most cases these parts do not touch the surfaces inside the cavity of the mold. It is obvious that other shapes can be used for the cavity in the mold to produce other shapes in the molded/deformed structural substrate. For example, in the cross-sectional view in FIG. 3 there is also a solid-post 304 in the center of the cylindrical cavity in the mold. This post will prevent the center of the flat substrate to deform down and will aid in producing the final shape of the 3D part which looks like a birdbath, as shown in the cross-section 360.

Once the substrate is molded, it is removed, at 360, from the graphite mold. At this stage, the molded/deformed substrate has some portions that have been deformed 362 and some portions that are flat 364 around the edge or perimeter of the regions that have been deformed. These flat portions 364 should be removed to release the useful and desired three-dimensional portion 362. It is noted that one also might need to remove other three-dimensional portions that are not useful, i.e., not all 3D portions are useful and not all flat portions are not useful. But in the rest of this disclosure and for purposes of simplicity, we assume that most non-flat portions are not useful and most 3D portions are useful.

One method for removing the flat non-useful portions, that the applicants have used in the past, utilizes mechanical grinding and polishing. The deformed/molded substrate is placed on a handle substrate/wafer that has cavities to accommodate the three-dimensional deformed part. The rest of the deformed substrate that is flat and not needed sits on the top of this handle substrate. A polymer/wax may be applied inside the cavity, below the non-flat three-dimensional part of the deformed substrate, and inside the non-flat three-dimensional and molded part of the substrate to protect these useful three-dimensional portions of the structure. The handle wafer with the flat portions facing up may be placed face down on a grinding/lapping surface (pad) and the flat portions are mechanically grinded away. Once the flat portions are grinded away, the remaining three-dimensional portions are removed from the polymer by dissolving the polymer away in a solvent solution or gas. The remaining shells can then be cleaned and further processed as needed, for example to coat them with a conductive layer if they are used in devices such as resonant gyroscopes.

As mentioned previously, gyroscopes are used to measure angular rotation rate or rotation angle. An example of a gyroscope is a MEMS gyroscope sensor which is a capacitively-driven and sensed vibratory gyroscope. Different MEMS vibratory gyroscopes have been developed based on resonant tuning fork structures. However, these do not provide the lowest noise, best bias stability, or other features such as temperature and vibration and shock tolerance that are increasingly needed for some applications.

Three-dimensional shells, such as those described above, can be used as the resonant structure in inertial sensors, including, for example, vibratory Coriolis-based angular rate or angle gyroscopes. Resonant shell gyroscopes provide several attractive features, including high stability and low noise. Recently, there has been a lot of work on shell resonators and shell-based gyroscopes that utilize a 3D shell resonator, like a wine glass, to achieve high performance. A shell-resonator gyroscope consists of a 3D shell-like mechanical resonator with several drive, sense and control electrodes placed symmetrically surrounding the resonator on the inside or the outside regions of the resonator or underneath the rim of the resonator and separated from it with a narrow gap. These electrodes are used to drive and sense the motion of the resonator in response to rotation and to tune the frequency through electrostatic tuning. Several parameters determine the performance of the resonator used for the gyroscope or other types of resonant sensors and devices. One of them is noise (or angle random walk) which determines the resolution of the sensor. Several factors contribute towards reducing the noise of vibratory sensors like gyroscopes. One of them is the mechanical quality factor (Q) of the resonator. Using a high-Q material like fused silica or sapphire, one can obtain a Q more than several million.

The use of three-dimensional vibrating shells as a rotation sensor was first proposed and analyzed in 1890. The wineglass structure as the sensing element of a gyroscope was proposed. Hemispherical (e.g., wineglass) or cylindrical shell resonators, or any resonator that is axi-symmetric (meaning there is symmetry around a central axis) offer mass, stiffness, and damping symmetry, as well as structural rigidity. The wine glass structure has many characteristics that make it suitable for precision applications. For example, it is an axisymmetric structure which, when made nearly perfectly symmetrical, has two degenerate resonant wineglass modes with the same frequency. One of these two modes may be used for driving the structure into mechanical resonance, and the other is used for monitoring the change in the vibration patterns that are representative of rotation and rotation rate around the central axis through the Coriolis effect. The fact that these two frequencies are intrinsically the same and that the structure is axisymmetric, allows the wineglass structure to be an excellent vibrating gyroscope.

In particular, the advantages are: 1) the sense mode resonance may be activated when there is Coriolis force due to rotation and this resonance may be amplified by the Q of the resonator, which can be large if the resonator is symmetrical and made from a low energy loss material; 2) the two resonant modes may be inherently matched and tend to vary in the same way under non-ideal conditions, which makes the resonator tolerant to temperature variations and vibration; 3) the high-Q coupled with a reasonably low-resonant frequency provides a long damping time of the resonance behavior, which together with low damping mismatch between the modes provides an extremely stable response; and 4) because of the symmetry and the shape of the wineglass with a small mass, it is very tolerant to extreme shock events. For all these reasons, hemispherical resonant gyroscopes (HRG) with diameters of several centimeters have been developed and used in avionic, defense, and space systems.

To achieve large mechanical Q (e.g., ~20 million) and near-perfect structural symmetry, the hemispherical resonator gyroscope (HRG) resonator is often manufactured using precision grinding and polishing processes. However, such manufacturing processes create devices that are expensive (e.g., >$10,000/unit). Moreover, the fabrication process is slow, and especially difficult for making micro- and millimeter-scale (e.g., <1-2cc) structures.

At the macro-scale, shell structures used for the HRG are often fabricated by mechanical machining from a block of material. However, fabrication of 3D micro- and millistructures using conventional machining approaches (e.g., drilling, milling) is difficult and time consuming. This is especially true for making 3D structures that are made from high-quality and pure materials, like fused silica or fused quartz, or pure silicon, or other types of glasses or composites. Therefore, alternative approaches have been developed.

To overcome these challenges, micro-electromechanical system (MEMS) fabrication processes have been used to fabricate micro- and millimeter-scale axisymmetric shell resonators. A micro-electromechanical system (MEMS) process can form highly accurate components at a low cost. However, conventional MEMS processes have some disadvantages, such as a limited number of available materials, difficulty in depositing a substrate with a large thickness, forming truly three-dimensional shells with dimensions that exceed 1 mm in height, and forming components with excellent surface smoothness and low roughness. Fabrication of 3D shells using the technique described above in FIG. 3, however, overcomes many of these challenges and the fabricated shell can be used to make complete resonant gyroscopes at the micro scale.

FIG. 4 shows perspective views of two example resonant gyroscope 400. In FIG. 4A, a birdbath shell 402 (also referred as wineglass shell) is coated with a thin conductor and then attached to a support substrate 450 at the anchor point 408. The shell in this case is facing down, meaning the inside volume of the birdbath shell (the concave part) is facing the substrate 450 that supports it and where the shell is anchored 408 to the substrate. The shell is surrounded by a number of electrodes 404 which are separated from the shell by an air gap. A case 406 is around the electrodes. These electrodes are electrically conductive, for example they can be made of silicon that is appropriately doped. The electrodes are used to apply a mechanical force to the rim of the resonator when a voltage is applied between the shell and the electrode. This voltage is a time varying voltage (AC voltage) and produces an electrostatic force between the fixed electrode 404 and the flexible shell 402. When the frequency of this applied voltage matches the resonant frequency of the shell, the shell begins to resonate in a particular mode, for example the n=2 wine-glass mode. When the 3D shell is vibrated, for example in its primary flexural mode (the wine-glass n=2 mode), the rim moves in an elliptical shape in these two modes, which are separated by 45°. The vibrating wine-glass thus supports a standing wave. When it is rotated around its central axis (along the support post 407), the standing wave also rotates around the post but precesses (falls behind) the rotation of the wine glass. Thus, rotation rate and angle can be measured directly by monitoring the rim vibration pattern. This vibration pattern can be monitored using electrodes 404 placed around the shell as shown in FIG. 4. Some electrodes are used for actuating the shell into resonance, some are used for sensing the vibration pattern of the shell, some are used for tuning the frequencies of the two modes of the shell, and other electrodes are used for performing other tuning functions to ensure the device provides the best performance. The structural symmetry and matched frequencies of the two modes make these shell structures excellent candidates for rotation and rate sensing because the sensor response is amplified by the Q of the resonator, the sensor is very tolerant to temperature/vibration/shock, and long damping time makes the sensors response more stable over time.

FIG. 4B shows another resonant gyroscope 430 utilizing a birdbath 3D shell 432, except that in this case the shell is supported on the substrate 450 so that its inside is facing up. Electrodes 434, surrounded by a case 436, surround the birdbath shell. Attachment to the substrate is done at the anchor point 438, perhaps through a tall post 440 that reaches inside the hollow post of the resonator. The operation of this gyroscope is similar to that described above and shown in FIG. 4A.

FIG. 5 shows yet another resonant gyroscope sensor 500 where a birdbath hemispherical shell 502 is also attached to the substrate with the birdbath shell facing up (i.e., the concaved part of the shell is facing up). In this design the electrodes 506 are placed around and below the shell 502 and substantially follow the curvature of the shell and can provide a larger capacitance to the shell. This larger capacitance between the shell and the electrodes is desirable because a larger force can be produced and the sensing signal can be larger when monitoring the vibration pattern of the shell. FIG. 5 also shows a ring electrode 509 connected to a support substrate 510, the ring electrode 509 surrounds the post 540 and can be used, instead of the electrodes placed around and below the perimeter of the rim, to force the shell into resonance. The shell 502 can be anchored 508 to the post 540. The post and the ring electrode are electrically isolated.

The gyroscopes described above use a continuous shell similar to example structures shown in FIG. 1. However, it is desirable to use other shells, such as a cylindrical shell suspended above a substrate and supported from above, in order to improve the overall performance of the gyroscope. In order to do this one has to be able to develop new techniques with which 3D microstructures with different shapes and microstructure which have selectively removed regions can be fabricated. These techniques should be especially capable of creating 3D structures from materials such as fused silica (quartz) which have excellent material properties but are difficult to process using standard microfabrication processes.

This section provides background information related to the present disclosure which is not necessarily prior art.

SUMMARY

This section provides a general summary of the disclosure, and is not a comprehensive disclosure of its full scope or all of its features.

In one aspect, an improved resonating structure is presented. The resonating structure includes: a planar support substrate; a support post extending upward from the support substrate; a resonating ring coaxially arranged around the support post; and a plurality of beams extending upwardly from the resonating ring and attaching to the support post, thereby suspending the resonating ring above the support substrate. The support post, the resonating ring and the plurality of beams preferably form a hemi-toroidal shape.

In another aspect, a three-dimensional microstructure is presented. The microstructure includes: a support substrate; a member suspended about the support substrate and configured for displacement in a given plane; and a plurality of beams extending outward from the member and in a direction non-parallel to the given plane. The member is arranged about an axis and is shaped symmetrical about the axis. Each beam has one end integrally formed with the member and the other end attached to the support substrate, where the largest dimension of the member is on the order to millimeters (e.g., <30 millimeters).

In yet another aspect, the resonating structure includes: a planar support substrate; a support post attached to the support substrate and extending upward from the support substrate; and a plurality of beams attaching to the support post and extending radially outward from the support post. The support post and the plurality of beams are integrally formed from same material and preferably form a hemi-toroidal shape.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 15:
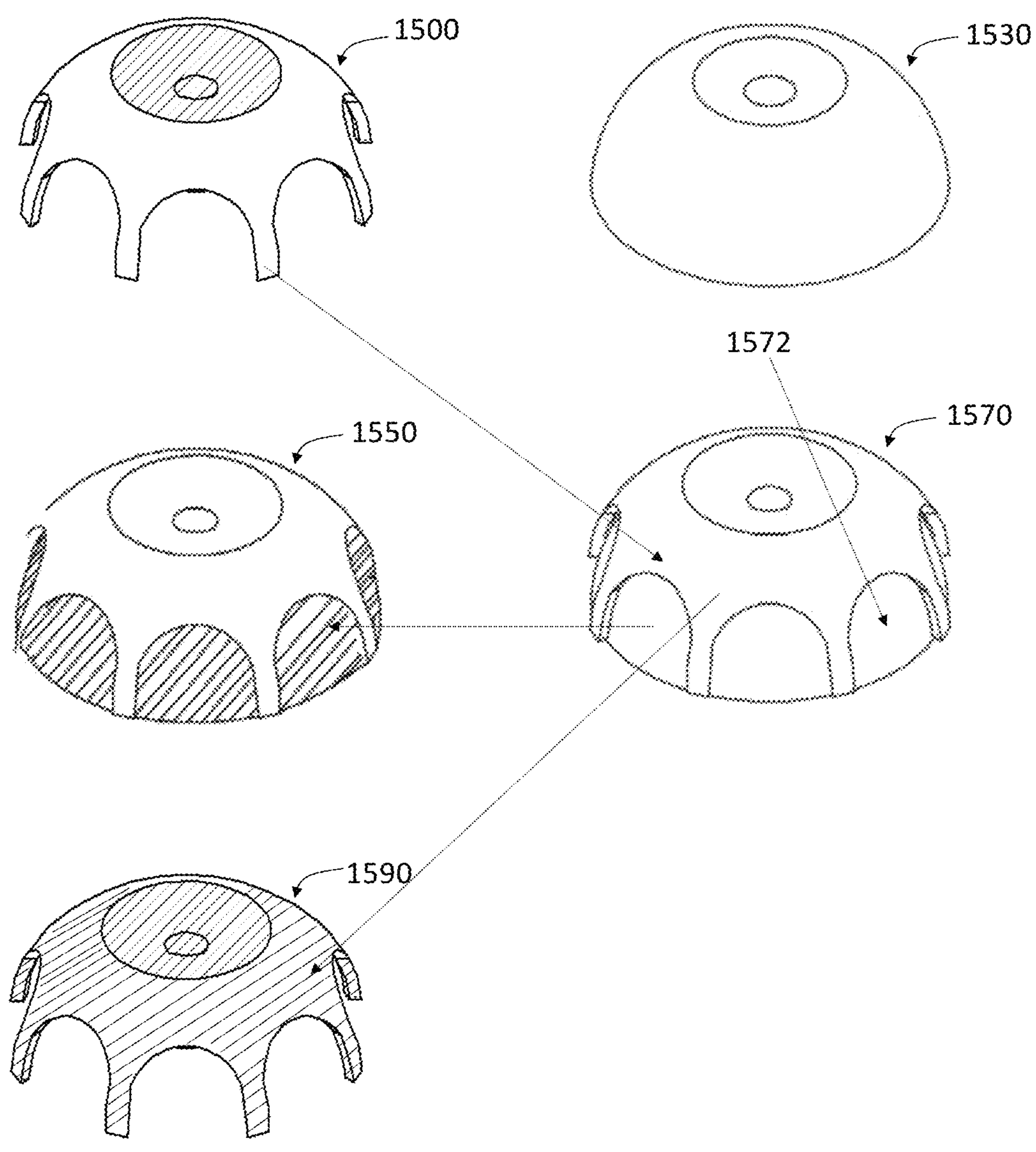
FIG. 15 are perspective views illustrating the use of shells with features as a shadow mask to deposit thin films on another 3D structure.
Figure 19:
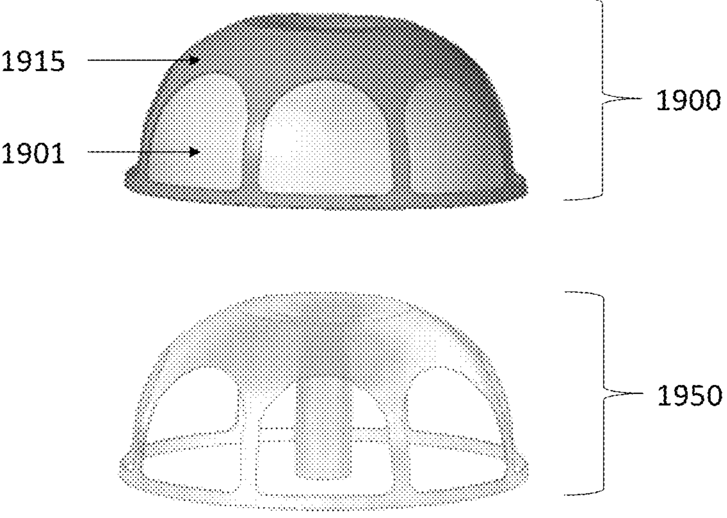

FIG. 19 is a diagram illustrating yet another method of making open regions on the surface of a 3D structure by coating the shell with a protective metal/photoresist stack and exposing this stack using a shadow mask as shown in FIG. 15 or using laser to expose photoresist at regions which needs to be etched. After exposure and development of the photoresist layer, the shell is put in wet etchant which etches off the regions not coated with metal/photoresist stack.

Figure 20:
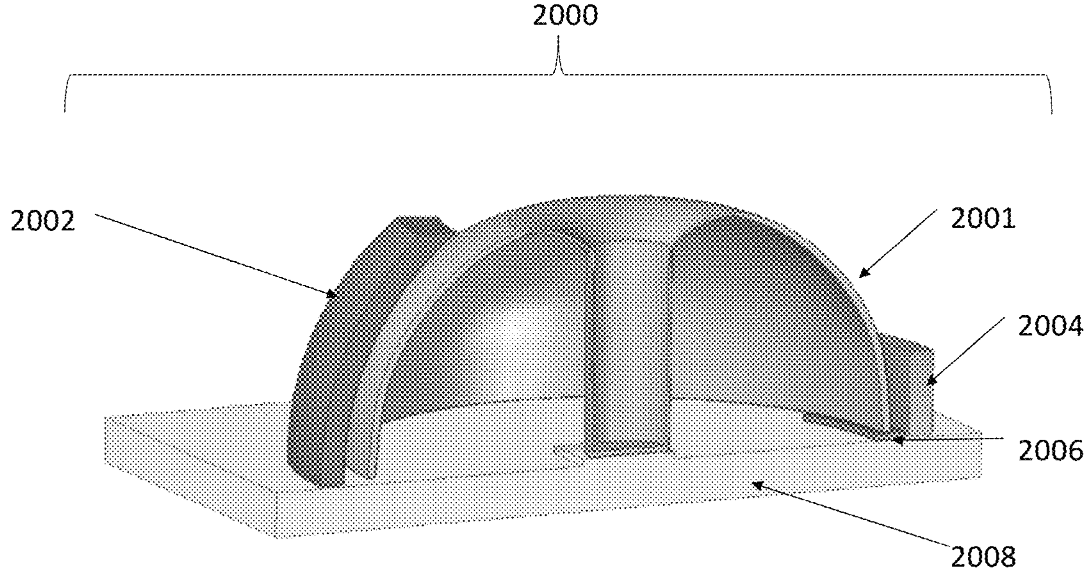

FIG. 20 is a diagram showing different electrode configurations for capacitive driving and sensing the motion of a 3D shell resonator.

Figure 21:
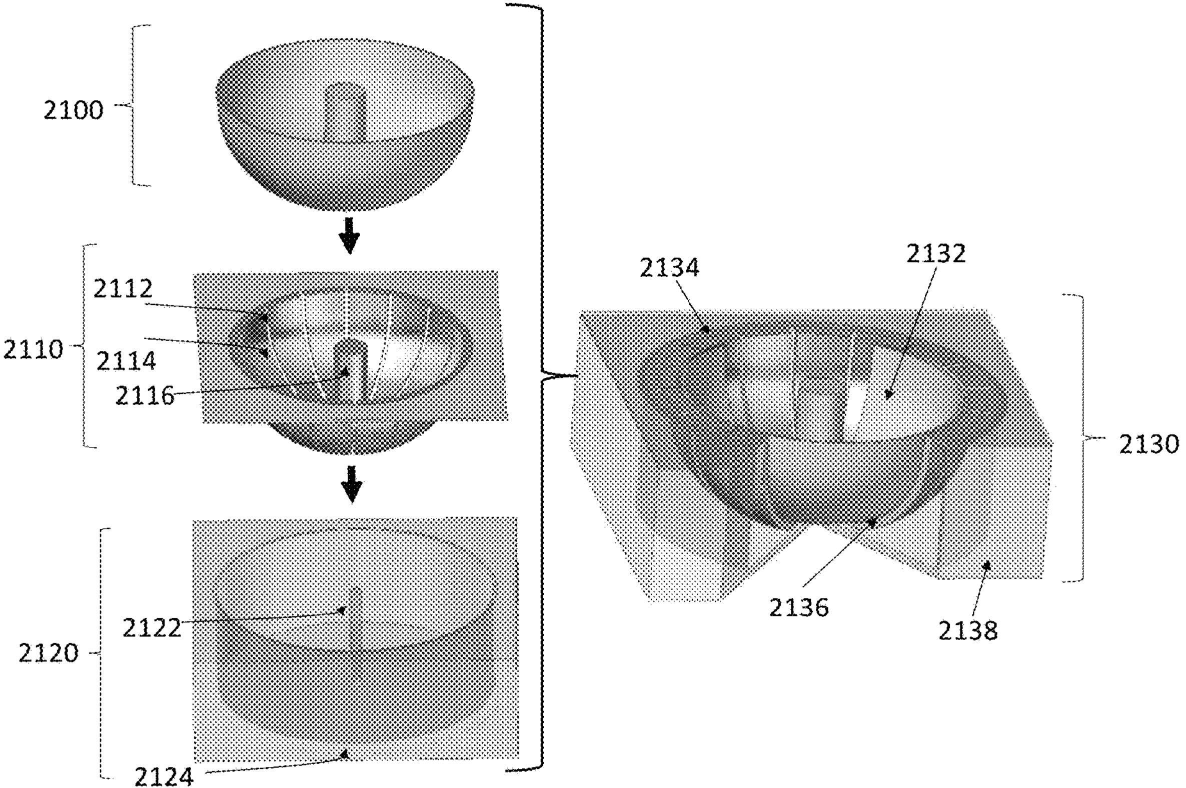

FIG. 21 is a diagram illustrating the overall fabrication and assembly process for a stacked 3D device like a resonator.

Figure 22:
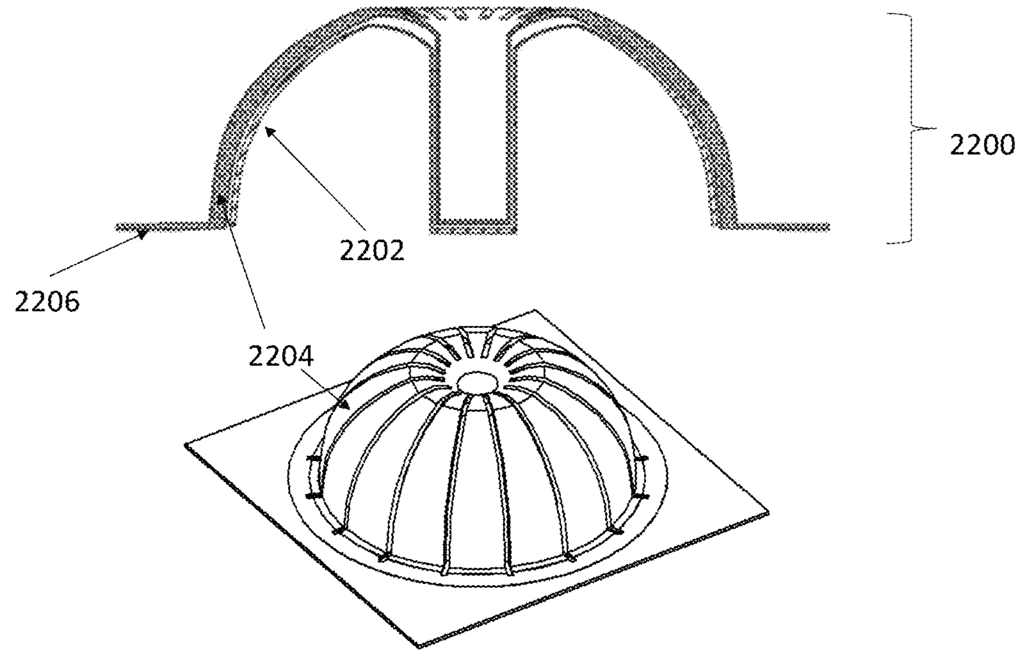

FIG. 22 is a cross-sectional view and a perspective view of stacked 3D device with electrode shell outside the device shell.

Figure 23A:
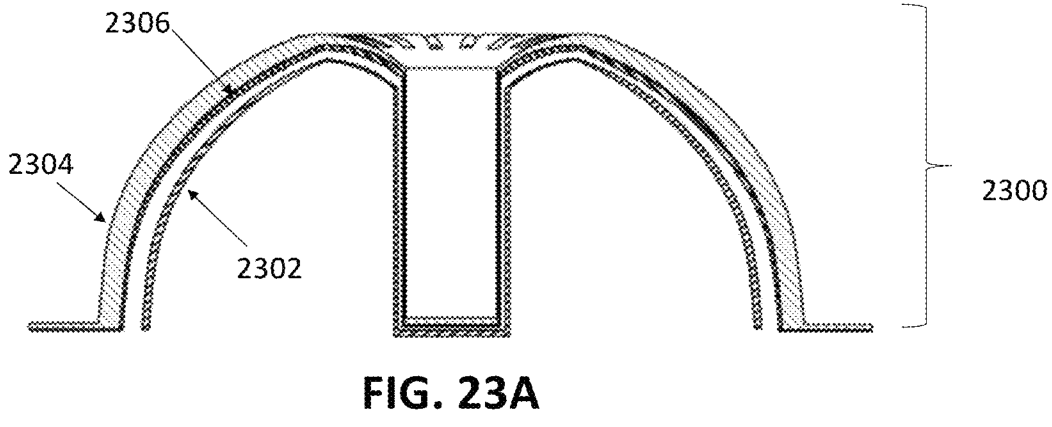
Figure 23B:
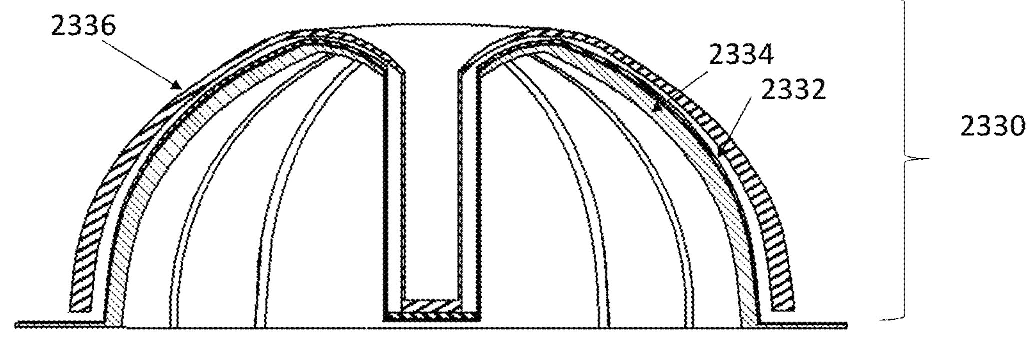

FIGS. 23A and 23B are drawings showing example variations of a stacked device where the device shell is inside the electrode shell and another where device shell is outside the electrode shell.

Figure 24:
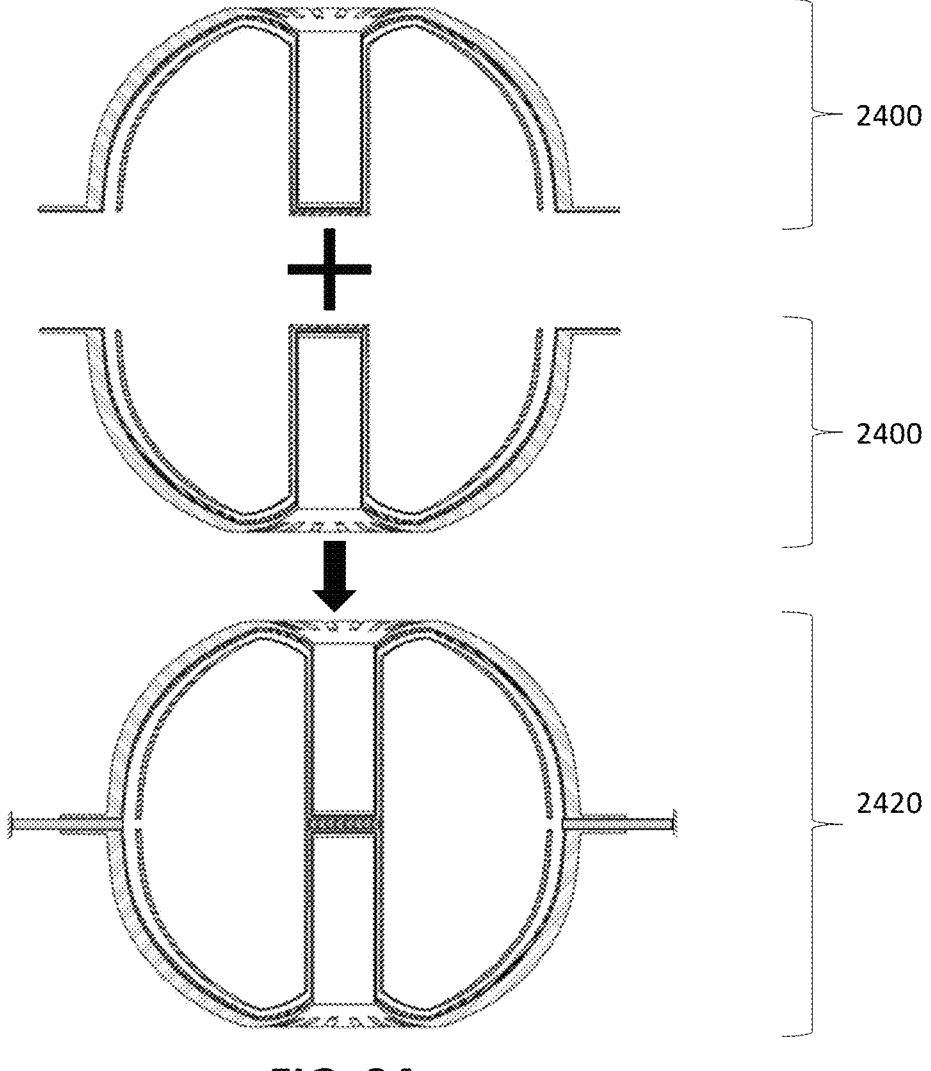

FIG. 24 are cross-sectional views showing stacking of two device-electrode shells assembled face to face.

Figure 25:
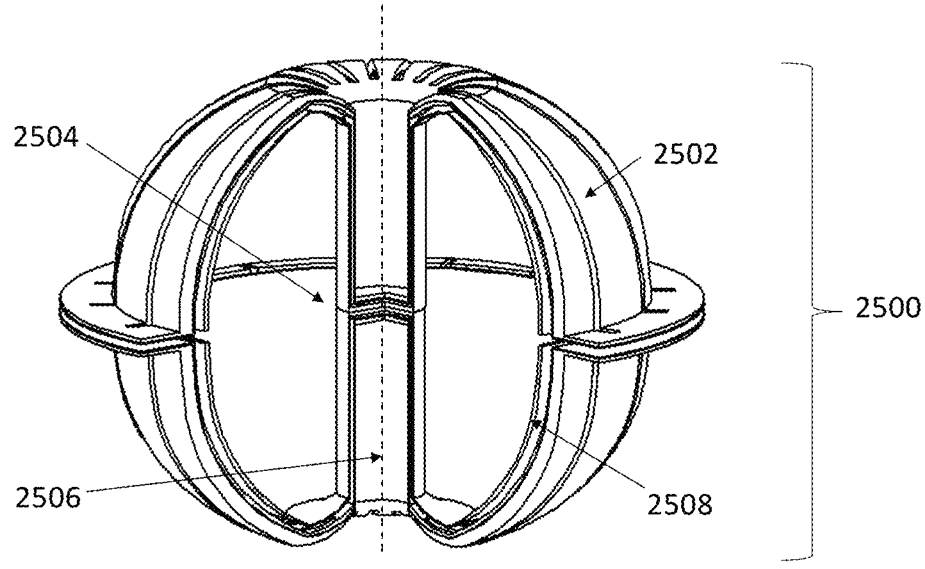

FIG. 25 is a perspective view with cutouts showing stacking of two device-electrode shells assembled face to face.

Figure 26:
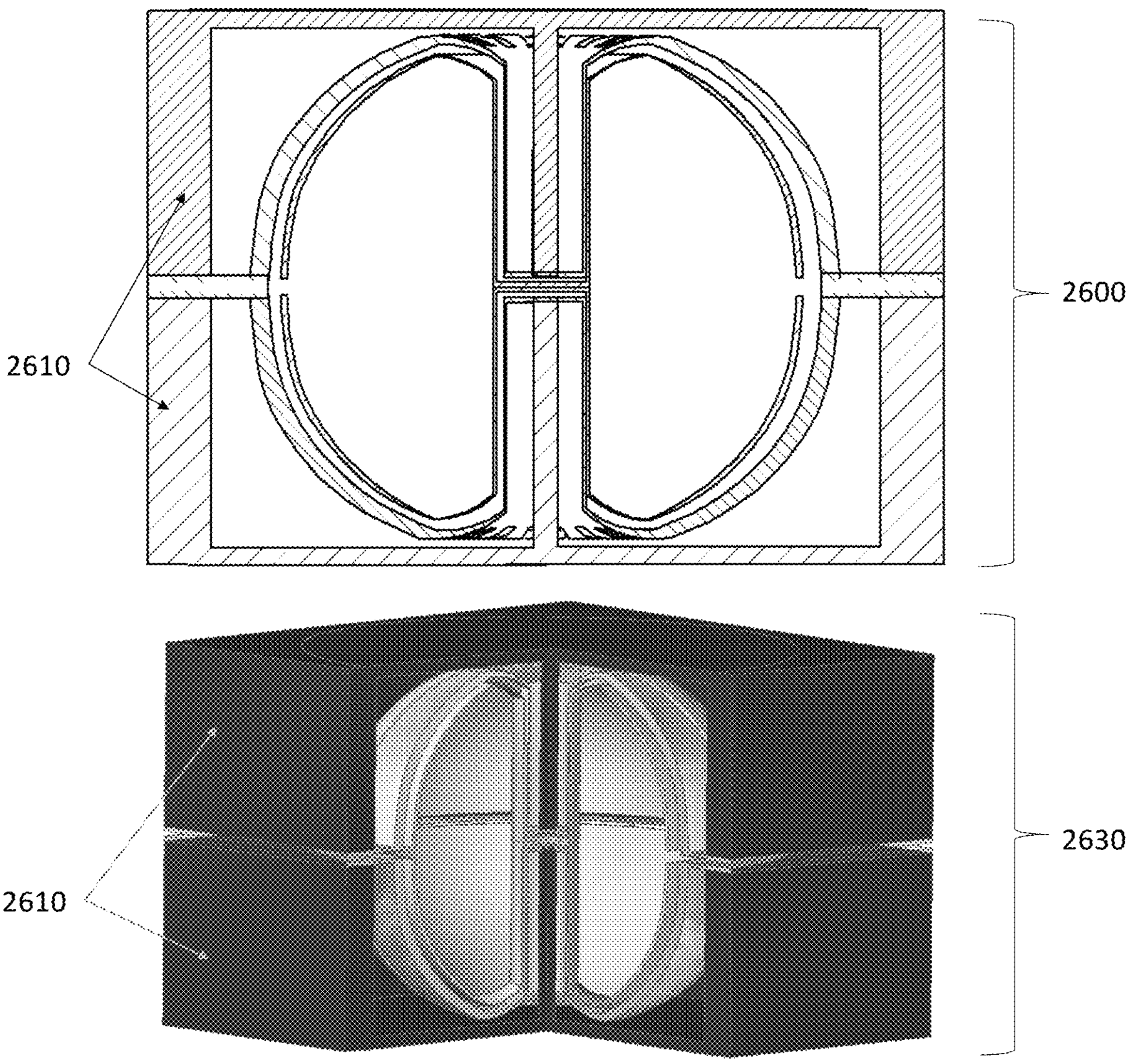

FIG. 26 are cross sectional and perspective views of two stacked device-electrode shells assembled inside a housing or package.

Figure 27:
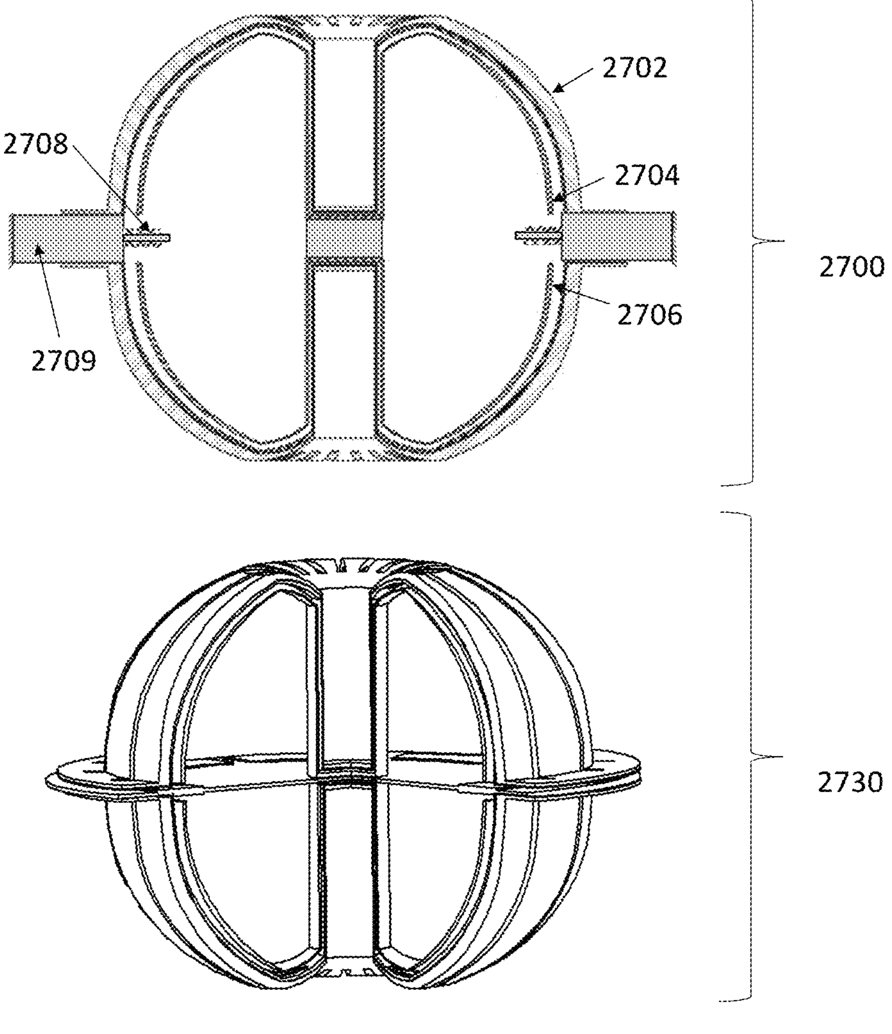

FIG. 27 shows cross-sectional and perspective views of two device-electrode shells stacked face-to-face on a flat substrate with patterned electrodes.

Figure 28:
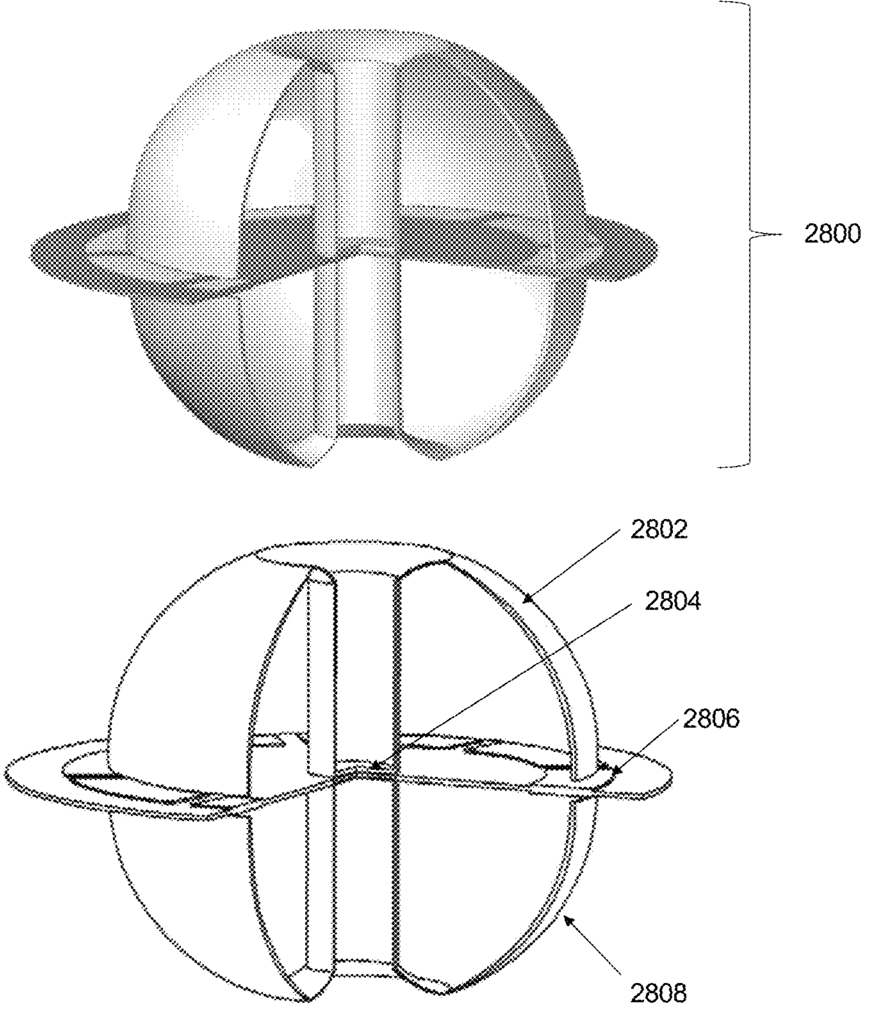

FIG. 28 are perspective views of two shells stacked face-to-face in on a flat substrate with patterned electrodes.

Figure 29:
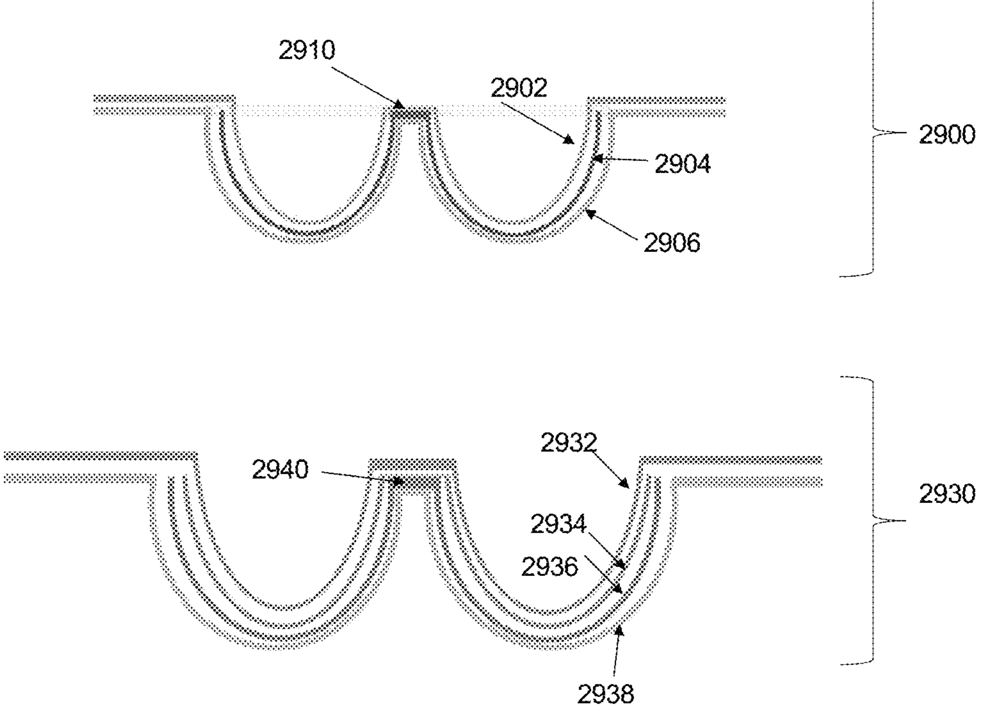

FIG. 29 are diagrams illustrating an example of stacked assembly with multiple electrodes and multiple shells.

Figure 30:
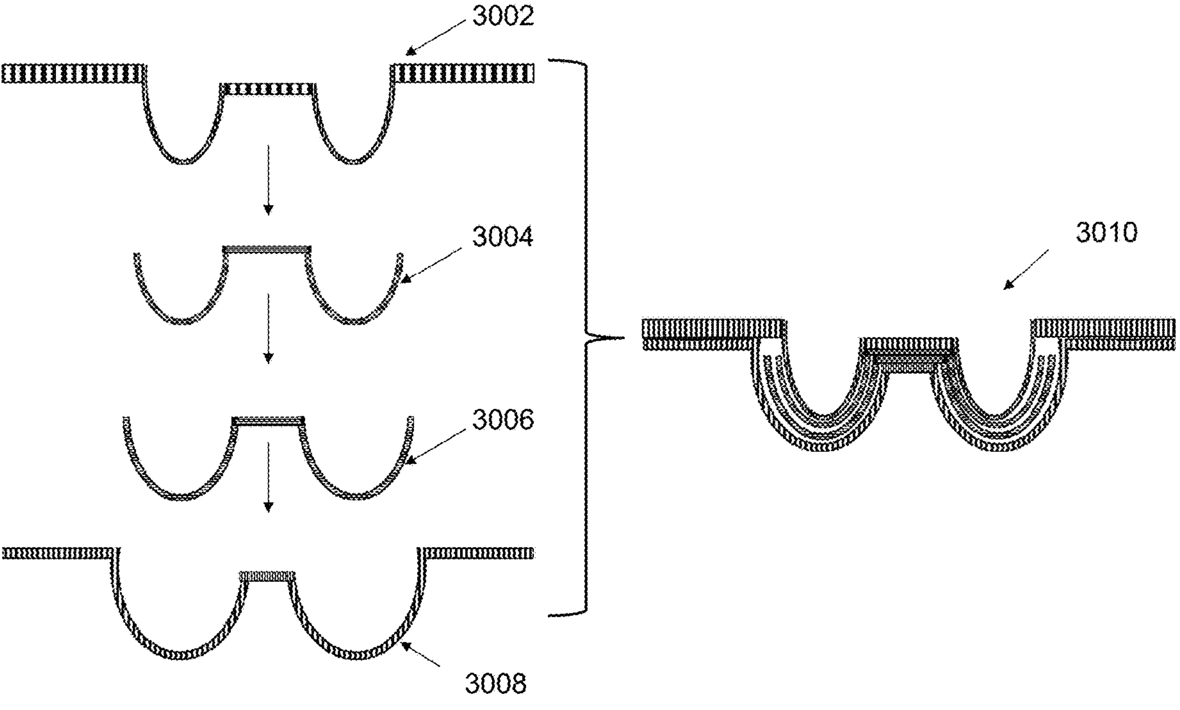

FIG. 30 are diagrams illustrating an assembly process of stacked structures with two device shells and two electrode shells.

Figure 31:
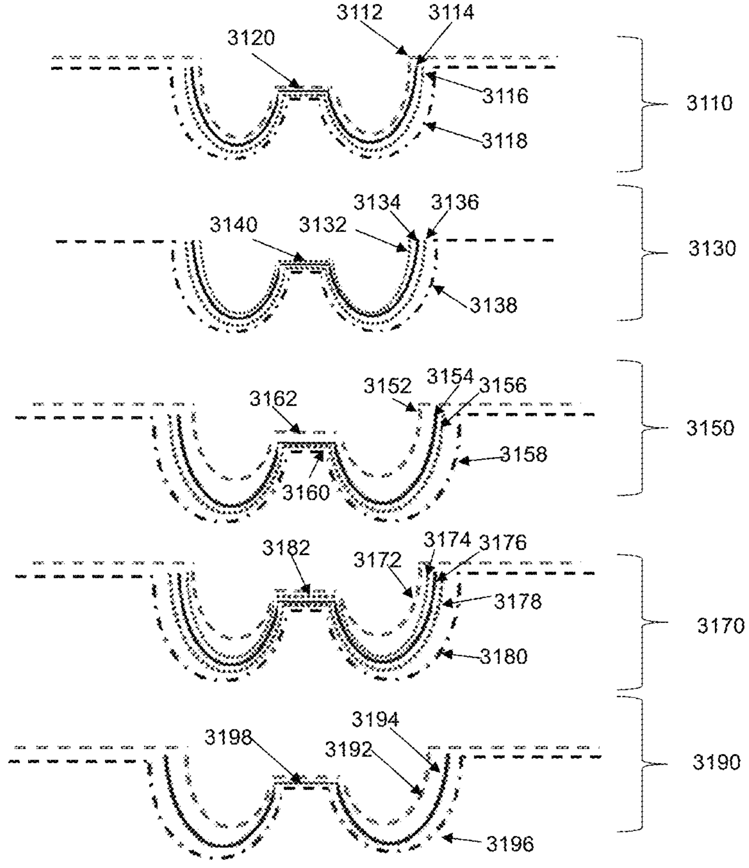

FIG. 31 are diagrams showing another example assembly process where multiple device shells and multiple electrode shells can be assembled together in different ways.

Figure 32:
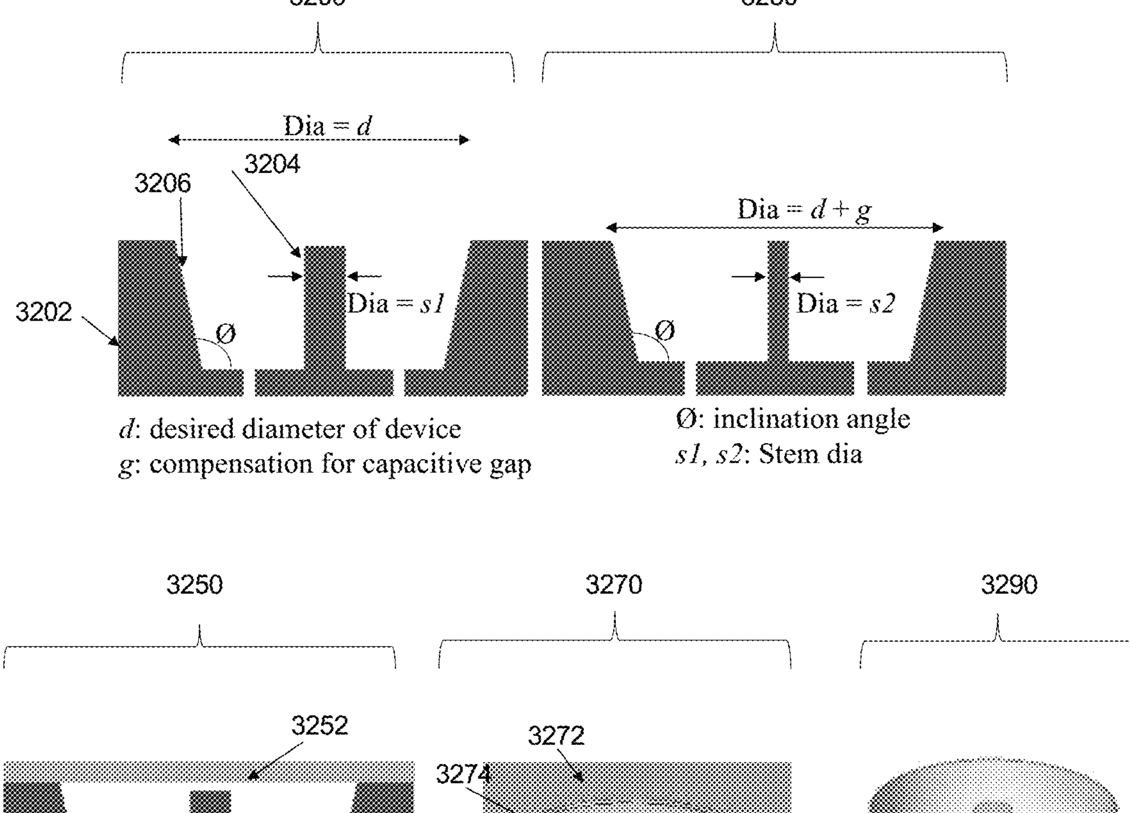

FIG. 32 shows an example mold design and fabrication process of device and electrode shells using blowtorch molding.

Figure 33:
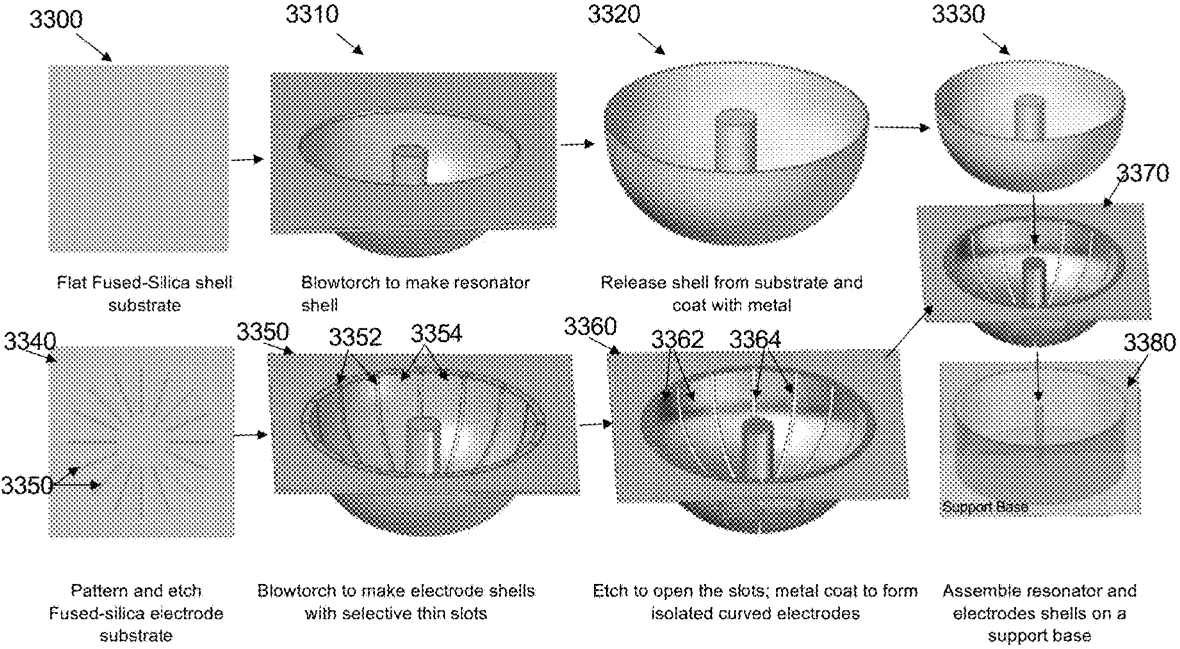

FIG. 33 shows an example fabrication/assembly process of device and electrode shells using blowtorch molding of patterned substrate followed by chemical etching.

Figure 34:
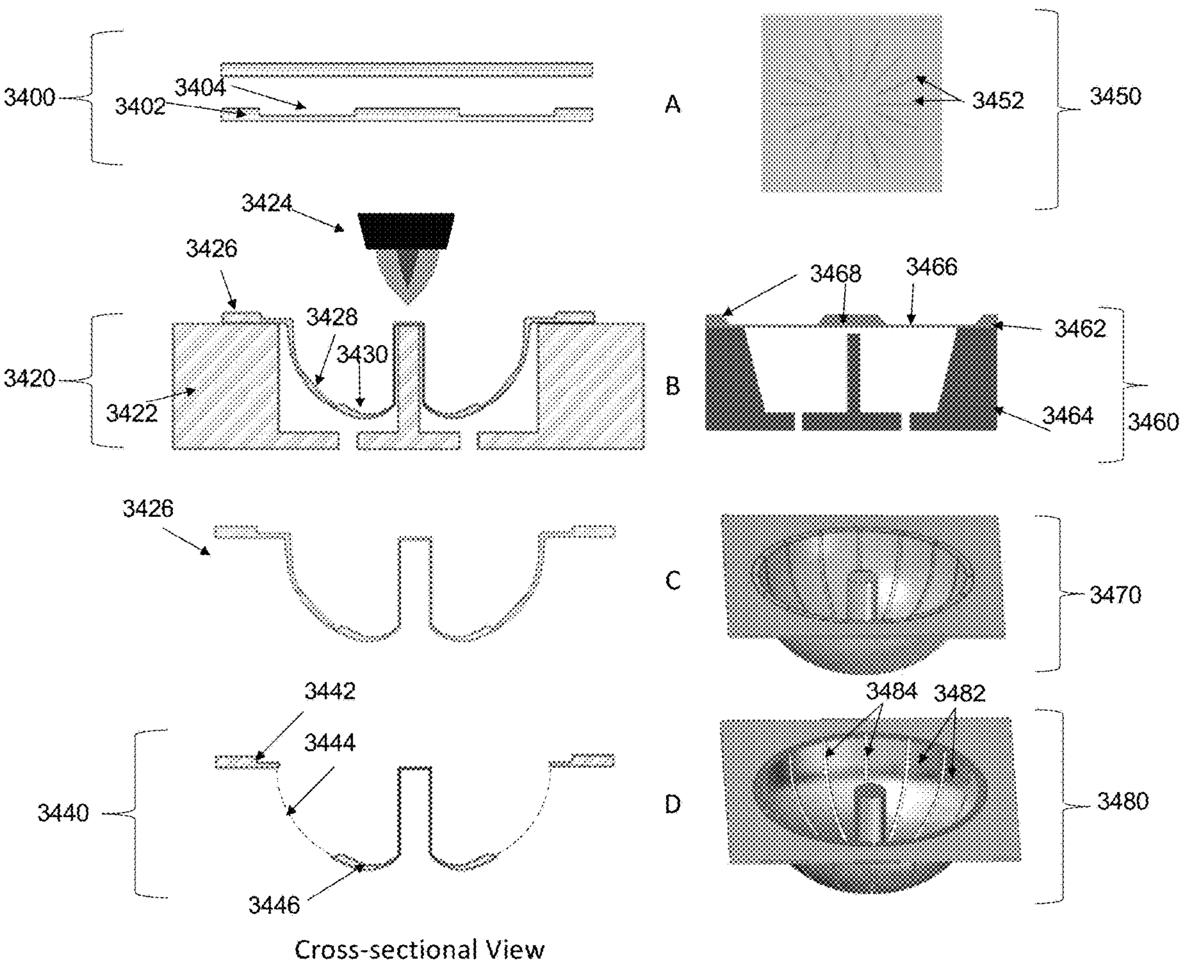

FIG. 34 is a diagram of an example fabrication and assembly process of stacked shell-electrode assembly.

Figure 35:
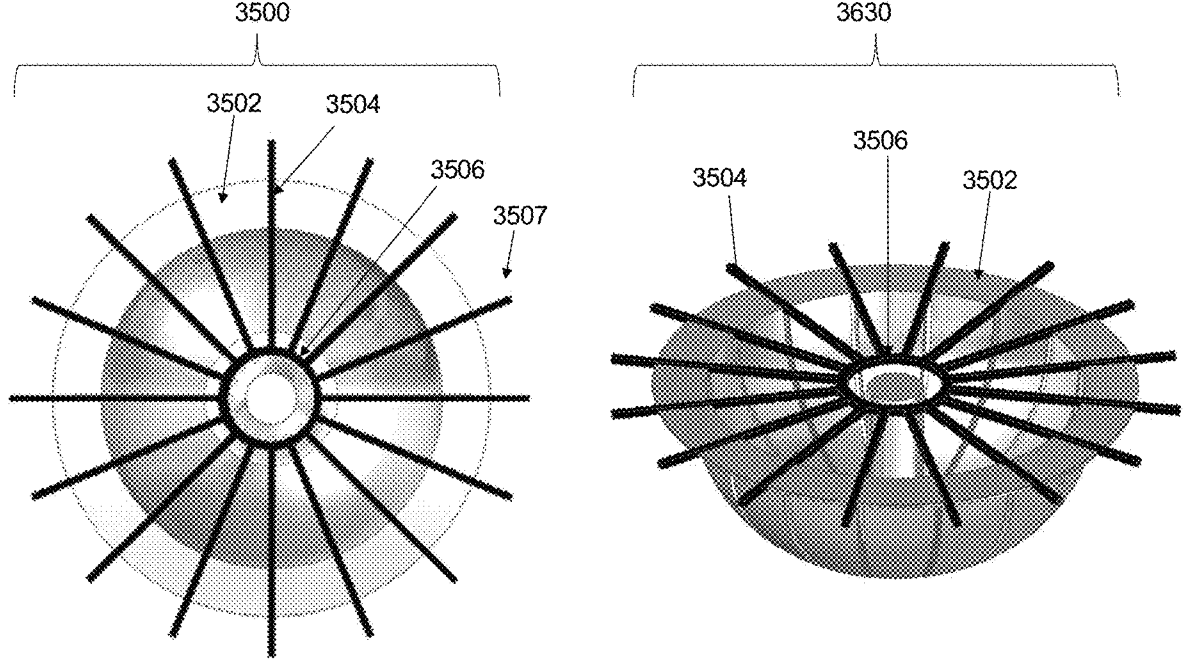

FIG. 35 is a schematic illustrating example masks and selective coating on three-dimensional structures using the shadow masks.

Figure 36:
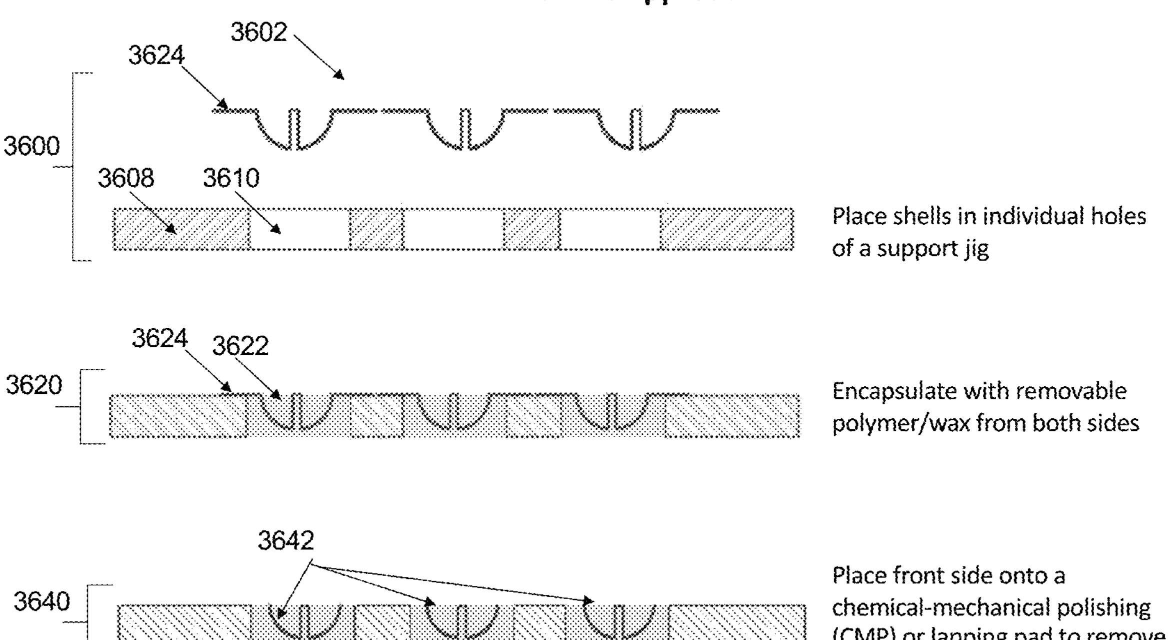

FIG. 36 illustrates a conventional prior-art process of releasing (singulating) 3D structures using chemical/mechanical lapping and polishing.

Figure 37:
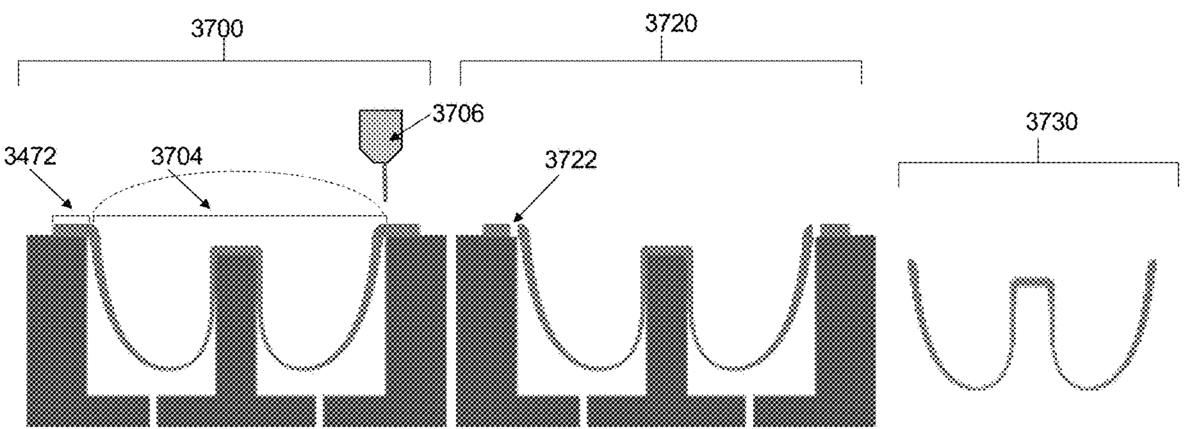

FIG. 37 illustrates another conventional prior-art process of releasing (singulating) 3D structures by using laser ablation along the periphery of the shell.

Figure 38:
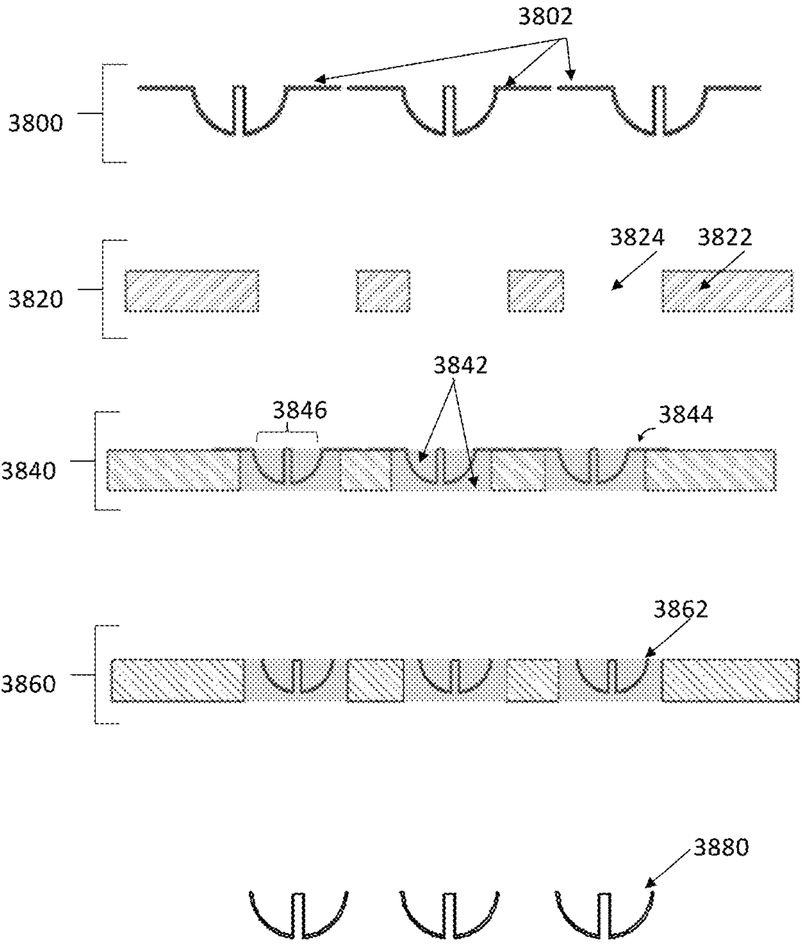

FIG. 38 illustrates an example method to release (singulate) 3D structures by protecting the inside of shell with polymer and using Hydrofluoric acid or other chemicals, etching of exposed flat portions at the batch level.

Figure 39:
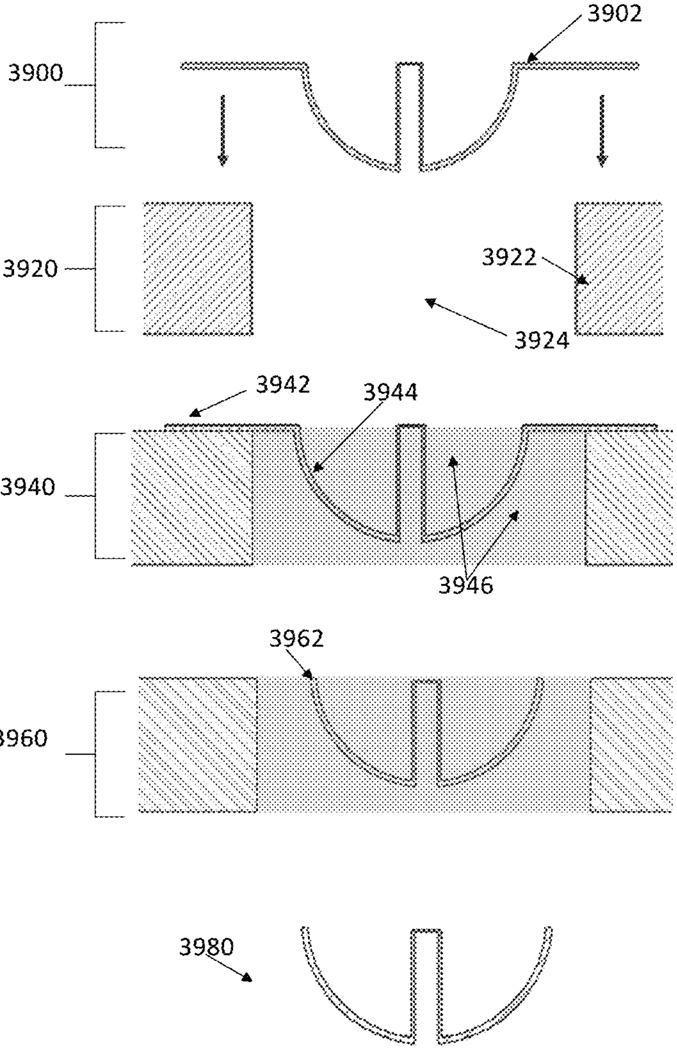

FIG. 39 illustrates an example method to singulate 3D shells using wet etching in accordance with various aspects of the present disclosure.

Figure 40:
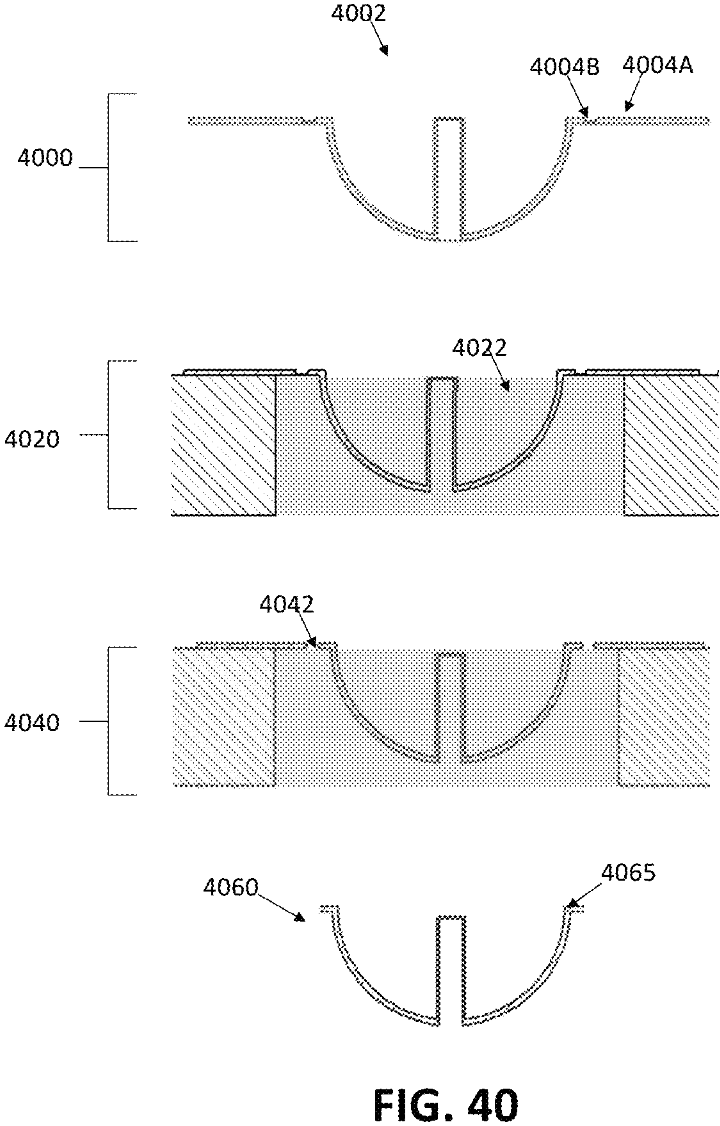

FIG. 40 shows 3D molded substrate that has prefabricated thin region along the circumference. This thin region etches through and singulates the 3D molded structure with some flat part extruding at the circumference of the shell.

Figure 41:
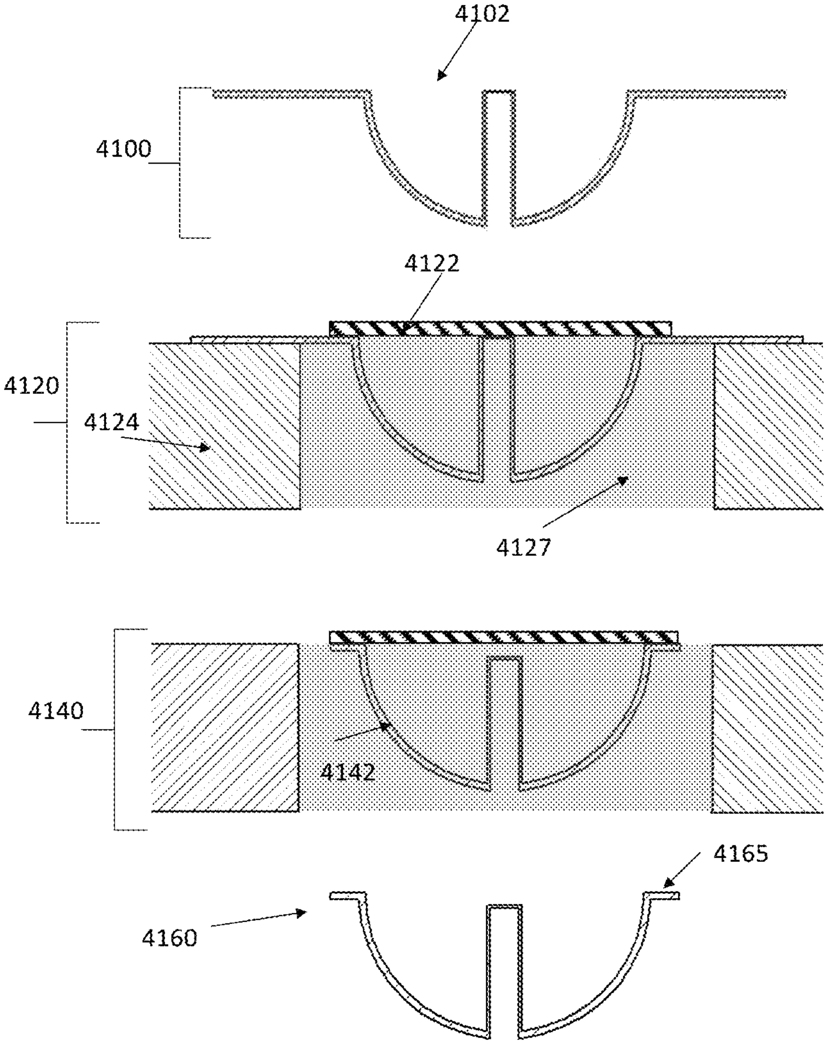

FIG. 41 shows another example of using etch-mask to protect the shell and etch off exposed regions to singulate the shell. The shell could be protected with polymer from all sides.

Figure 42:
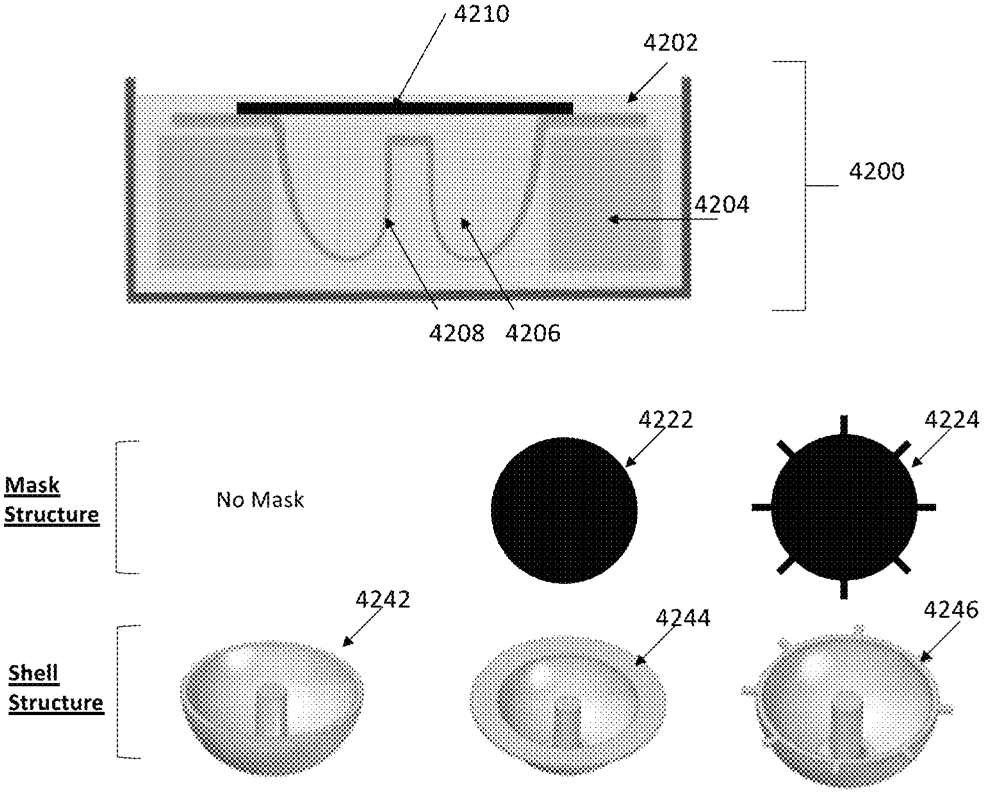

FIG. 42 shows yet another example where an etch-mask of any shape can be used to mask the shell before releasing the shell in an etchant. The unprotected portions etch off giving a desired shape of mask to the shell.

Figure 43:
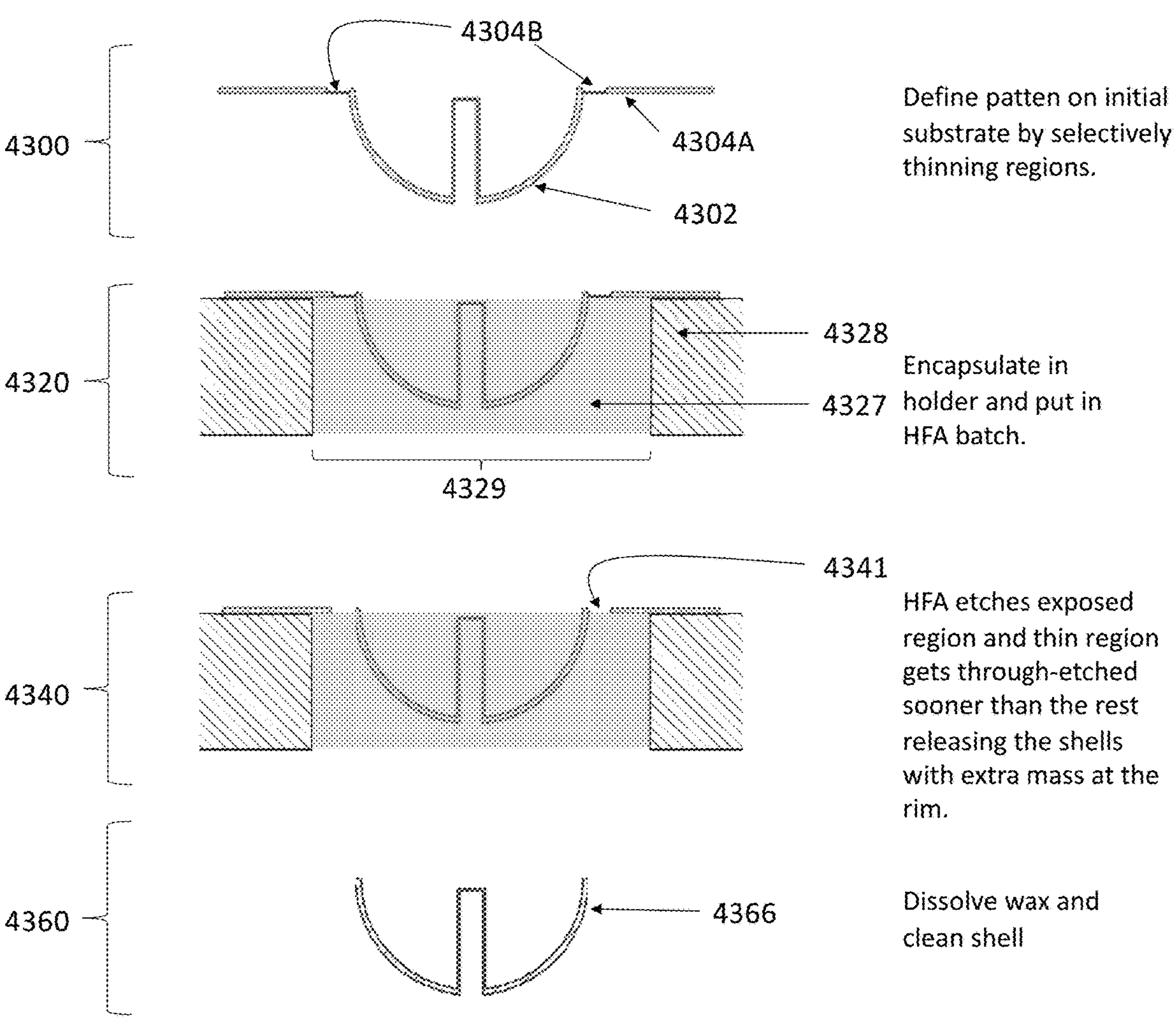

FIG. 43 illustrates an example where the prefabricated thin region is right at the edge of the curved region which when it etches off, the 3D molded structures gets released.

Figure 44:
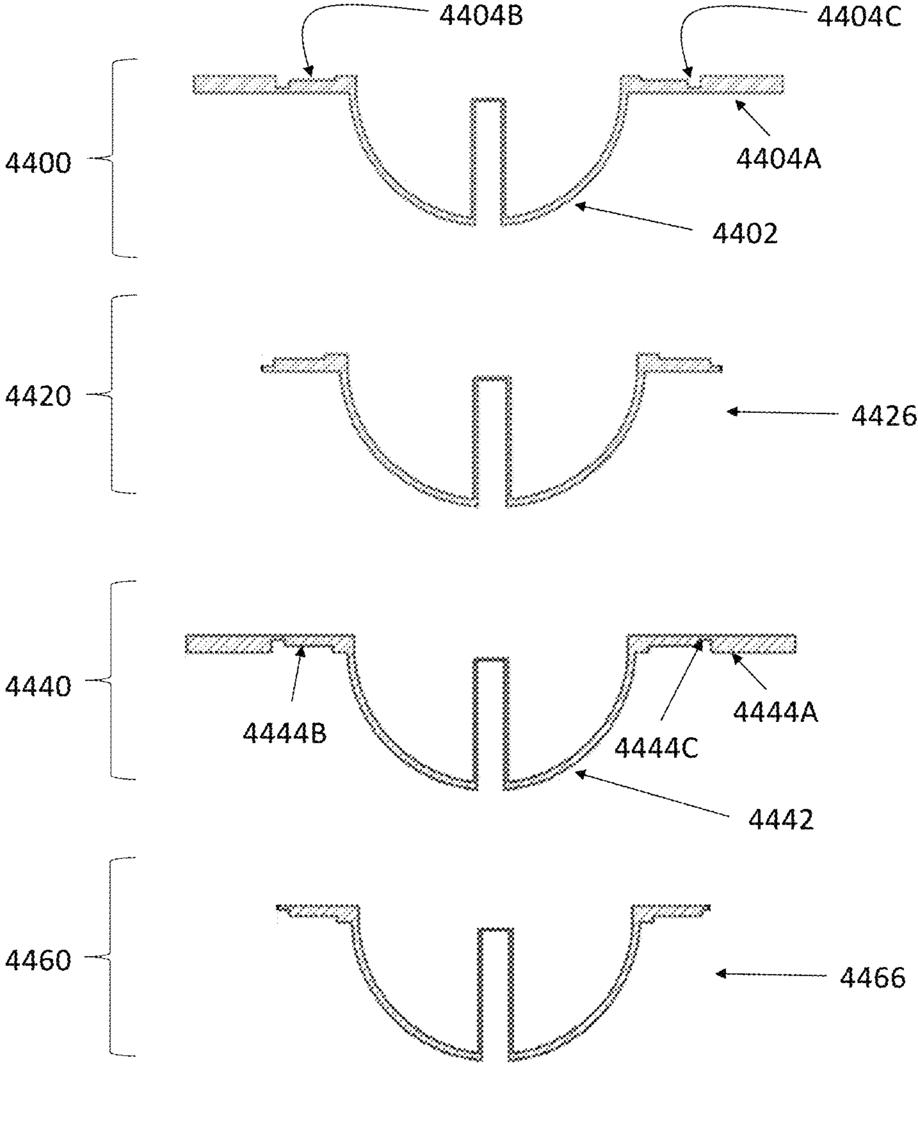

FIG. 44 illustrates another example where the prefabricated thin region has different thicknesses which when etched, singulates a shell with discrete or continuous flat extrusions at the rim of the shell. The prefabricated thin region could be either on the top of bottom side of the original flat substrate before molding the shell.

Figure 45:
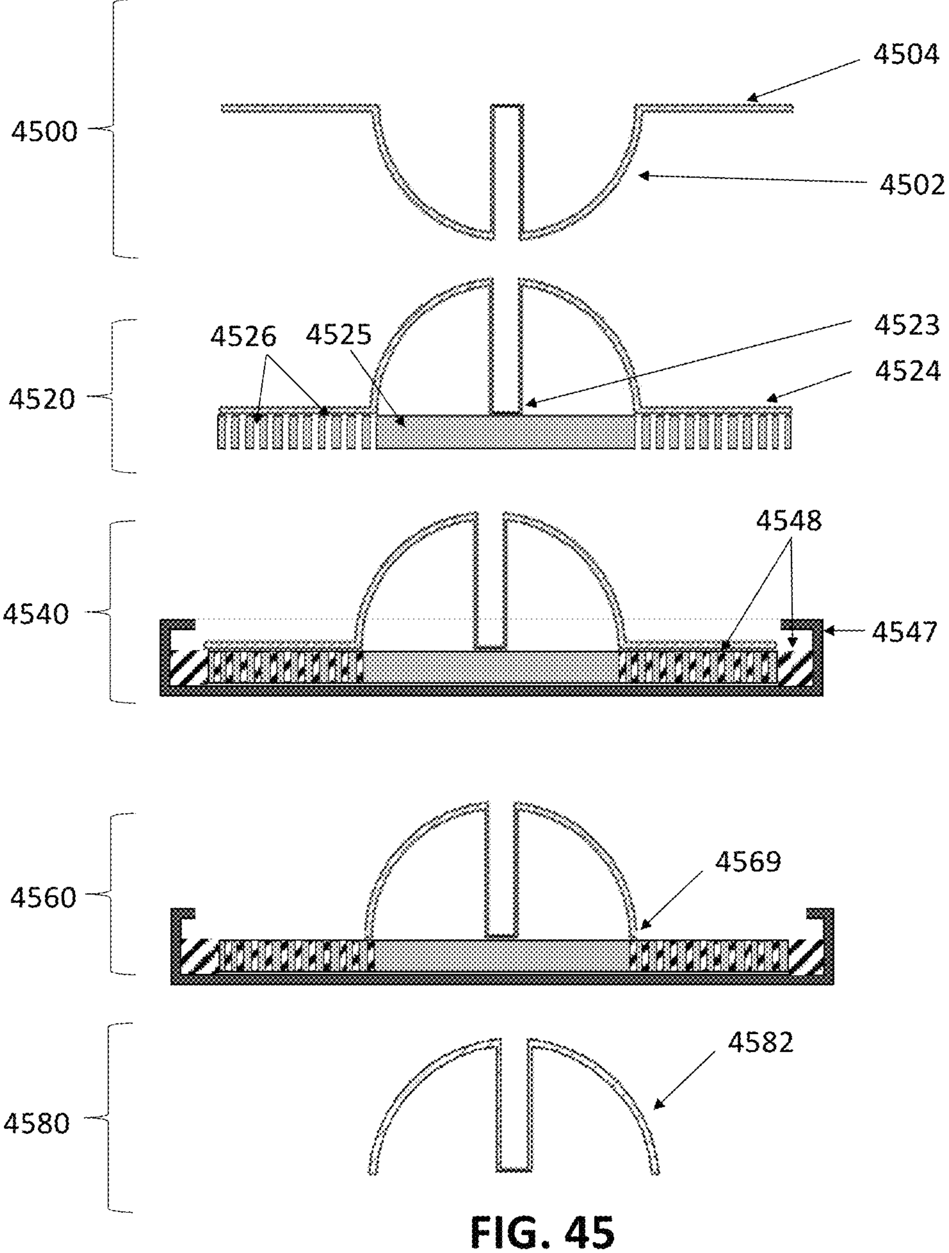

FIG. 45 illustrates yet another approach to remove the unwanted portions by using a perforated mask or wafer. When put in the etchant, the etchant wicks up through the perforations and etches the exposed flat regions of the 3D molded substrate that are sitting on top of the perforations.

Figure 46:
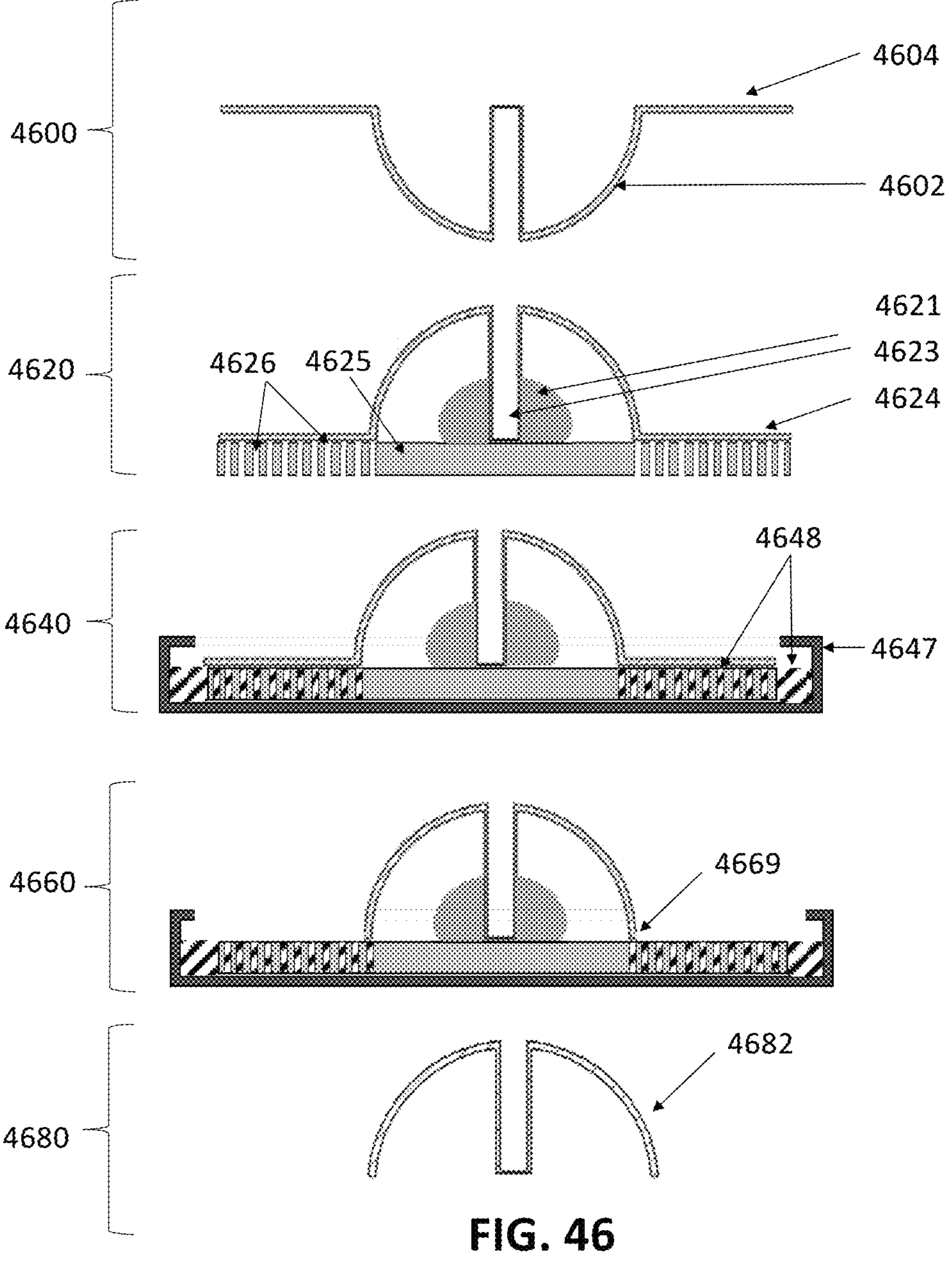

FIG. 46 shows a release technique using a perforated mask where the resonator stem/post could be coated with polymer or any protective coating to protect the anchor and to attach the etch mask to the shell.

Figure 47:
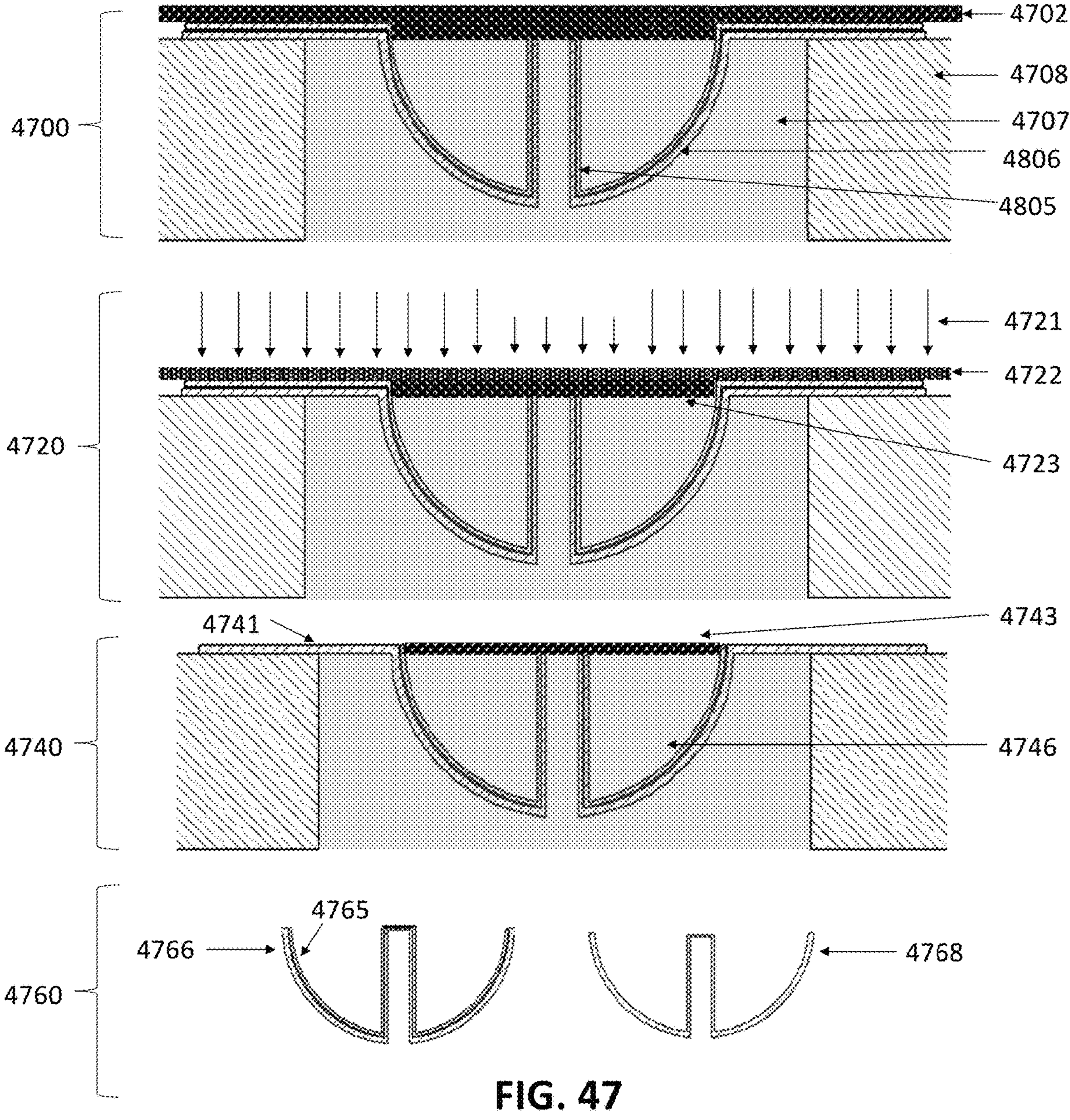

FIG. 47 shows another example of releasing (singulating) the 3D molded part where a protective coating of photoresist or other material is coated on top of a metal-coated shell encapsulated in a jig. It is then flood exposed to only remove photoresist from the flat regions and 3D molded substrate is etched to singulate the 3D shell.

Figure 48:
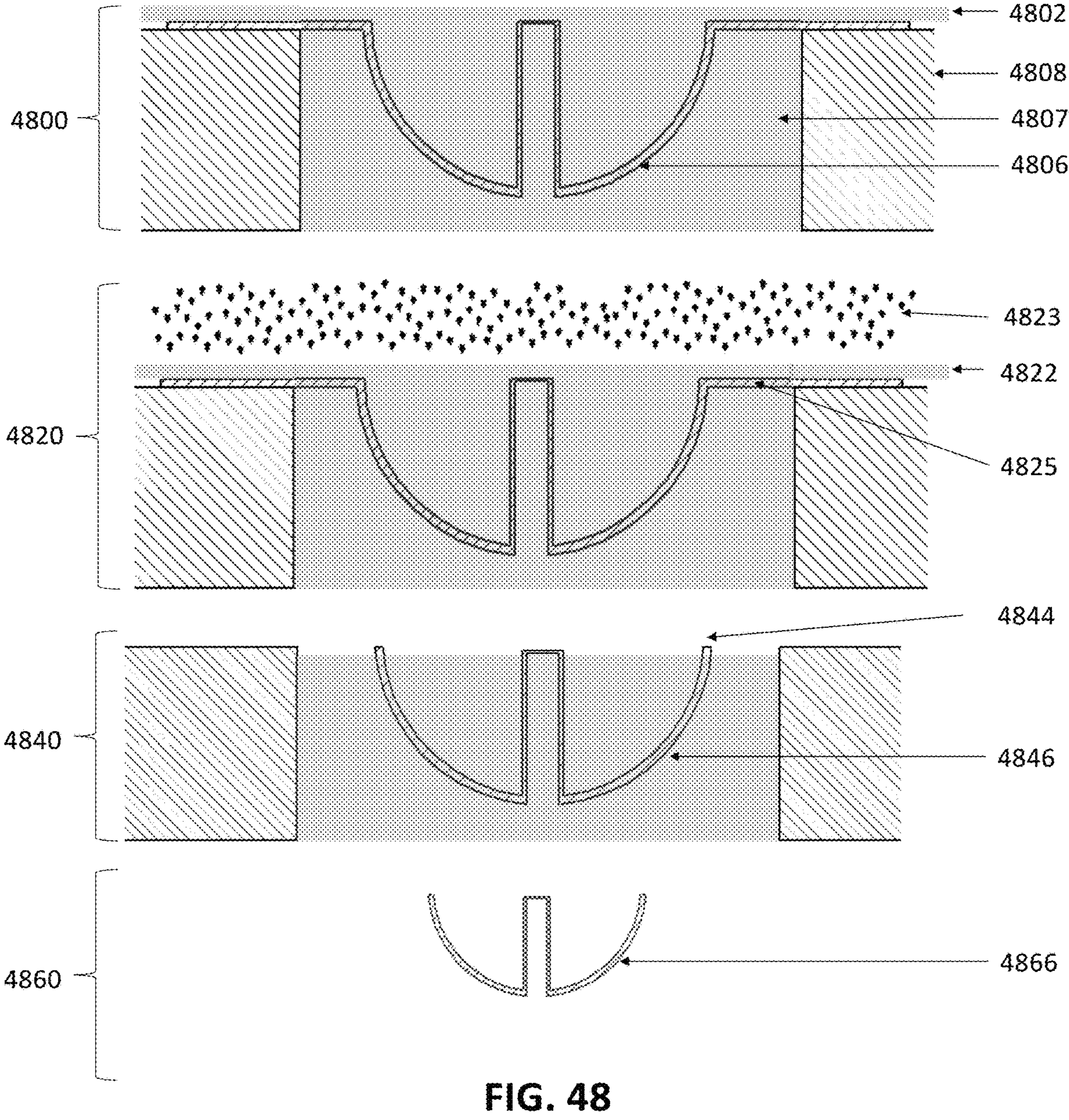

FIG. 48 shows another example of singulating where the encapsulated shell is singulated by sandblasting.

Figure 49:
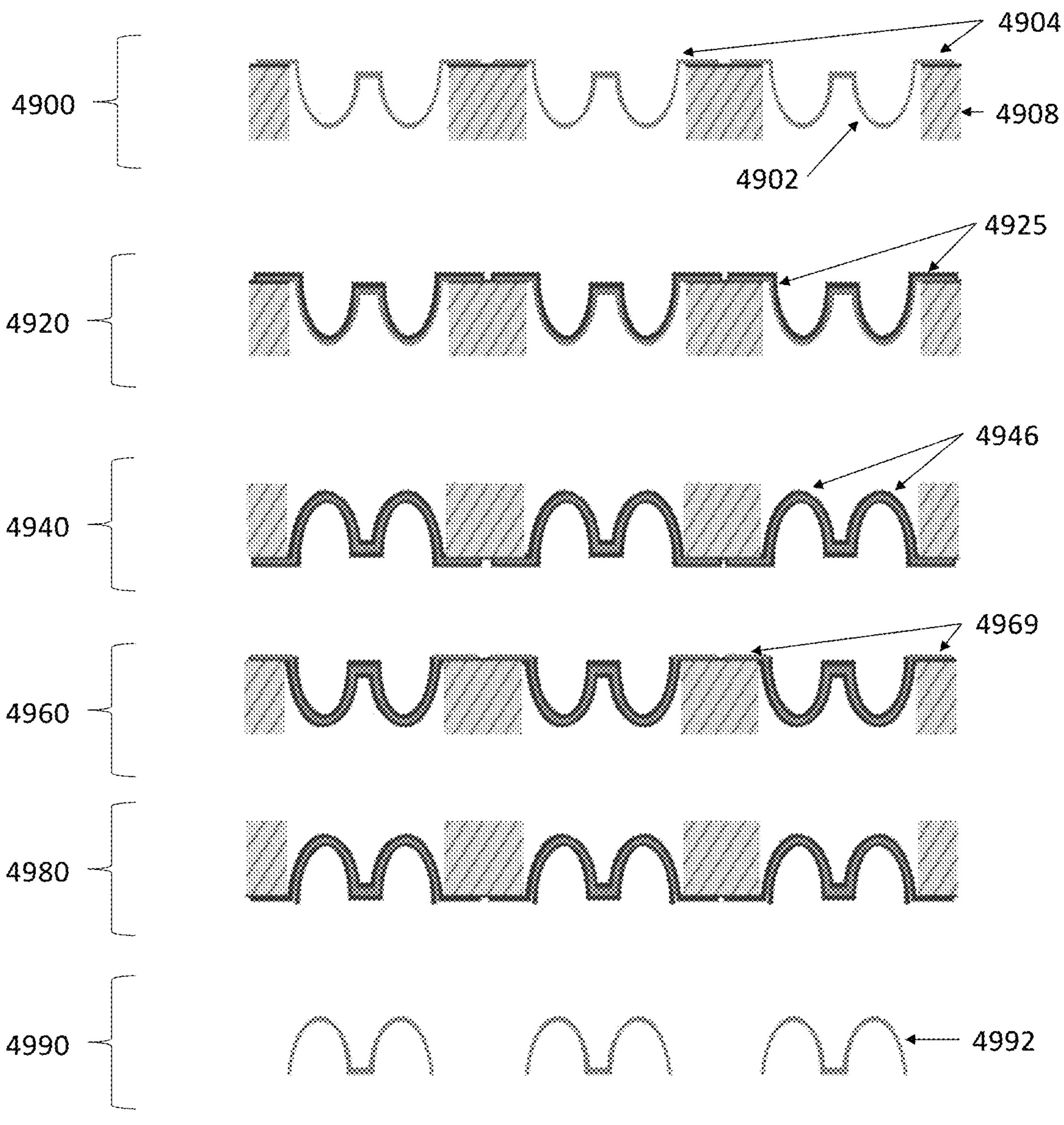

FIG. 49 shows another example of singulating where the shell is coated on both side with a protective layer and exposed in a region of flat surface using self-aligned patterning process. When put in an etchant, the exposed region etches off, thus singulating the shell.

Figure 50:
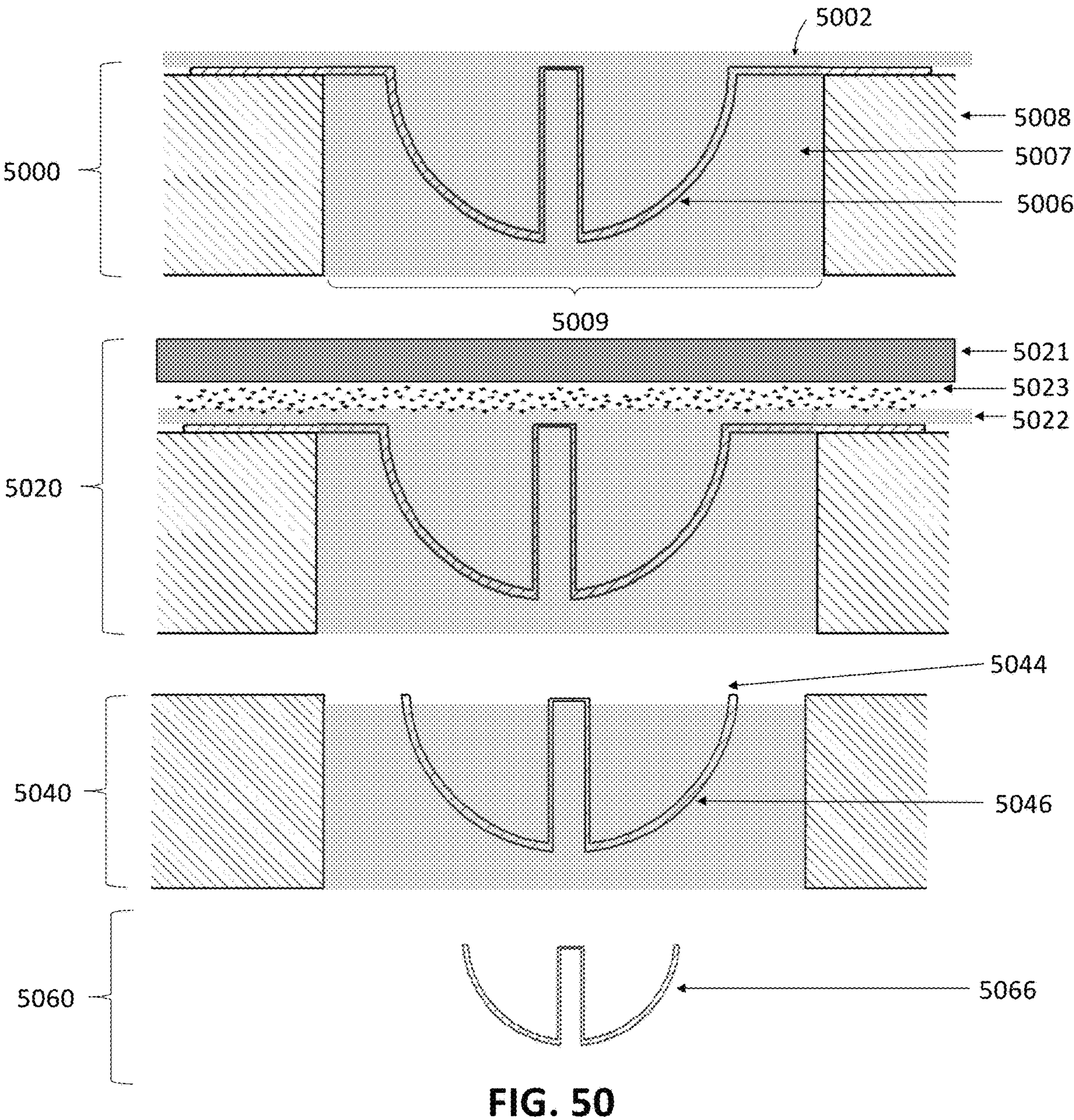

FIG. 50 shows an example of singulation using abrasive slurry.

Figure 51:
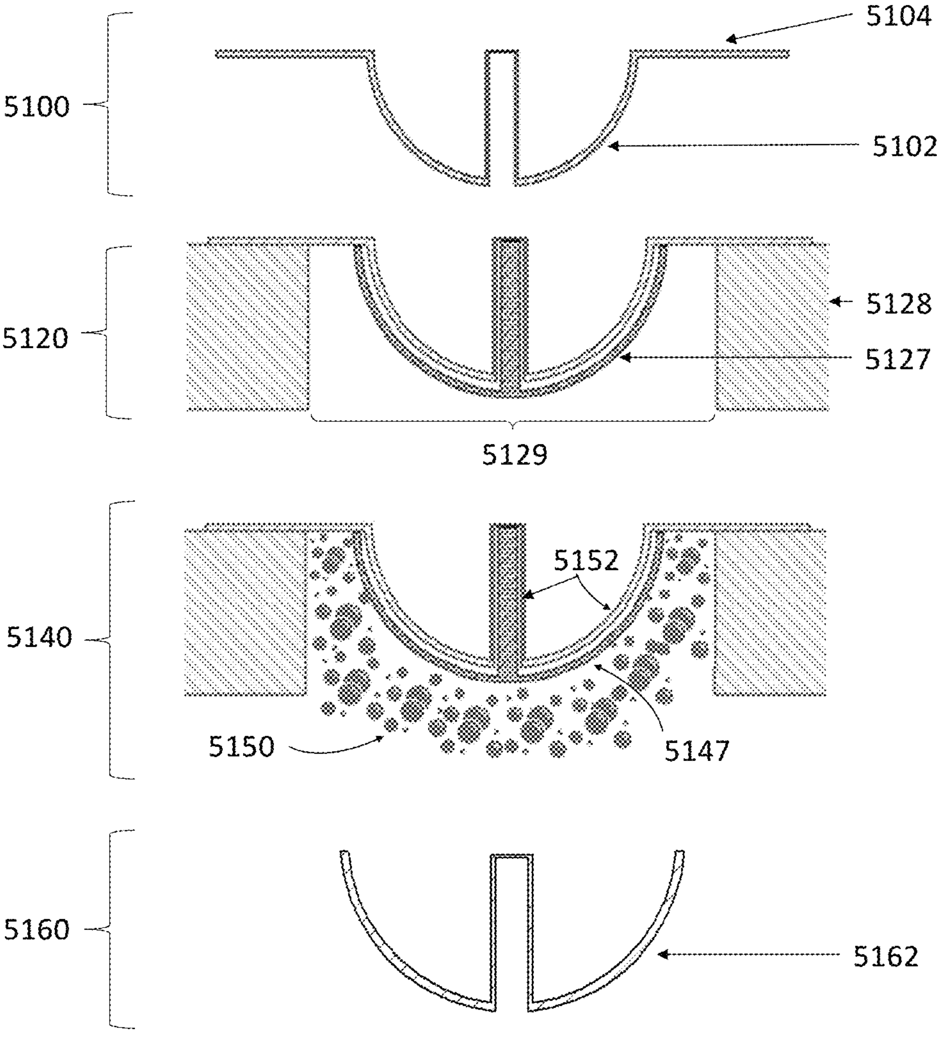

FIG. 51 shows an example of singulation by protecting the shell with a protective structure/film and exposing it to vapor-phase etchant from the back side.

Figure 52:
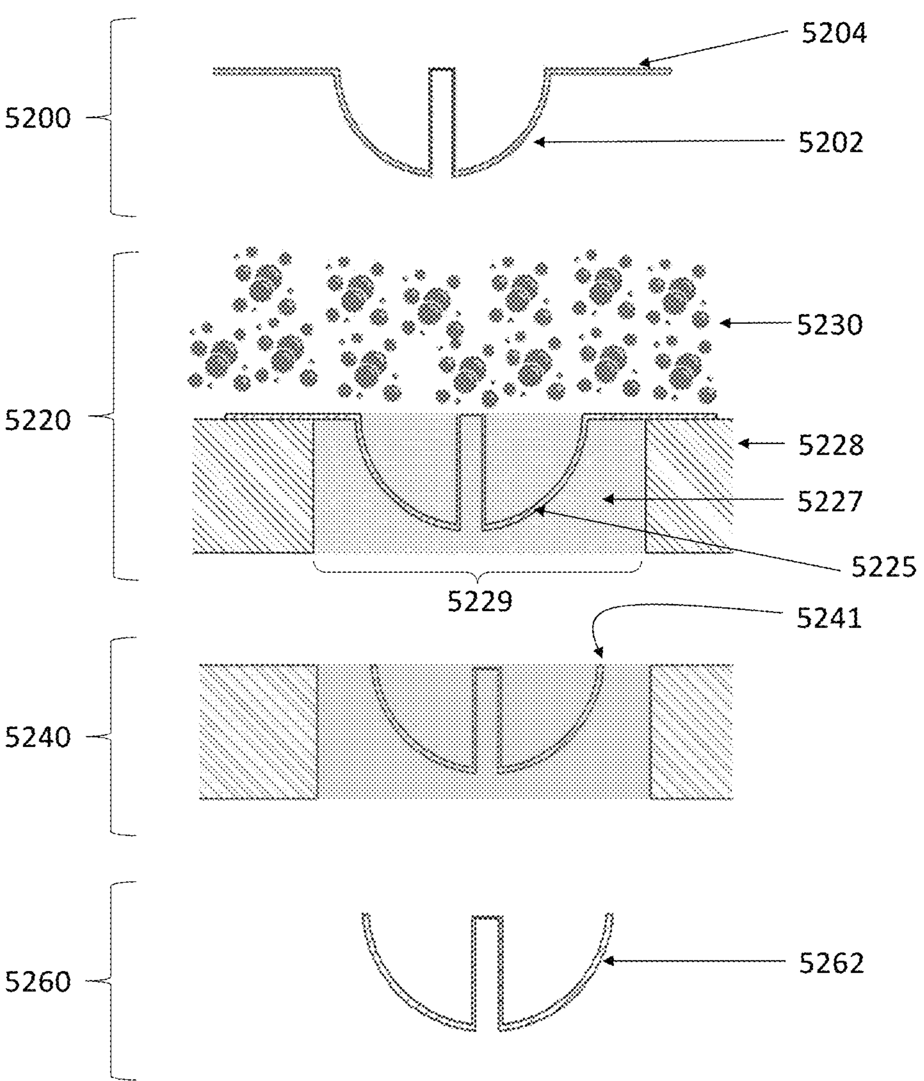

FIG. 52 shows an example of singulation by protecting the shell with a protective structure/film and exposing it to vapor-phase etchant from the front side.

Figure 53:
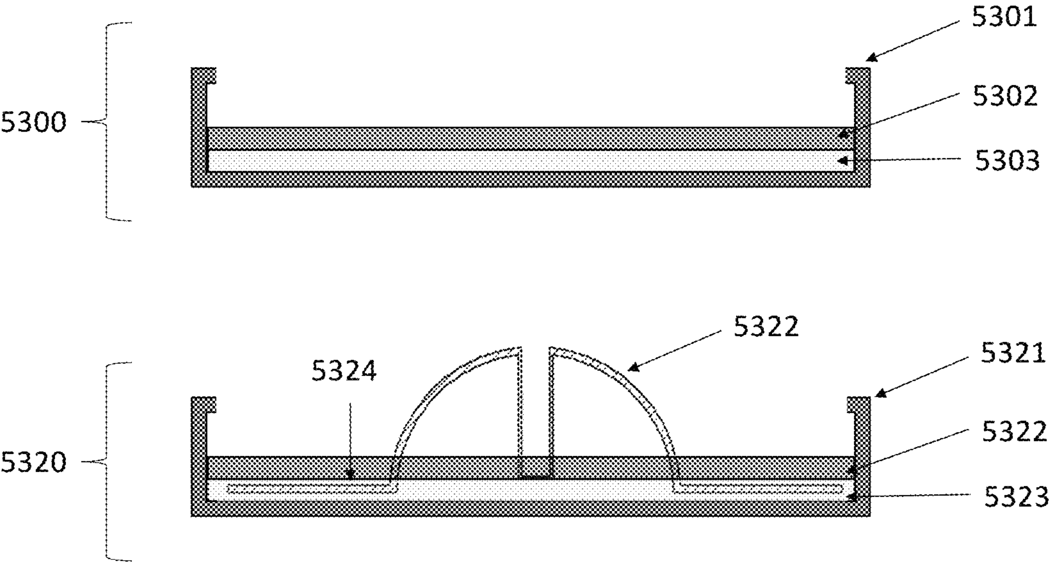

FIG. 53 shows an example of singulation by dipping the shell in a mixture of two or more immiscible liquids one of which is an etchant.

Corresponding reference numerals indicate corresponding parts throughout the several views of the drawings.

DETAILED DESCRIPTION

Example embodiments will now be described more fully with reference to the accompanying drawings.

Three-dimensional microstructures, especially those made from high-melting-temperature materials such as fused-silica are often made so that they have a closed, or continuous, region. For example, a wineglass is a continuous three-dimensional shell. It is desirable that for some applications, the three-dimensional microstructures have openings or have some regions on their body removed, thus creating different shapes and profiles, for example to create structures having high quality factors (Q) or structures having different specific shapes. Drills, milling machines, and/or lasers can be used to create openings at the macro level, while lasers or ultrasound machining can be used to create openings at the micro level. Such techniques, however, are often expensive and time consuming and adaptable only for a single device. Accordingly, it would be desirable to develop improved three-dimensional fused silica structures, and methods of making the same, that can address these challenges.

Figures 6A, 6B, 6C, 6D:
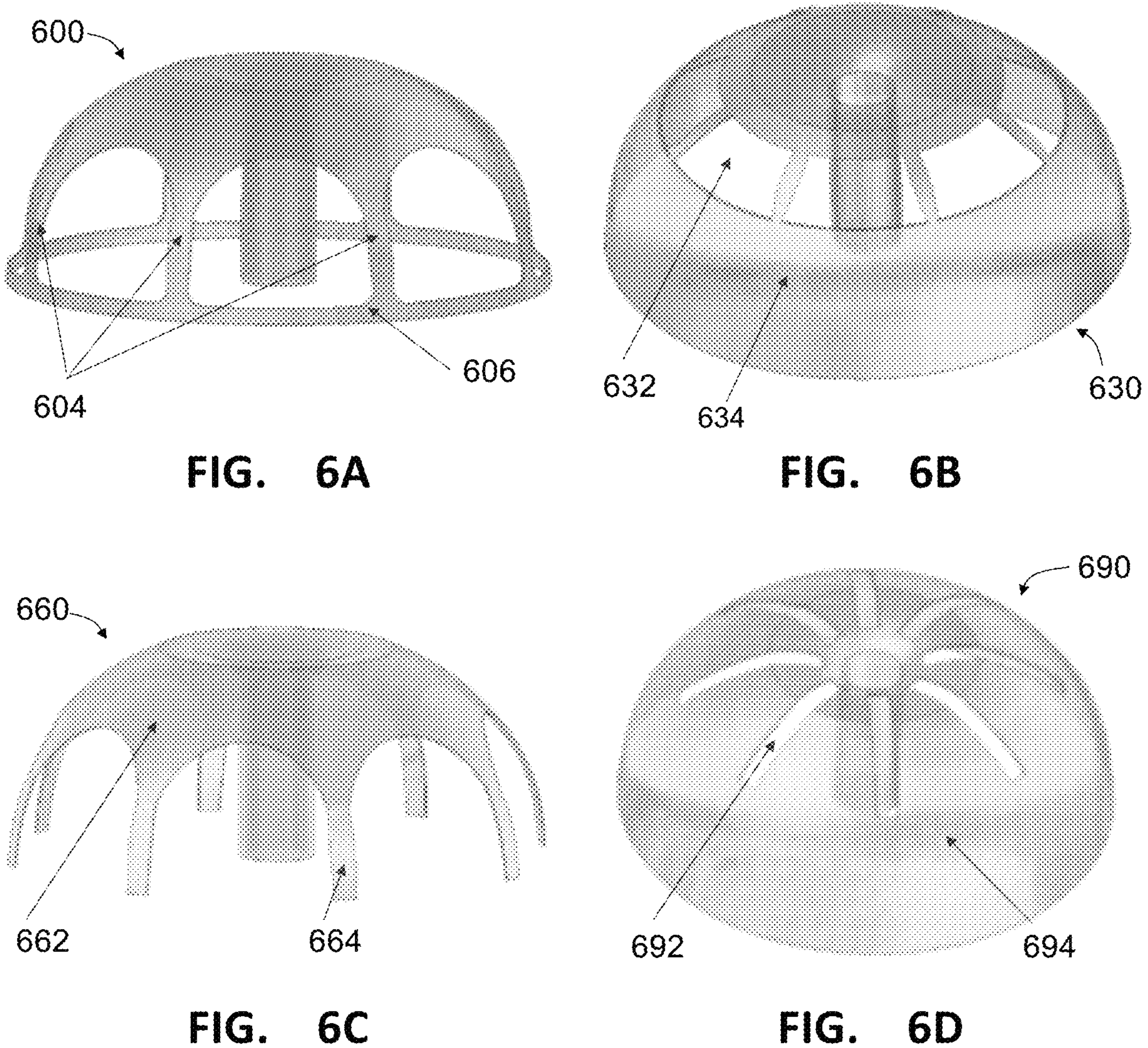
FIG. 6A-6D are perspective views of three-dimensional shell structures having selectively removed regions in accordance with various aspects of the present disclosure. The removed regions or openings could be of any shape, size and could be located anywhere on the surface of shell.

FIG. 6A-6D illustrate example three-dimensional microstructures that may be used as a sensor element, for example, for use within vibrating gyroscopes or three-dimensional sensors and actuators. FIG. 6A illustrates a three-dimensional microstructure 600 having a cylindrical structure 606 with several beams 604 supporting it. FIG. 6B illustrates a three-dimensional microstructure 630 having openings or windows 632 defined at the apex of a dome structure 634. FIG. 6C illustrates a three-dimensional microstructure 660 with suspended or hanging beams 664 attached to a dome 662. FIG. 6D illustrates another three-dimensional microstructure 690 having openings or windows 692 defined within an apex of a dome structure 694. The skilled artisan will appreciate that the present disclosure also applies to various other structures and configurations beyond that illustrated in FIG. 6A-6D.

Figure 1:
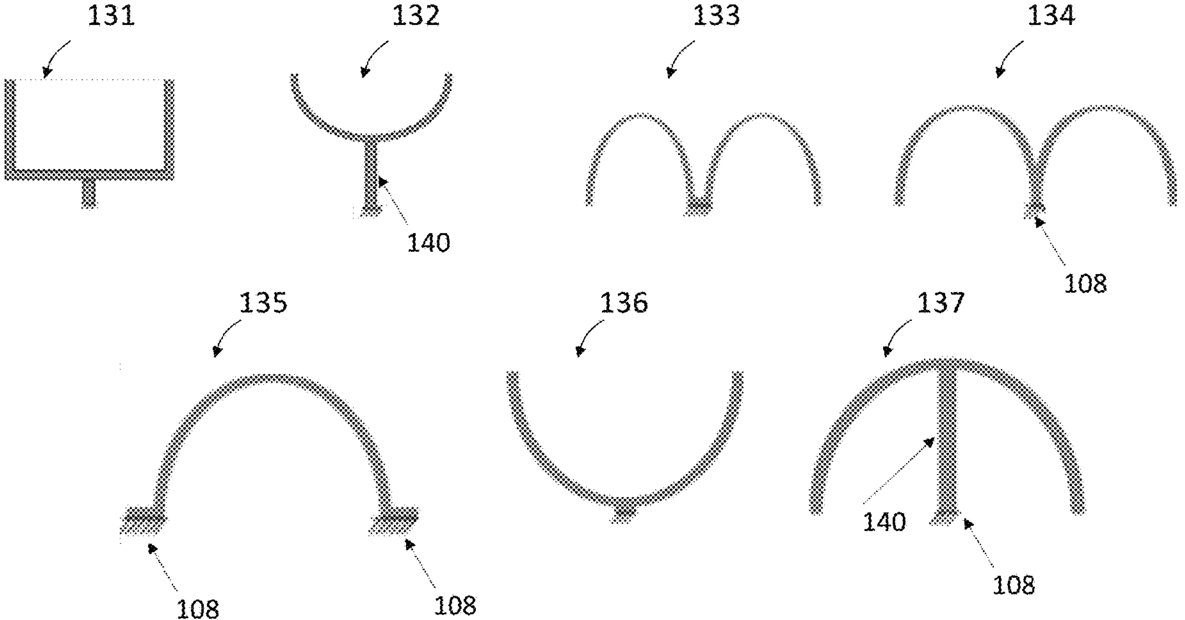
FIG. 1 illustrates different shapes for 3D shells with different anchoring schemes.
Figure 2A:
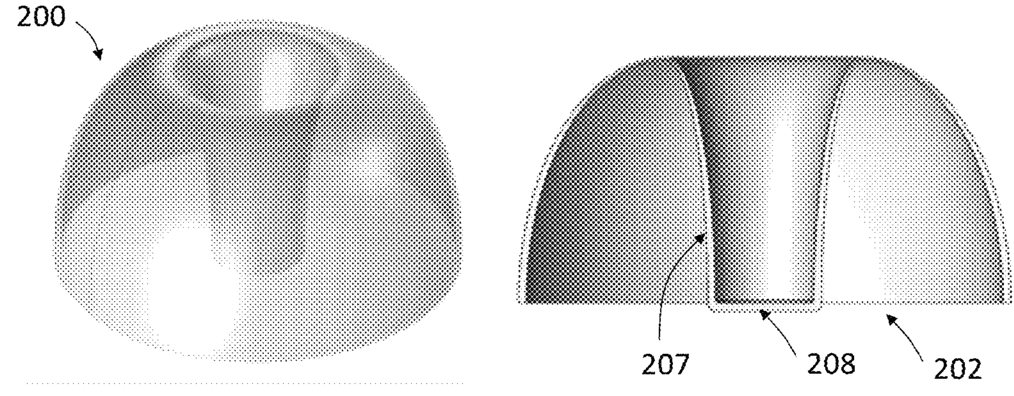
FIGS. 2A and 2B illustrate 3D shells of different shapes.
Figure 2B:
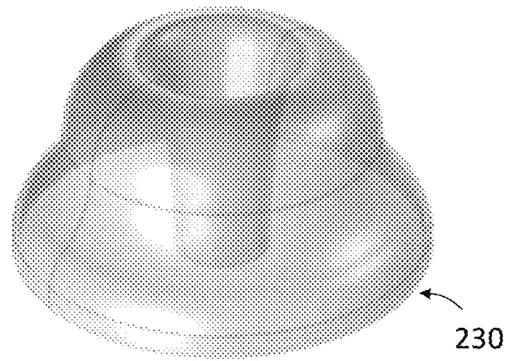
Figure 3:
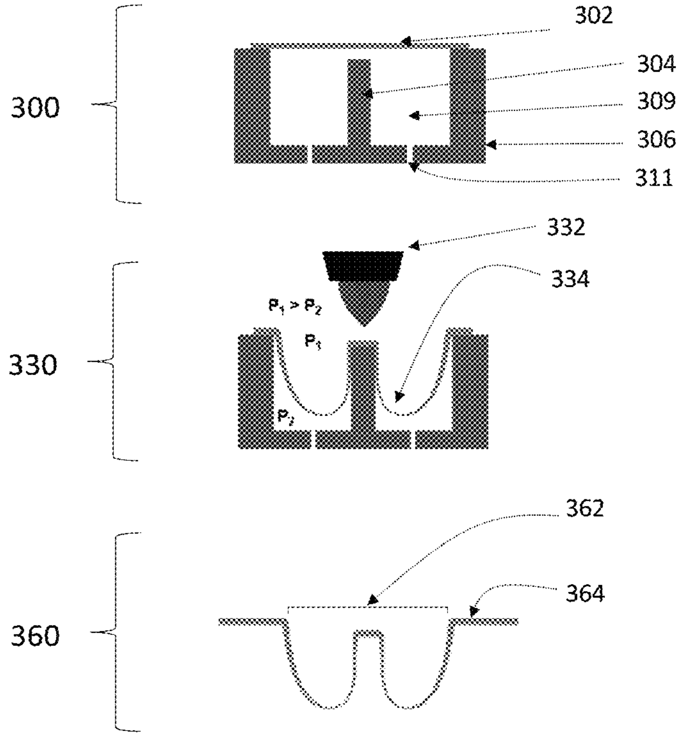
FIG. 3 shows an example fabrication process for 3D shells using blowtorch molding; the molded shell has a usable 3D part and an additional 2D part which should be removed to release/singulate the shell.
Figure 7:
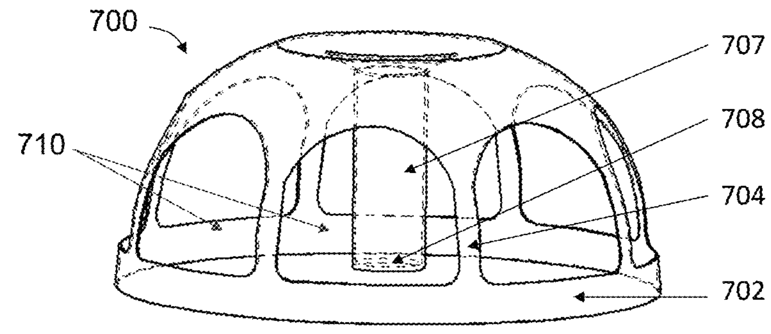
FIG. 7 depicts an example embodiment of a shell with selectively removed regions on its surface. This structure shows a suspended cylinder supported by beams which are anchored inside the shell structure.

Three-dimensional microstructures, such as illustrated in FIG. 6A-6D, formed using a method discussed below, may be used as a vibrating element of a vibrating gyroscope, such as those described in FIG. 4 and FIG. 5. For example, three-dimensional structure 700 as illustrated in FIG. 7 is a cylindrical shell 702 which is supported by several beams 704 which are attached to a stem 707 at the inside of the shell which is in turn anchored at 708 to a support substrate (not shown). This shell could be used instead of the birdbath shells or the 3D bell shaped shells shown in FIG. 2 and FIG. 4 and FIG. 5 to make a gyroscope. The structure is anchored at 708 through the center post 707 to a support substrate (not shown). The three-dimensional structure 700 includes a plurality of openings 710 between the beams 704. In the configuration shown, the beams 704 all merge in a region near the top of the structure and lead into the central post 709. In this manner, the cylindrical structure 702 is supported using a plurality of beams 704 and the beams 704 are attached to a substrate on the inside of the shell 700.

Figure 4A:
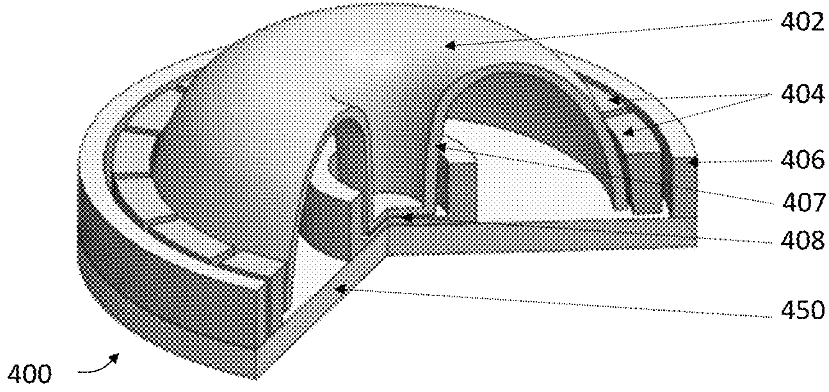
FIGS. 4A and 4B depict resonant gyroscopes utilizing 3D shells either face down or face up respectively, integrated with electrode substrate for capacitive driving and sensing.
Figure 4B:
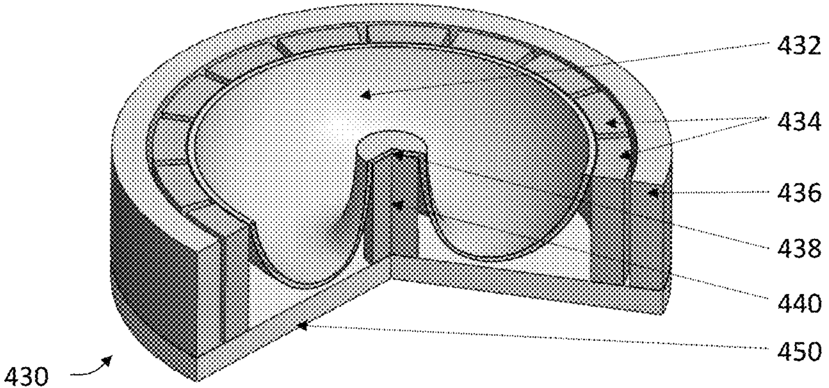

The shell 700 can be vibrated using capacitive electrodes (as shown in FIG. 4) that can be placed on the outside or the inside perimeter of the cylinder structure 702 and separated from it by a small gap. In certain variations, the shell 700 may be coated with a conductive layer, and by applying a time varying voltage between the electrodes and the shell, the shell 700 can be vibrated to resonance.

When the cylinder structure 702 is rotated around its vertical axis (e.g., the axis that is along the length of the post 707), the vibration patterns of the cylinder 702 will move and change in response to the Coriolis force/acceleration that is induced due to the rotation. The change in vibration pattern can be sensed using sense electrodes that are positioned close to the cylinder shell 702. The cylinder shell 702 provides excellent performance (e.g., excellent quality factor (Q)) when it is made out of low-loss and insulating materials like fused-silica. Further, the quality factor can also be very high because the cylinder structure 702 is supported only using a few beams 704, so as to minimize the loss of energy to the substrate (not shown) through the stem/post 707 and anchor 708, the so called anchor loss. Therefore, the anchor loss could be reduced because shell 700 has open areas that isolate the cylinder shell 702 from the anchor 708.

In the instance of a structure with two wine-glass modes, one may be used for a drive mode, while the other one is used for a sensing mode, and energy is transferred from the drive mode to the sense mode so as to change vibration patterns. As noted above, sense electrodes are placed on the outside or the inside of the shell and separated from the shell by a small gap and are used to monitor vibration patterns and changes. In use, the two modes are not always at the same frequency as a result of fabrication and structural imperfections. To obtain very high performance, this mismatch in frequency has to be minimized and ideally brought as close to zero as possible. Often, the structures are mechanically trimmed to change the frequency of one of these modes. This change in frequency can be done by removing/adding a small amount of mass to some areas on the shell, or it can be done by changing the mechanical stiffness of the structure in some areas around the shell.

Figure 8:
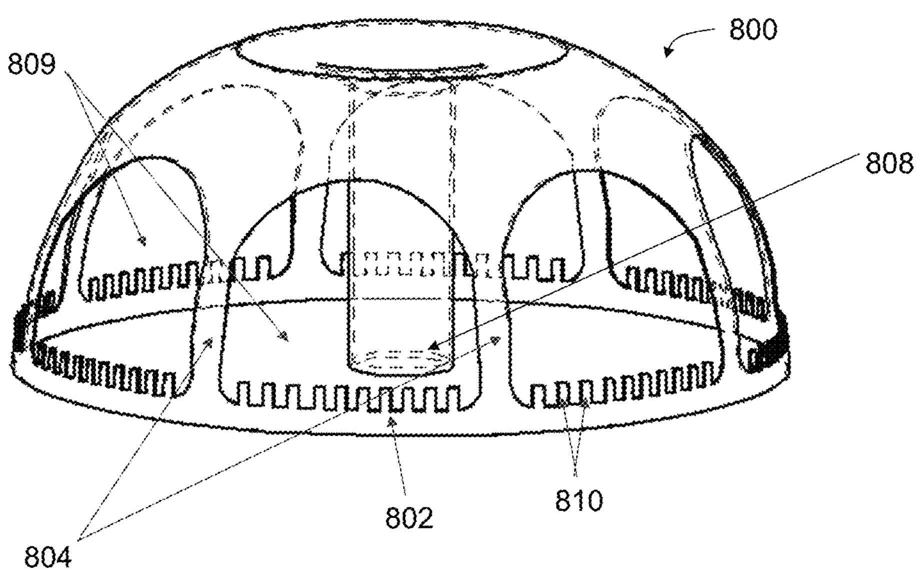
FIG. 8 depicts an example embodiment of a shell with selectively removed regions on its surface and additional tuning tabs extruding from the shell.
Figure 9:
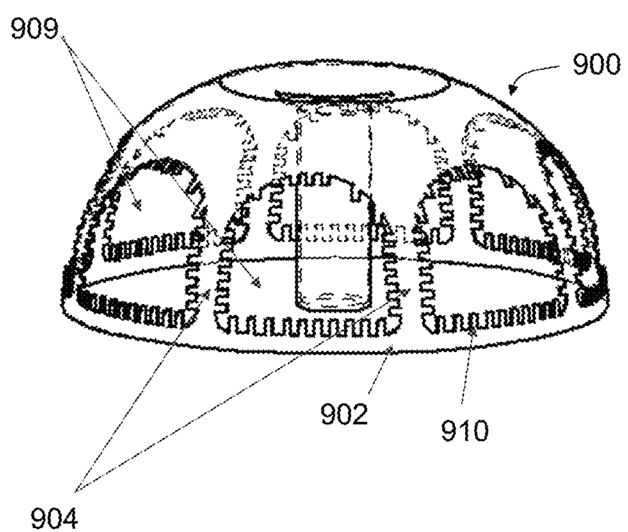
FIG. 9 depicts an example embodiment of a shell with hollow features on its surface and additional tuning tabs on multiple boundaries of the hollow feature.

An advantage of the three-dimensional structures (e.g., shells) according to the teaching of the present disclosure is that such structures may be more easily shaped to tune the resonant frequencies of the different resonance modes of the structure. For example, FIG. 8, similar to FIG. 7, illustrates a three-dimensional structure 800 with several beams 804 supporting a cylindrical rim 802. The cylindrical structure 802 is anchored to a substrate at 808. The three-dimensional structure 800 also includes a plurality of tabs 810, for example, as illustrated the plurality of tabs 810 may be disposed along one or more edges of the plurality of openings 809. The tabs 810 are configured to be removable from the three-dimensional structure 800 so as to adjust frequencies and/or damping or mechanical stiffnesses and/or match frequencies and/or damping or mechanical stiffnesses of the three-dimensional structures and improve performance of the three-dimensional structure 800. FIG. 9 shows a similar structure 900 to that shown in FIG. 8, including a cylindrical structure 902 and beams 904, but in this case frequency tuning tabs 910 are disposed along more than one length of the pluralities of openings 909.

Figure 13:
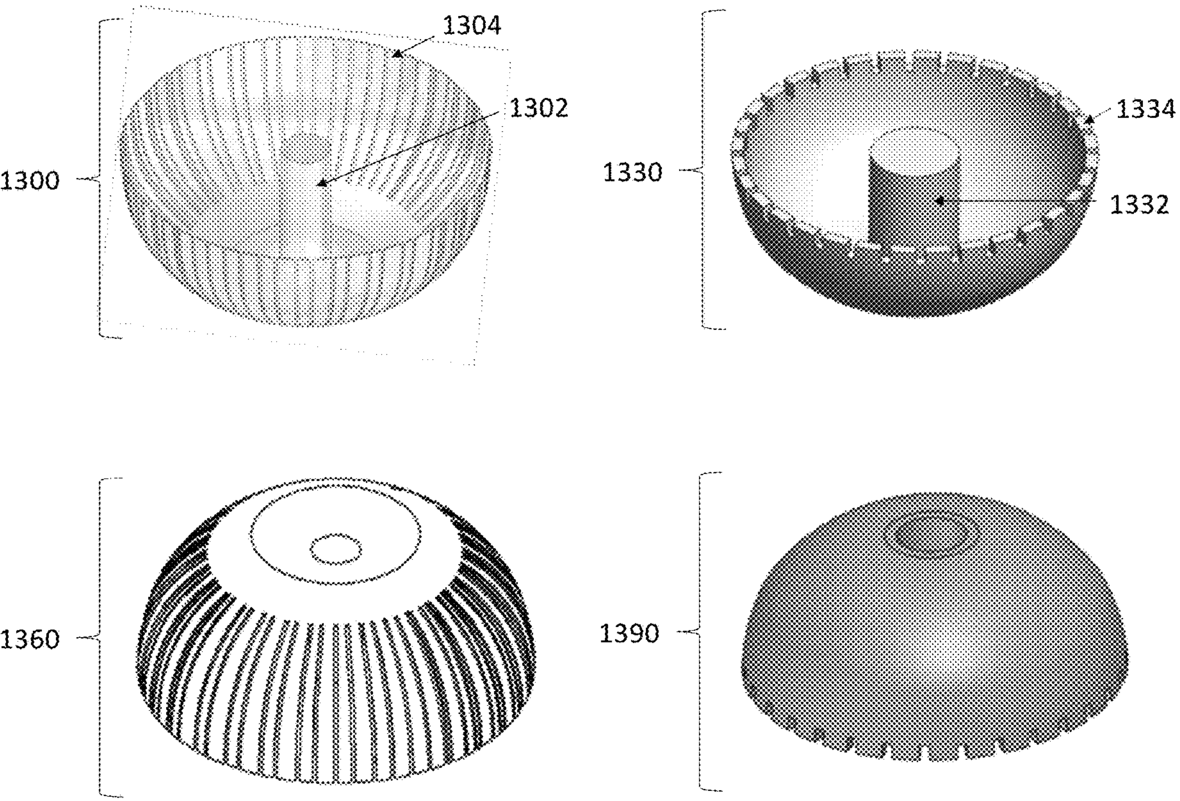
FIG. 13 are perspective views of another example embodiment of a three-dimensional structure having standard beams or tuning and/or damping beams in accordance with various aspects of the present disclosure.

The opening (i.e., selectively removed regions) on the surface of the shell do not have to be completely enclosed. Tabs could be placed to face outside of the shell. An example of such a shell is shown in FIG. 13.

The important features for all the shells having tabs that have been described here are that the tabs are substantially in parallel directions with the surface of the shell and the tabs have nearly the same thickness with the regions of the shell where they are connected. Tabs with these geometrical features allow a shell resonator to obtain high mechanical Q in the wine-glass mode. This is because the amount of the mechanical stress (e.g. von-Mises stress) in the region where the tab is connected to shells is small compared that of a shell resonator without tabs for same displacement. Also, tabs with these features cause a small amount of change in the stiffness of a shell resonator in the wine-glass mode compared to a shell resonator without tabs, because the tabs do not change the effective shell radius and the effective shell thickness. Therefore, mismatches in the sizes of the tabs created by nonidealities of a microfabrication process do not create large difference in the resonance frequencies of the two wine-glass modes.

Figure 10A:
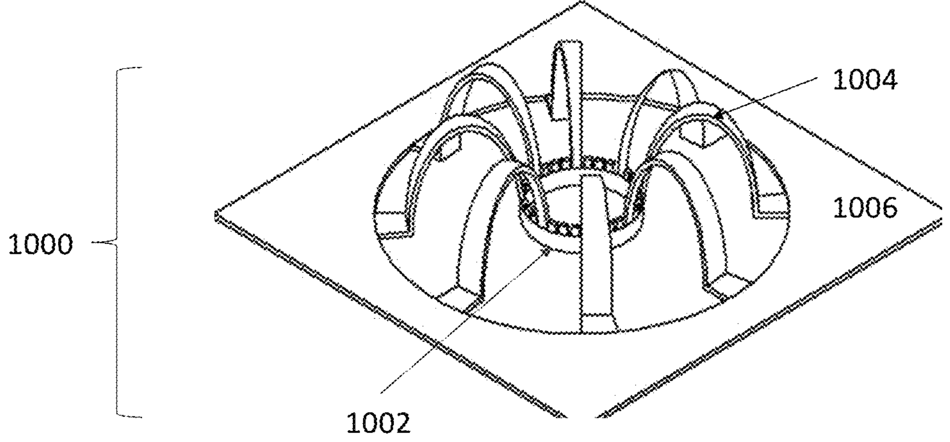
FIG. 10 depicts an example embodiment of a shell with a suspended cylinder and supporting beams anchored outside the vibrating region. The suspended cylinder may have tuning beams protruding from its top surface.
Figure 10B:
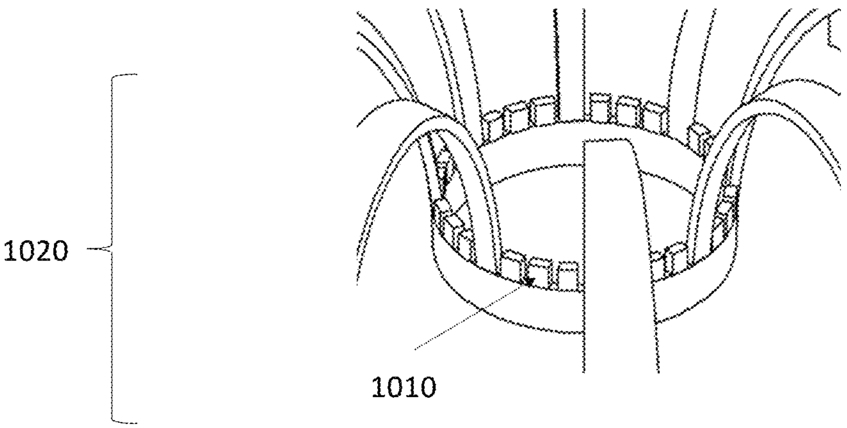

In another variation of this suspended cylindrical shell 1000, instead of supporting the shell with beams that curve inside as was shown in FIG. 7, the shell could be supported using beam 1004 that curve outward and away from the cylindrical shell 1002 and are then attached to a substrate 1006 on the outside as shown in FIG. 10A. FIG. 10B shows a close-up view of the cylindrical shell shown suspended in the middle of FIG. 10A. As seen in FIG. 10B, this cylindrical shell 1020 could also have tabs 1010 for frequency tuning.

Figures 11A, 11B:
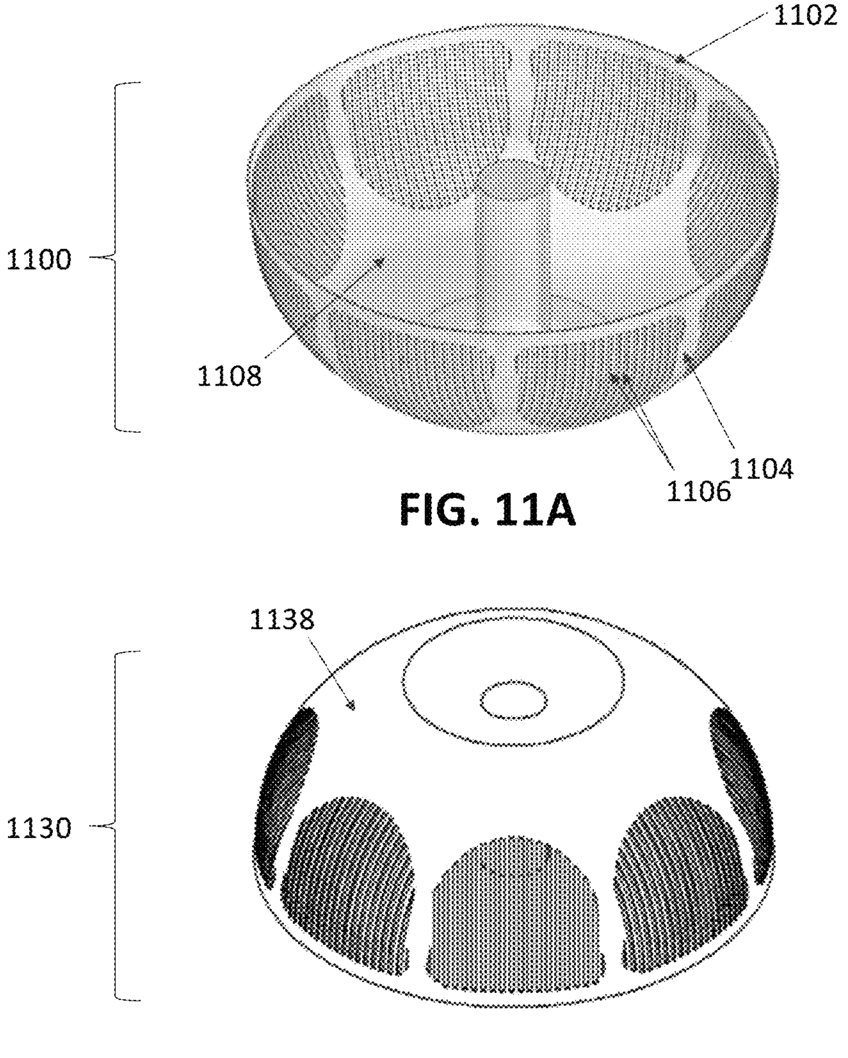
FIGS. 11A and 11B are perspective views of an example embodiment of a three-dimensional shell structure having openings, as well as tuning and/or damping beams in accordance with various aspects of the present disclosure.

In another variation, illustrated in FIG. 11A, instead of tabs as shown in FIG. 7, a three-dimensional structure 1100 may have a cylindrical structure 1102 with several wide beams 1104 supporting it. The three-dimensional structure 1100 further includes a plurality of narrow beams 1106 disposed between the wide beams 1104 and attached to the cylindrical shell 1102 and the top of the shell dome 1108. In this instance, the resonant frequency or damping or stiffness of the three-dimensional cylindrical shell 1102 could be modified by removing or breaking some of these narrow beams 1106 and/or by introducing a small cut or cracks across one or more of the narrow beams 1106, for example by using a laser or other known techniques, such as milling. In this design the beams 1106 control the overall stiffness of the cylindrical shell as well as the damping, which is controlled by changing the path where energy is lost from the vibrating cylinder through the post to the substrate. As seen in FIG. 11B, a three-dimensional structure 1130 with a dome 1138 is provided.

Figures 12A, 12B:
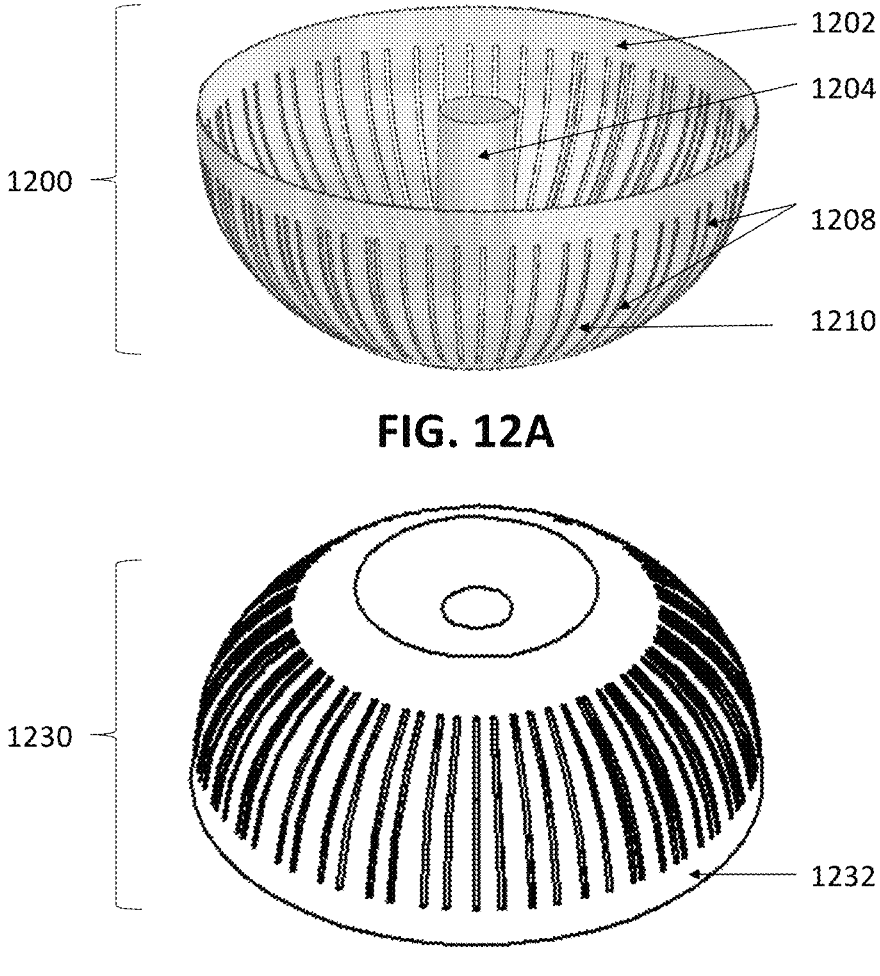
FIGS. 12A and 12B are perspective views of another example embodiment of a three-dimensional structure having openings, as well as tuning and/or damping beams covered uniformly around the entire shell in accordance with various aspects of the present disclosure.

In yet another structure shown in FIG. 12A, the beams 1210 surround the entire revolving surface of the shell 1200 and provide support for a support post 1204 of the structure. Resonance of the cylindrical shell 1202 can be changed by changing the stiffness and damping so the resonance of the cylindrical shell 1202 could be made as symmetric as possible. Note that instead of breaking off these beams, it is possible to use a laser to create narrow vertical cuts 1208 going up and down the shell surface from the rim to the post in order to change stiffness and damping. These cuts 1208 could create opening or they could simply change the morphology of some regions to affect stiffness and damping. As shown in FIG. 12B, a shell 1230 with cuts extending upwardly from a cylindrical shell 1232 is provided.

FIG. 13 shows yet another structure (1300, 1330, 1360, 1390) that consist of only beams 1304 or 1334 extending down from the top of the shell where they join with the central post 1302 and 1332 that anchors the structure to the substrate. There is no suspended cylinder in this structure and the end of the beams distant from the post region are free.

Figure 14:
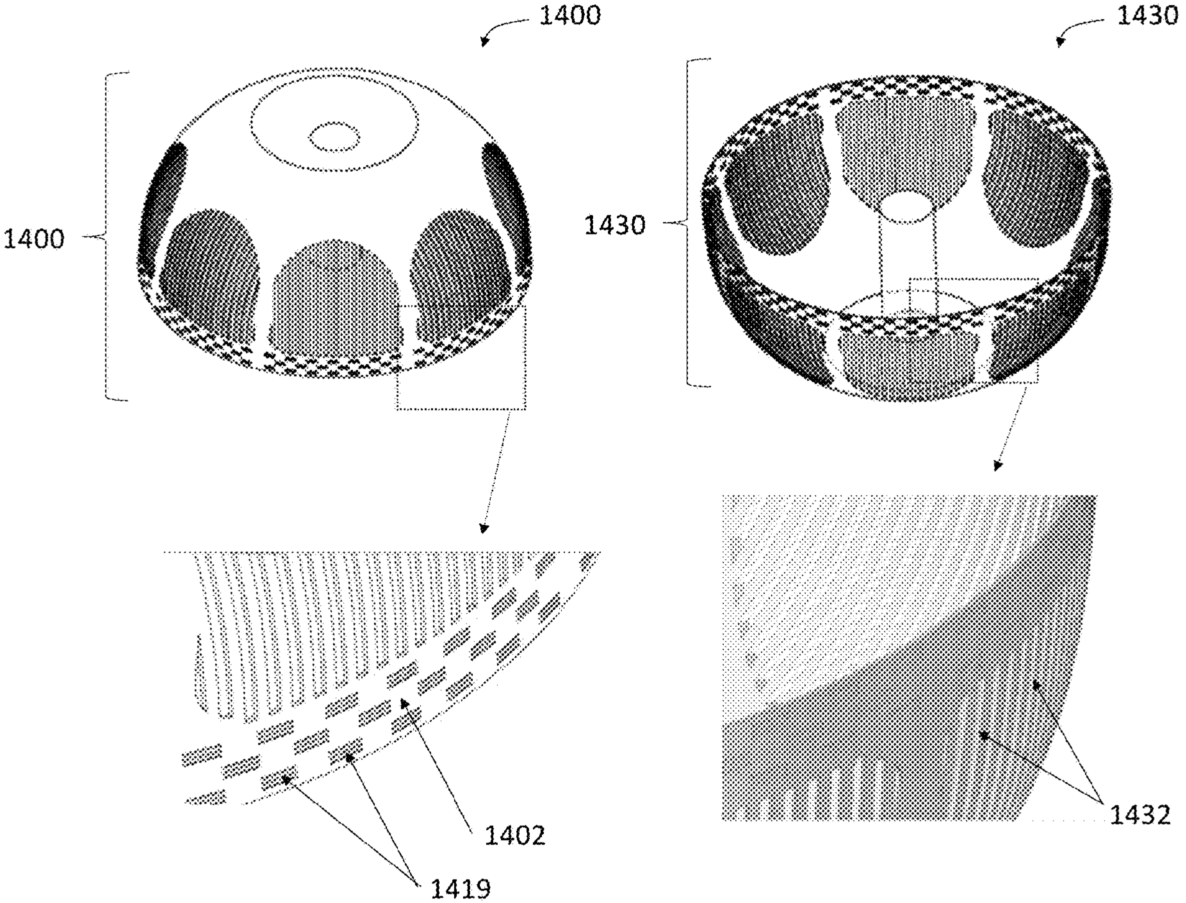
FIG. 14 are perspective views of yet another example embodiment of a three-dimensional structure having openings, as well as tuning and/or damping beams in accordance with various aspects of the present disclosure. The tuning beams could be in transverse or lateral direction or both on any surface.

In yet another structure (1400, 1430) shown in FIG. 14, it is possible to create horizontal or vertical cuts/opening 1419 to form narrow beams around the perimeter of a suspended cylindrical shell 1402 that is supported using beams 1432. These small beams can be cut selectively and by doing so the stiffness of the suspended cylinder 1402 that is the substantially vibrating part of the structure can be changed. It is understood that these horizontal openings could be placed at different locations around the shell.

Three-dimensional structures, such as illustrated in FIG. 14, is formed using a method described later in this document and as illustrated in FIG. 16-19, may also be used as shadow (e.g., stencil) masks, for example as illustrated in FIG. 15.

Shadow (stencil) masks are structures with user-defined through-openings that may be placed on top of other structures that are to be coated with another material, for example a conductive metal coating. In such instances, the coating material goes through the openings of the stencil masks and deposits selectively on the underlying structure.

Such stencil (shadow) masks are routinely used for depositing a variety of novel and sometimes exotic materials including metals and dielectrics selectively on substrates. One application of such shadow masks is in 3D shells made from fused silica shell resonators used for inertial sensors. While fused silica is a favorite material for such resonators due to its low thermoelastic damping (TED) losses, it poses challenges when the structure must be electrostatically sensed or actuated because it is a dielectric. As such, these shells are often coated with a thin electrically conductive layer. This conductive coating increases damping and should, however, only be deposited on specific regions of interest to reduce damping. The best tradeoff is to selectively coat the surface only near the free end (e.g., the rim). This can be accomplished either by lithography which is challenging on complex surfaces like a 3D shell, or by using shadow masks. Shadow masks for flat substrates are easy to fabricate using lithography and wet/dry etching and are therefore routinely used. However, those for three-dimensional surfaces are difficult to fabricate.

FIG. 15 shows how a shell structure with selectively removed regions can be used as a shadow mask to selectively coat material on another shell. Shadow mask 1500 in FIG. 15 is fabricated using techniques described later. A 3D shell fabricated using the same techniques but without any openings, 1530, is used as an example structure. The shadow mask 1500 is placed on top of the structure 1530 as shown in 1570, where regions 1572 are exposed through the shadow mask. A material is deposited on this combination 1570. When the shadow mask is removed the structure 1530 is left behind with some regions of it coated with the material as shown in 1550. The shadow mask is also coated with the material as shown in 1590.

Figure 16:
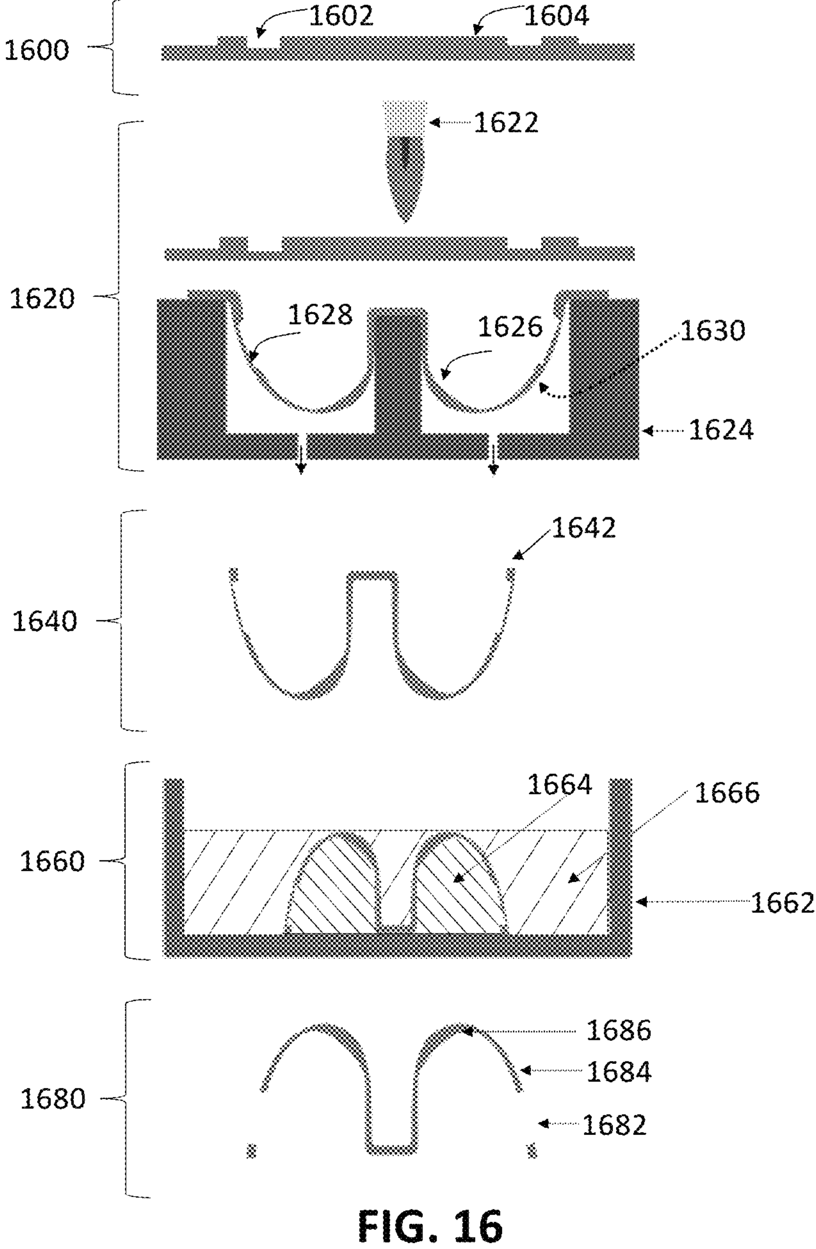
FIGS. 16 and 17 are diagrams illustrating the fabrication process of a shell with open regions on its surface.
Figure 17:
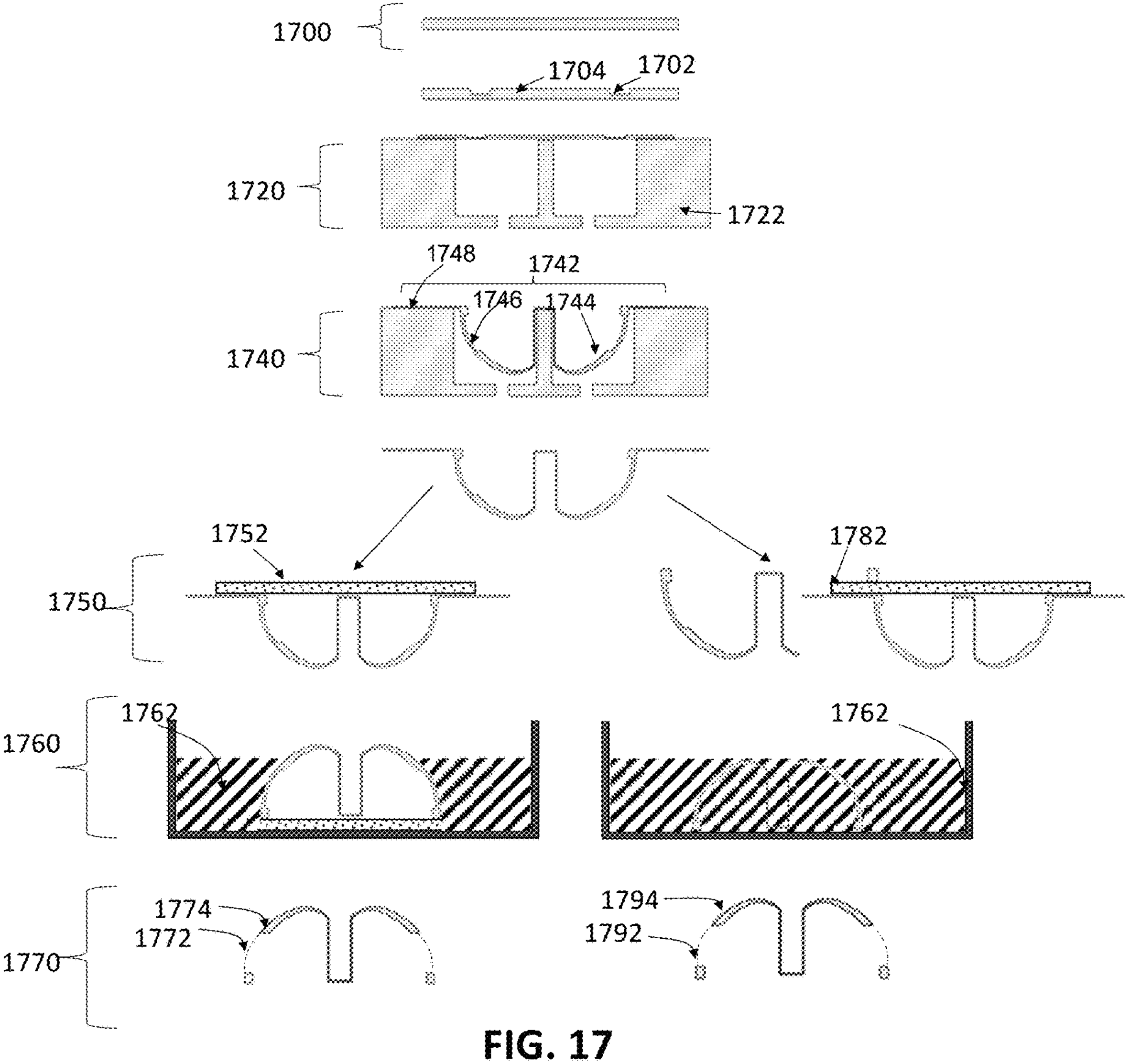

Three-dimensional shells having controlled profile and surface continuity in the form of openings, such as illustrated in FIG. 6A-6D, can be fabricated using a method that includes a multi-step process. As illustrated in FIGS. 16 and 17, the method includes, for example at 1600, defining one or more thinned regions 1602 in a first substrate or wafer 1604 so as to define a patterned substrate 1600. The one or more thinned regions 1602 may be defined in the first substrate 1604 using one or more of lithography and wet etching. For example, in certain aspects, the method includes at 1600, though not illustrated, coating a first surface of the first substrate 1604 with a mask (for example, a bilayer of metal) and etching or patterning (for example, using hydrofluoric acid etching) the exposed areas of the first surface for a predetermined time so as to define the one or more thinned regions 1602. The masking layer may be removed or stripped using another wet etchant and the patterned substrate 1600 may be shaped using dicing and cleaned, for example using a solvent and/or Piranha solution. By way of non-limiting example, the one or more thinned regions 1602 may have a substrate thickness of about 150 μm, while the pattern substrate has an overall substrate thickness of about 350 μm.

The method further includes, for example at 1620, placing the first substrate 1600 against or adjacent a mold 1624 (e.g., a graphite mold) and blowtorching (e.g., fuel-oxygen blowtorch 1622) the patterned substrate 1600 so as to define a three-dimensional shape, for example, a shell 1630. For example, the patterned substrate 1600 may be kept atop the mold 1624 as the heating source softens the pattern substrate 1600 by raising the temperature above about 1700° C. An applied pressure difference across the patterned substrate 1600, for example created by vacuum pull inside the mold 1624, pulls the patterned substrate 1600 into the mold 1624 so as to create the three-dimensional shape (e.g., shell 1630). The skilled artisan will appreciate that different shapes like cylinder, birdbath, and/or hemispheres, as well as various other shapes, having different aspect ratios and anchor configuration can be fabricated using different mold designs.

During the torching, the one or more initial thinned regions 1602 are further thinned 1628 (e.g., much thinner than the rest of the shell regions 1626) as a result of the stretching of the first substrate 1600. In various aspects, the dimension of the thinned region 1628 on the patterned substrate 1600 may be tuned to control the aspect ratio of the shell 1630. Similarly, the torching parameter can also be optimized to control the stretching of the patterned substrate 1624 and to define different dimensions, for example a deeper molding may lead to more stretching of the patterned substrate 1600. The deformed shell is now removed from the mold and the flat parts are removed to produce the shell 1642.

The method may further include, for example at 1640, masking one or more regions or portions of the shell 1642 prior to further processing. A shell 1642 may be covered with a polymer mask, and then placed in an acid bath 1662 (e.g., hydrofluoric acid), for example at 1660. In other variations, the shell 1642 is placed in an acid bath 1662 (e.g., hydrofluoric acid) and either the concave or the convex part is filled or covered with a polymer 1664, and then placed in an acid bath 1662 (e.g., hydrofluoric acid 1666), for example at 1660. The skilled artisan will recognize that in addition to those illustrated various other masking approaches may also be appropriate.

In each instance, the shell 1642 remains in the acid bath until the thinned regions 1628 are removed (e.g., etched). The thinned regions 1628 will etch faster than the thicker regions 1626 of the shell 1642. The thicker regions 1626 of the shell 1630, however, may have a reduced thickness 1684 as well as regions of higher thickness 1686 after the acid bath, yet these regions remain so as to define the three-dimensional structure 1680 having a plurality of openings or windows 1682, for example such as illustrated in FIG. 6A-6D. Though not illustrated here, in various instances, the patterned substrate 1600 may have a variety of thicknesses and the various thickness may have different resulting thicknesses after etching so as to create a variety of structural configurations, for example a structure where some regions are completely etched while other regions are substantially thinner than the remaining part of the shell. In certain aspects, as illustrated in FIG. 16, the three-dimensional structure 1680 may be further cleaned or trimmed.

FIG. 17 shows another example of a process for creating a shell with openings on its surface. A unmolded first substrate 1700 is shown. As described above, and shown in FIG. 17, the unmolded structure 1700 has one or more thinned regions 1702 in a first substrate or wafer 1704. Recesses 1720 are defined on a flat surface using an etching process by utilizing an etch protection mask made with, for example, a stack of a metal layer and a photoresist layer. The substrate is reflow-molded on a mold 1722 at above its softening temperature to deform the substrate into a shape of a hollow 3D shell with a flat substrate. The reflow-molded structure 1742 has a thin curved region 1746, a thick curved region 1744, and a flat region 1748. The substrate is detached from the mold. At 1750, a sheet of an etch protection layer 1752 such as a dry-film photoresist is attached to the top surface of the rim to protect the concave side of the shell. At 1760, the shell is then placed inside a wet etching solution 1762 such as hydrofluoric acid to etch away the flat substrate 1748 and the thin curved region 1746. The masking layer is removed, and the shell is cleaned (1770). The shell has openings 1772 removed by the hydrofluoric acid with high thickness regions 1774 remaining. Alternatively, after the reflow-molding step 1740, the flat substrate 1748 is removed using a grinding and polishing process (not shown) to release a 3D shell 1782 with no openings on the surface. The shell is blank etched in wet etchant 1762. Openings 1792 are defined on the shell surface because a thinner portion of the shell is etched away faster than the thicker portion of the shell 1794.

Figure 18:
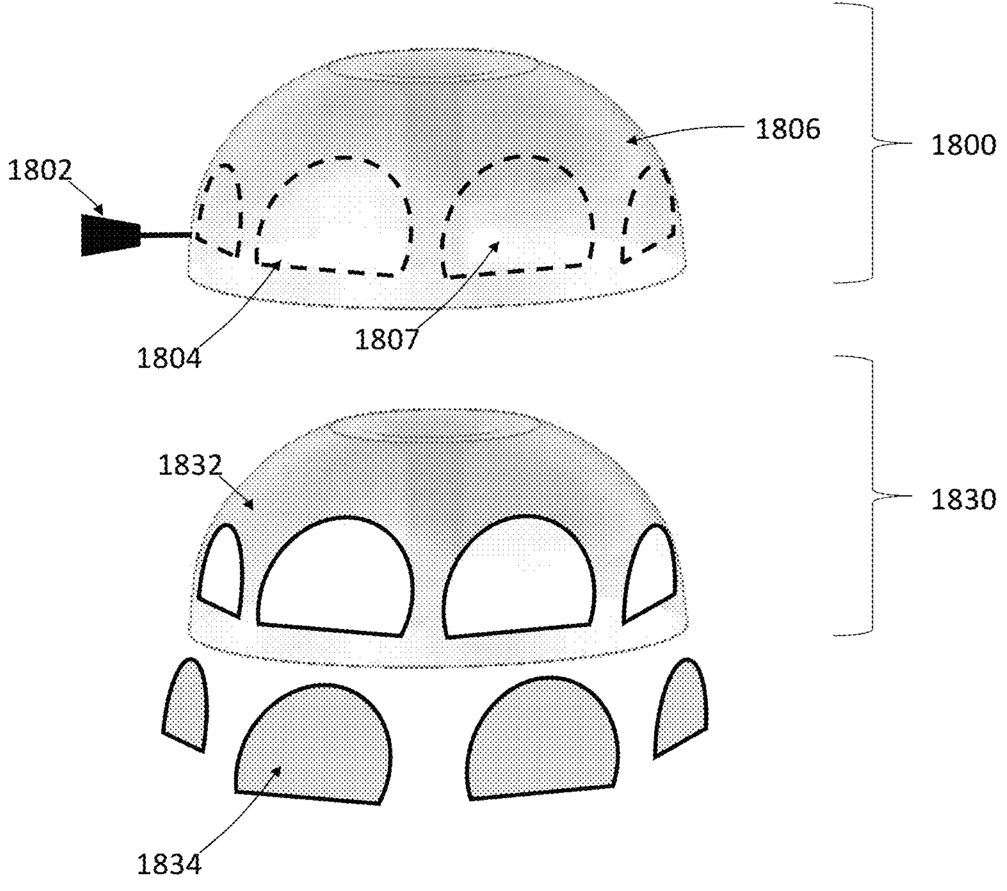
FIG. 18 is a diagram illustrating another method of creating open regions on the surface of a 3D part by scanning the desired shape with a laser followed by etching. Regions exposed to laser etch much faster than the rest of the shell leaving behind open regions on the shell.

Another method for fabricating shells with selectively removed regions is illustrated in FIG. 18. In this technique, as shown in 1800, a laser 1802, such as a high-speed femto-second laser, is used to expose the boundaries 1804 of regions 1807 that need to be removed. Such a laser will change the properties of materials such as fused-silica or glass and this change in material properties could be used to provide enhanced etching, for example in a wet etchant, only in those regions 1804 and not in the other regions 1806 which were not exposed to the laser. Notice that the laser can be scanned with very fine control and over a very narrow line. The laser, for example, can heat the regions of fused-silica and by doing so it can either vaporize the material or make the material more porous by changing its density. When the shell with the laser-exposed regions is placed in a suitable etchant, for example hydrofluoric acid for etching fused-silica or glass, the etchant attacks the laser-exposed regions 1804 much faster while not substantially etching the other regions 1806. When these laser-exposed regions 1804 are completely etched, as shown in 1830, the regions that were completely enclosed 1807 would simply fall away, shown as 1834, from the structure, leaving behind the 3D structure 1832 with selectively removed regions as shown in FIG. 18. It would be obvious to a skilled artisan that it is possible to protect one side of the shell using some protective coating, such as a polymer, so the 3D shell can be etched only from one side.

FIG. 19 shows yet another method for fabricating shells with selectively opened regions. In this method in step 1900 the shell 1901 surface is first coated with a protective layer 1915 such as photoresist, or with a metal coating such as gold which is then coated with a layer of photoresist. The photoresist is then exposed selectively to light, for example through a shadow mask as described in FIG. 15. The photoresist can alternatively be exposed using a laser that scans the entire surface and only exposes the photoresist where the photoresist needs to be removed (in case the photoresist is a positive photoresist in which case it will be removed in a developer in those regions where it is exposed to the laser). Once the photoresist is exposed, it is developed in a proper developer, as it commonly used and known to a skilled artisan, and is removed in the exposed regions. The photoresist mask is then used to etch any layer underneath it, and/or alternatively the photoresist alone or the photoresist together with another masking layer underneath it, or just the masking layer, could be used to etch away the exposed regions of the shell in for example a wet etchant. Once those exposed regions are completely etched, the photoresist or other masking layers are removed, leaving behind the shell 1950 with selectively removed region, as is shown in FIG. 19.

Stacked Three Dimensional Shells

As discussed previously, these 3D shells can be actuated to resonance and their resonance patterns can be sensed using capacitive electrodes that are located close to and separated from the resonator by a small gap. For large and symmetric drive/sense signal, it is desirable to have substantially uniform gap dimensions and conformal overlap of the electrode with a substantial portion of the resonator to obtain large capacitance. Similarly, for better tuning capability (matching the drive and sense frequencies), large electrostatic forces are needed which can be obtained by using large voltages or by increasing the overlap area between the electrodes and the vibrating shell. At the millimeter scale, two approaches have been taken to make 3D shells using different materials.

In both approaches, the resonators and electrodes are fabricated separately and then integrated together to form the final structure that has the resonator shell separated from the electrodes through a capacitive gap. In this regard, two electrode architectures have been investigated.

One of them uses "surface electrodes" where the electrodes are placed beneath the rim of the resonator shell (this resonator has the shape of a half toroid) to drive the device into resonance and then sense the out-of-plane motion. The out-of-plane motion is small and limits the sensing sensitivity. Also, the capacitance is small which limits frequency tuning capability.

Figure 5:
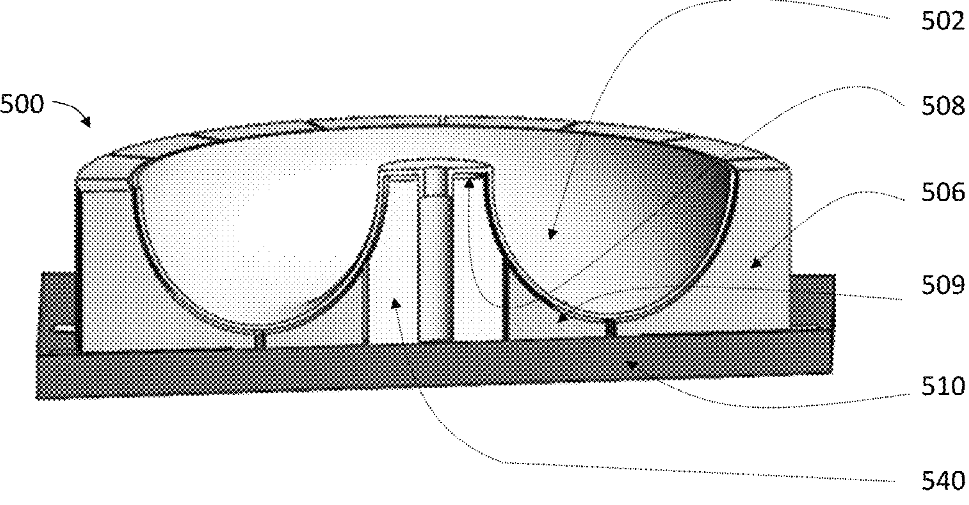
FIG. 5 depicts a shell resonant gyroscope where the electrodes conform to the shape of the shell resonator to achieve large capacitance.

Referring to FIG. 20 and also shown in various structures shown in FIGS. 4 and 5, a stacked resonator 2000 is shown. The stacked resonator architecture uses "side electrodes" 2004 where the electrodes are placed either outside or inside of the resonator 2001 to sense larger in-plane motion. This architecture has better sensitivity, larger capacitance and better tuning capability as compared to the surface electrode 2006 architecture because the overlap area between the shell and the electrode is larger than that between the shell and surface electrodes. Of the two, side electrodes 2004 are better choice for both large capacitance and better tuning capability. However, the capacitance between the shell and the electrode is still limited as the electrodes typically have straight sidewalls which leads to non-conformal overlap and the gap is sometimes too large. To overcome this, electrodes can be formed on a substrate 2008 where some regions are formed using different techniques to create a 3D profile that have substantially the same shape as the resonator. For example, the substrate 2008 can be machined or etched or molded to create 3D curved cavities which are then coated with an electrically conductive material. The resonator shell is then assembled on this substrate to complete a capacitive resonator for use as a gyroscope or other resonant devices like clocks or other types of sensors. Another approach that is used at the macro scale is based on machining and forming curved electrodes from another block of material using mechanical drilling or milling etc. However, at the micro and millimeter scale this is not practical and does not provide the needed precision. As shown in FIG. 20, it is desirable to have electrodes 2002 that can substantially conform to the inside or outside, or both, surfaces of the resonator shell and be separated from it by a small gap without using the above techniques. One such curved electrode 2002 is shown on the left side of FIG. 20. For proper operation of the gyroscope, multiple electrodes are needed around the resonator shell.

In this disclosure, blowtorch molding or glass blowing or another technique is used to deform a substrate into a 3D shape similar to the shape of the resonator shell to create an electrode substrate. In other words, the electrodes shell can be in the shape of a molded 3D shell that is fabricated using molding and deformation techniques similar to those used to make the resonator shell. Molded 3D shells, however, have not been used as electrode substrates/shells to create multiple electrodes that provide a substantially conformal overlap with the resonator shell and where the electrode conductor is separated from the conductor on the shell only using an air gap without any intervening material. The molded electrode shell can be coated with an electrically conductive material. Multiple electrodes can be formed on a single molded electrode shell where each electrode is electrically isolated from other electrodes to allow the formation of sense, drive, tuning, and control electrodes on the same electrode shell. Once the electrode shell is formed using blowtorch or glass blowing molding technique and conductive electrodes are formed on it, the resonator shell, that is also coated with a conductive layer, is assembled inside of it or on top of it to complete the resonator devices, like a vibratory gyroscope with integrated capacitive sense and drive electrodes. The advantage of a deformed or molded 3D shell used as the electrode substrate is that the electrodes can have a large area, can have a shape nearly conformal to the resonator shell, and can be stacked below and/or above the resonator shell. The molded 3D shell structure opens up a number of possibilities for making a variety of resonant and non-resonant shell devices that are not possible with existing techniques.

In addition, this disclosure presents the idea of stacking of multiple resonator shells and molded electrode shells to allow the formation of more complex structures that could provide many potential advantages in terms of mechanical quality factor, signal to noise ratio, frequency matching, and other advantages. Because the electrode substrate is now molded and has a similar shape as the resonator shell, one can stack one resonator shell and one electrode shell, or one can stack multiple resonator shells and one or more electrode shells.

Both surface and side electrode architectures provide limited capacitance and do not exploit the large surface area on the surfaces of the 3D shell. Therefore, both signal sensitivity and frequency tuning and driving capability are limited. One aspect of this disclosure is to propose a structure and a method of making tall and curved side electrodes substantially conforming to the shape of the resonator by molding to make a 3D structure. This would lead to large and substantially conformal overlap and improved tuning capability. Another aspect of this disclosure is the creation of multiple stacked 3D structures, each being tall and curved with desired extent of shape conformability with each other while maintaining a desired gap between individual structures. A subset of these stacked structures can be used as a gyroscope. Key features of structures made using the molded 3D electrode shells are: nearly uniform capacitive gap between the electrode shell and the resonator shell; nearly conformal overlap between the electrode shell and the resonator shell; structures nearly conforming to each other; and same material is used for making both the resonator and electrode shells, significantly reducing temperature sensitivity of the overall structure.

Applicants previously developed a technology to fabricate curved electrodes using electroplated photoresist as a sacrificial layer and metal electroplating to define very low gap conformal electrodes. However, the aspect ratio was limited, and a lot of post-processing was required and the electrode material was different from the shell resonator material which could lead to different behavior in response to temperature. Another method also reported by applicants used the 3D resonator shell as a mold stamp to emboss patterns in a second substrate thus molding the substrate material to take the shape of the 3D shell resonator. Electrodes were then formed on this embossed electrode substrate. This method produced a flat substrate that did not allow stacking of the electrode and resonator shells, especially if more than one resonator or electrode shells were required. This technique also limited the range of material that could be used to make the electrode substrate since not all materials could be stamped/embossed easily. This disclosure is unique as here the electrodes are defined on another molded shell. This gives one the flexibility to stack multiple electrode and resonator shells in many different ways (one-side stacking or both-sides stacking). At the same time, electrodes can be placed either inside or outside of the resonator shell or both inside and outside.

FIG. 21 shows the basic elements of an example embodiment of a stacked resonator structure 2130, and the fact that the deformed molded electrode structure 2110 allows such stacking. An example resonator shell 2100 is shown. The electrode substrate 2110 is made by molding it from another substrate and the electrode structure 2120, not the package or a protective cap, is 3D and conformal to the resonator shell 2100, and that these molded electrode shells will allow the formation of stacked structures. For example, the electrode substrate 2110 has, as described above, beams 2114 that support gaps 2112 and a support post 2116. The electrode structure 2120 has a support structure 2124 and a support post 2122. For example, the stacked resonator structure 2130 includes the resonator shell 2132, the electrode substrate 2134, an air gap 2136 between the resonator shell and the electrode substrate 2134, and the electrode structure 2138. It is noted that it is possible to form a stack of two resonators using flat (not molded) electrode substrates, and this idea is also subject of this disclosure as presented later. In other words, stacked resonators do not have to have molded 3D electrode substrates if only two resonators are stacked. This in itself is a novel idea. But for making more than two stacked resonators one does need the molded 3D electrode shells.

FIG. 22 depicts a structure 2200 where the electrode shell 2204 is on top of the resonator shell 2202. In this embodiment, the inside of the electrode shell is coated with an electrically conductive coating layer which is patterned or deposited through a stencil mask to form different electrodes, and the resonator shell is also coated with metal everywhere. Electrical isolation between the electrodes and the resonator electrically conductive coating layer is not shown here. Note that the resonator shell 2202 is attached to a substrate (not shown) where the middle post is located, and the electrode shell is attached to the substrate around its perimeter 2206.

FIG. 23 shows two arrangements 2300 and 2330, where in 2300 the electrode shell 2304 is on the outside of the resonator shell 2302, and in 2330 the electrode shell 2334 is on the inside of the resonator shell 2336. The electrode shell, 2304 and 2334, is coated on the side facing the resonator shell with electrically conductive coating, 2332 and 2306, to form electrodes and is attached to a support substrate both in the middle and around the perimeter to ensure that a good stiff electrode is achieved.

There are several different variations of the stacked resonator and electrode shells that can be arranged to make different kinds of sensors and actuators, including vibrating gyroscopes and mechanical oscillators, or antennas or optical lenses or other types of structures for sensors and actuators. One of these embodiments that can be used for a vibrating gyroscope is shown in FIG. 24. It consists of two pairs of resonator-electrodes stacks, 2400, that were described above and are now stacked face to face to produce structure 2420. Note that each pair has a resonator, and electrode shell which contains many conductive electrodes to drive and sense the motion of each resonator and that all of these electrode signals are connected to the outside, although the connections are not shown here but can be achieved in a number of different ways. FIG. 25 shows the 3D view of this stacked structure 2500 showing both electrode 2502 and resonator shells 2508, which are attached together at 2504 and share a common central axis 2506.

FIG. 26 shows cross sectional 2600 and perspective cut-out 2630 views of a similar stacked electrode-shell structure but here each resonator-electrode pair is supported on its own support base 2610 and then the two support base substrates are attached face to face. All of these processes and assemblies can be performed at the wafer-level.

A gyroscope fabricated as shown in FIG. 24-26 could potentially provide several advantages. For example, it is possible to drive one of the shells in a resonance pattern that is out of phase with the other shell stacked with it. This means that the two n=2 (or higher modes like the n=3 modes) wine glass modes of each resonator are separated by 90 degrees. This out of phase resonance could be useful in achieving excellent quality factor for the resonance by reducing the amount of energy lost through the anchor (i.e., the attachment point where the two posts shown in the center of each resonator touch and are attached). In addition, when this stacked structure is subjected to rotation around the vertical longitudinal axis that runs through and parallel to the posts, meaning the axis vertical to the plane formed by the junction where the two stacks are attached, the vibration patterns of the two shells move in opposite direction due to the Coriolis force and therefore it is possible to obtain a differential signal from the stacked structure and achieve a better signal to noise ratio.

Another embodiment of this stacked pair 2700 is shown in FIG. 27 with a cut-out view 2730. In this embodiment, two resonator-electrode pairs are attached to the opposing surfaces of a single substrate 2709 and each resonator 2704 and 2706 could be driven using surface electrodes 2708 fabricated on each surface. It is therefore possible to use the electrode shell 2702 to drive and tune the resonance of the shell and use surface electrodes 2708 to sense the motion.

It should be noted that this embodiment of two stacked back to back shell resonator is a novel idea and does not necessarily have to be done only using molded electrode substrates. It is possible not to use electrode shells at all and only use surface electrodes to drive, tune, and sense the vibration of each shell. In this case, molded electrode shells are not required. This embodiment is shown in FIG. 28, and it can be easily understood that the electrode shells 2802 and 2808 are driven and sensed using surface electrodes 2806.

FIG. 28 shows two resonators shells 2800 and their electrodes mounted face to face to back to back at a common anchor point 2804. It is also possible to assemble or stack the resonator shells and the electrode shells in other configurations, for example by nesting them one inside the other. FIG. 29-31 show several examples of some possible embodiments. For example, in 2900 in FIG. 29 it is shown that it is possible to stack a resonator shell 2904 inside an electrode shell 2906, and then place another electrode shell 2902 on the resonator shell 2904, so that the resonator shell 2904 will have electrode shells 2902 and 2906 both on the inside and outside of it. All these shells are attached together at 2910 and eventually anchored to a substrate not shown. This will provide more sense or drive electrodes and could possibly increase the ability to tune or sense the vibration patterns using lower voltages or over a wider range of operation. FIG. 29 also provides an example stacked resonator structure 2930 having an electrode shell 2938 surrounding a first resonator shell 2934 and a second resonator shell 2934 with a common mounting point 2940 with another electrode shell 2932.

Another design shown in FIG. 30 could have one electrode shell 3008, then two resonator shells 3004 and 3006 and then another electrode shell 3002 nested or assembled inside one another to produce 3010. The bottom resonator shell 3006 is driven and sensed using the bottom electrode shell 3008, and the top resonator shell 3004 is driven and sensed using the top electrode shell 3002.

It is easily understood that variations of this stacking with different numbers of resonator shells can be formed. For example, FIG. 31 shows in 3110 and 3130 and 3150 and 3170 and 3190 that there could be a single electrode shell and then two or three resonator shells placed inside each other. Electrode shells are 3112, 3118, 3138, 3152, 3158, 3180, 3172, 3196, and 3192. Resonator shells are 3114, 3116, 3134, 3136, 3132, 3154, 3156, 3174, 3176, 3178, and 3194. It is easily understood that variations of this stacking with different numbers of resonator shells can be formed. For example, FIG. 31 shows five different examples of stacked shell configurations. In 3110, two suspended shell layers 3114 and 3116 acting as proof masses (i.e. proof mass shells) are stacked. These shells are attached at the anchor region 3120. The upper proof mass shell 3114 is stacked with an upper electrode shell 3112. These layers are attached at the anchor region 3112. The electrode shell 3112 has an electrode layer patterned on the curved surface (not shown) facing the proof mass shell and is attached to a support substrate (not shown) at the outer flat boundary region. The lower proof mass shell 3116 is stacked with a lower electrode shell 3118. These shells are attached at the anchor region 3112. In 3130, three layers of proof mass shells 3132, 3134, 3136 are stacked, and they are attached at the region 3140. The lowest proof mass layer is stacked with a lower electrode layer 3138. These layers are attached at the anchor region 3140. In 3150, two layers of proof mass shells 3154 and 3156 are stacked. They are attached at the anchoring region 3160. The upper proof mass shell 3154 is stacked with an upper electrode shell 3152; however, these layers are not attached at the center region 3162. The lower proof mass shell is stacked with a lower electrode shell 3158. These two layers are attached at the anchoring region 3160. In 3170, three layers of proof mass shells 3174, 3176, and 3178 are stacked. These layers are attached at the anchoring region 3182. The uppermost proof mass shell 3174 is stacked with an upper electrode shell 3172. These layers are attached at the anchor region 3182. The lowermost proof mass shell 3178 is stacked with a lower electrode shell 3180. These shells are attached at the anchor region 3182. In 3190, a single proof mass shell 3194 is stacked with an upper electrode shell 3192 and a lower electrode shell 3196. These shells are attached at the anchor region 3198.

All of these designs could be used to achieve different objectives, maybe better Q factor, or better sensitivity, or better shock resistance or better dynamic range or implement different sensing and actuation functions not shown here and which may not necessarily be resonant mechanical devices. These different embodiments are not shown here.

One method for fabricating the electrode shell is the blowtorching method described previously, however, these 3D molded electrode shells can also be fabricated using micro glass blowing or by other known methods.

Formation of 3D molded shells using the blow torching method is further described. With reference to FIG. 32, two molds are used one for the resonator shell and one for the electrode shell. Depending on whether the resonator shell is inside the electrode shell or vice versa, two molds with different dimensions are used as shown in FIG. 32. For example, in 3200 the mold 3202 is for making the resonator shell which is smaller in diameter than the electrode shell and will be placed inside the electrode shell. In this case, the mold 3202 has an outer wall 3206 and a support post 3204 for the resonator shell having a smaller diameter, and the diameter is selected such that the final resonator shell has an outer diameter such that it can be placed inside the electrode shell and still be separated from the inner wall of the electrode shell by a nominal gap. The electrode shell mold shown in 3230 has a larger diameter. As shown in FIG. 32, each device shell (the resonator and the electrode) is molded using its own mold. In 3250 the flat fused silica substrate 3252 is placed on the mold and blowtorched and deformed. Piece 3270 shows the molded fused silica substrate after blow torching. The resonator shell in 3290 is the final product of piece 3270 having a shell structure 3274 and a support post 3276 that is released from its flat part 3272 using techniques described later in this document so only the resonator shell is left behind. This shell could be coated with an electrically conductive layer, not shown.

The resonator shell is placed inside the electrode shell as illustrated in FIG. 33. The electrode shell is fabricated using one of the techniques described above related to one of the techniques where a shell is processed to have selected regions of it removed. Flat fused-silica shell substrate at 3300 is blow torched to make a resonator shell at 3310. The resonator shell at 3310 is released from the substrate and coated with metal at 3320. At 3330 the metal coated resonator shell is placed in the electrode shell of 3370 and the support base of 3380. The flat electrode shell 3340 with a pattern and etch fused-silica electrode substrate 3350 is blow torched resulting in the electrode shell having beams 3354 and selective thin slots 3352. Etch is applied to open the slots 3364 of the electrode shell 3360 leaving the beams 3362. The electrode shell 3360 is then placed between the resonator shell 3330 and the support base 3380 resulting in the electrode shell 3370. One of these methods is again shown in FIG. 34.

With reference to FIG. 34, start with a fused-silica substrate at 3400 and then pattern and etch this substrate in selected regions so the substrate is thinner in these regions 3404, and has the same original thickness in other regions 3402. Subsequently, an electrode shell 3450 with etched regions 3452 is shown (step A). Materials other than fused silica can also be used. This patterned substrate is then placed on a mold 3422 and a blowtorch 3424 is brought close to it so it softens and deforms so that it can sag into the mold 3422 through a pressure difference that is created across the top and bottom surfaces of the substrate through holes that are formed inside the mold. In addition, the electrode shell 3460 includes thicker regions at the edges 3462 and the center 3468 as well as a thinner region 3466 positioned on a electrode shell mold 3464 similar to 3422 (step B). Although in this FIG. 34. the deformed 3D structure 3426 does not follow the shape and profile of the mold, it is possible to make a mold with a specific shape and have the substrate being molded to touch the mold and follow the pattern that is created in the mold. The molded structure 3426 is now separated from the mold. Furthermore, the electrode shell 3470 is molded similarly (step C). Note that when the substrate is molded at 3420 it will have some regions where the 3D structure 3426 is thinner, 3428, in the regions where the unmolded substrate was etched to be thinner 3404 while some regions are thicker regions 3430. These thin regions 3428 are needed to provide electrical separation and isolation between multiple electrodes that are supported on the molded electrode substrate. Once the substrate is molded, thin regions 3428 are etched away, shown as 3444 in 3440, leaving behind the rest of the shell 3442 where only the thicker regions 3446 are left behind. The electrode shell 3470 is cleaned resulting in the molded electrode shell 3480 after cleaning with gaps 3484 removed from the shell (step D). At this point, the shell is one piece except there are openings 3444 in it where the thin regions were located after molding (step D). The shell is now coated with a conductive coating 3482. The conductive coating can be deposited through a shadow mask 3504 and 3506 (shown in FIG. 35) so that it does not deposit in the center where the post is located, as shown in FIG. 35. Alternatively, the thin coating can be deposited on the patterned 3D structure 3442 and separation between the conductive coatings for individual electrodes can be formed naturally because the conductive coating might not be able to cover over the large step created due to the thinning and etching of the electrode substrate before it was molded.

FIG. 35 shows how a conductive coating can be deposited on the inside of the electrode shell. In 3500 a shell 3502 that does not have any thin or open regions is shown. A shadow (stencil) mask 3507 consisting of a number of spokes 3504 and a rung 3506 is placed and aligned over the shell 3502. The conductive coating is deposited through the shadow mask on top of electrode shell 3502 and forms isolated electrodes on the inside of the 3D shell. In 3630 it is shown that the same shadow mask concept described above can be used with an electrode shell that has selectively removed regions as shown in step C in FIG. 34.

It is also possible to use other means to prevent deposition of the conductive coating in the center of the shell where the post is located. The conductive coating is also deposited on the flat part of the electrode shell where it forms separated electrode areas. The conductive coating is naturally separated in the electrode shell areas where there are the open regions. Therefore, it is possible to form individual separated electrodes that have a curved shape and that this shape substantially follows the contour of the resonator shell. The resonator shell is fabricated using blowtorching as well and will have a similar contour as the electrode shell so that when the two are placed on top of each other, they are separated by a nearly conformal gap.

The overall fabrication and assembly process is shown in FIG. 33. Note that this is one embodiment of this stacked structure and many other embodiments for fabricating and assembling these structures can be used but not described here. Note that the electrode shell and the resonator shell could be attached using a number of different kinds of adhesives, like solder which is electrically conductive and glass frit which is not electrically conductive. Electrical signals from both the resonator and the electrodes have to be brought to the outside and those electrical connection lines could be supported by the support base, but they are not shown in here. There are several ways that this can be done using standard techniques that are not shown here.

As mentioned before, the molded electrode substrate does not have to have the thin regions that are subsequently etched away. It is possible to start with an electrode substrate that is uniform in thickness before being molded and to have the isolated conductive electrodes deposited on the molded electrode substrate through a shadow mask or by coating the molded electrode substrate with a conductive coating everywhere and then patterning the conductive coating to form the electrodes. Selective deposition of the conductive layer is also possible using other techniques. The important thing is that the electrode substrate is molded and supports multiple isolated conductive electrode regions on one or both of its top and/or bottom (i.e., concave and convex) surfaces.

Up to this point, this disclosure has described the fabrication of shells with selected regions that are removed and opened to create many different 3D structures for use in various devices, including gyroscope devices. The shell that is supposed to function as a device shell, for example as the resonator shell in a vibratory gyroscope, can be formed using a number of techniques including those described above. Once this device shell is molded, the 3D useful portions need to be separated/released from the other portions that are not useful. Several different inventive techniques that describe how this separation can be done are described below.

Releasing Three-Dimensional Structures

To release the shell from its host substrate and remove the portions that are not needed after the shell is molded, two methods have been used in the prior art. These methods are briefly explained to provide some background and motivate the need for other techniques that are set forth in this disclosure.

One method utilizes mechanical grinding and polishing is illustrated in FIG. 36. At 3600, the deformed/molded substrate 3602 is placed on a handle substrate/wafer 3608 that has cavities 3610 to accommodate the three-dimensional deformed part. The rest of the deformed substrate 3624 that is flat and not needed sits on top of this handle substrate. At 3620, a polymer/wax 3622 may be applied inside the cavity, below the non-flat three-dimensional part of the deformed substrate, and inside the non-flat three-dimensional and molded part of the substrate to protect these useful three-dimensional regions of the structure. The handle wafer with the flat parts facing up may be placed face down on a grinding/lapping surface (pad) and the flat parts 3624 are mechanically grinded away. Once the flat parts are grinded away at 3640, the remaining three-dimensional parts 3642 are removed from the polymer by dissolving the polymer away in a solvent solution or gas. The remaining 3D shells can then be cleaned and further processed to form the final device structure.

Another method utilizes a femtosecond laser to ablate the regions at the junction 3722 of the three-dimensional part 3704 and flat part 3472, thus separating the two, as illustrated in FIG. 37 at 3700. At 3720 the laser 3706 ablation cuts off the junction 3722 thus releasing the three-dimensional structure 3730 from the flat part 3472, resulting in structure at 3730. Sometime the laser is also scanned in a predefined pattern to leave specific shapes and patterns attached to the rest of the three-dimensional structure.

Both of these approaches have been used in releasing (i.e., singulating) three-dimensional shell structures used as resonators or other devices for specific functions. Shell structures released/singulated using grinding/lapping plus polishing method have yielded Q>10 Million, whereas those singulated using laser cutting method have obtained Q<1 Million, which may be due to laser-induced damage causing loss of energy through various damping mechanisms. While both these methods have worked, each of them has its own challenges.

Mechanical grinding/polishing/lapping requires long processing time with several steps and can only handle limited devices per batch. Mechanical grinding/polishing/lapping may also produce bubbles in the mounting wax, which may damage the shell and leaves behind particles of polishing slurry on the surface of shells that require careful cleaning. Although these challenges can be overcome to produce very high-quality (Q) resonant shells, or three-dimensional structures with very smooth surfaces or very transparent three-dimensional surfaces, the release/singulation step could add to the cost or time of manufacturing, which will increase the final cost of the device.

The laser ablation method described above does not require grinding and polishing, but it requires precise alignment of the laser to the critical features of the three-dimensional shell structure, which might take time and potentially introduce unwanted asymmetries or imperfections into the final structure. In addition, because this laser cutting/ablation process is done on one device at a time, meaning it is a serial process, it adds time and eventually cost to the overall process. Further, the laser ablation process might cause unwanted damage to critical regions of the three-dimensional structure that might degrade the performance of the final device that utilizes the three-dimensional part as its core element.

Accordingly, it would be desirable to develop improved three-dimensional fused silica, or other materials and structures, and methods of making the same, that can address these challenges.

One approach that is much faster than mechanical grinding or laser cutting and requires much less sophisticated equipment, utilizes wet liquid, or vapor phase chemical etchants to remove the unneeded or undesired parts of the parent substrate that support the three-dimensional structures. One such chemical etchant that can be used for singulation and release of molded structures from fused-silica or fused-quartz or glass or similar materials is hydrofluoric acid, or other mixtures including hydrofluoric acid. It is understood that other chemicals might be used and hydrofluoric acid is mentioned here as an example and is not meant to be limiting.

As illustrated in FIG. 38, the method may include, for example at 3800, disposing the unfinished three-dimensional shells 3802 into one or more prepared cavities or recesses 3824 of a substrate 3822, for example at 3820. After placement within the substrate 3822, the method may include, for example at 3840, surrounding portions of the unfinished three-dimensional structure 3802 to be maintained with a protecting material, for example curable wax 3842 (such as Crystalbond 509), so as to define a first protecting portion 3846 and a second exposed portion 3844. An acid (such as hydrofluoric acid) may be used, for example at 3860, to etch (e.g., remove) 3862 any exposed portions of the unfinished three-dimensional structure 3802. The protecting material 3842 may be removed (e.g., dissolved using acetone), for example after 3860, so as to form a finished three-dimensional structure 3880.

FIG. 39 shows a magnified view of the process shown in FIG. 38, except in FIG. 39 we show only one shell. The process depicted in FIG. 39 is the same as discussed above for FIG. 38. At 3900, for example, a shell 3902 is shown. The shell 3902 is placed in the recess 3924 of the substrate 3922 at 3920. At 3940, the shell 3944 is surrounded by portions of protecting material 3946, so as to define the shell 3944 and the exposed portion 3942. At 3960, an acid may be used to etch any exposed portion leaving the shell 3962, and the protecting material 3946 is removed shown as 3980.

The finished 3D shell 3880 may have, in certain instances, a rim that is more rugged and sharp-edge than three-dimensional structures prepared using, for example, a grinding/polishing method. The ruggedness of the rim of the three-dimensional structure 3880 is not necessarily a problem from performance point of view when used as a resonator, but the angled profile of the rim may be a potential disadvantage when used in conjunction with electrodes placed below the rim on a support substrate for capacitive transduction, due to small overlap area. To form three-dimensional structures having cleaner edges, in certain variations, it may be advantageous to use a combination of the acid etching approach detailed above and chemical-mechanical planarization (CMP).

In certain instances, as illustrated in FIG. 40, at 4000 the unfinished three-dimensional structure 4002 may be patterned so as to have at least one first region 4004A having a first thickness and at least one second region 4004B having a second thickness, where the first thickness is greater than the second thickness. The second regions 4004B will etch faster than the thicker regions or portions 4004B of the shell 4002 and thus may ensure that the unneeded parts (e.g., exposed parts) are removed. At 4020, the three dimensional structure 4002 is surrounded by protecting material 4022. Etching is applied at 4040 removing the thin region as a gap 4042. In this case it is observed that the rim of the shell 4060 has an extension (or lip) 4065 that is formed around the rim. If the width of this extension/lip is narrow it will not affect the operation of the device in certain instances. It is noted that the thin and thick regions in the unfinished structure could be created using techniques described previously and shown in FIGS. 16 and 17.

FIG. 41 shows that the 3D structure could be protected using a mask during the wet etching step. The standalone 3D structure 4102 at 4100 is placed inside the cavity 4127 of holding wafer 4124 at 4120 and then covered with polymer/wav 4127 to protect the structure 4102. The mask 4122 could be a stencil mask to mask one or more portions of the structure 4102. The stencil mask 4122 may be a dry photoresist film or a patterned silicon wafer. In the case of a dry photoresist film, the stencil mask (photoresist film) may be laminated onto one or more surfaces of the unfinished three-dimensional structure 4102. Once positioned at 4140, the stencil mask above the structure 4142 may be selectively exposed to UV radiation and/or laser scan so as to shape the stencil mask. The mask could then be developed and patterned by standard techniques. The mask is used to etch away the unwanted portions of the 3D structure. This approach also leaves an extension 4165 beyond the rim of the structure 4160 as shown in cross section, similar to the structure shown in FIG. 40.

If the mask 4210, as used in FIG. 41, is patterned, it is possible to create various features around the rim of the structure 4202, as illustrated in FIG. 42. The structure 4202 seated in the mold 4204 is shown as having a resonating structure 4208 and a gap 4206. For example, it is possible to create a wider or narrower extension or lip 4244 using the shadow mask 4222, or to create small tabs or beams 4246 around the perimeter of the rim using the shadow mask 4224, as shown in various schematics of FIG. 42. 4200 in FIG. 42 shows the process similar to that explained for FIG. 41, and FIG. 42 depicts shell structures 4242, 4244, and 4246 depending on the mask structures or no mask.

The released structures in FIGS. 41 and 42 have an extension or lip beyond the top portion of the rim of the 3D structure. When this structure is used as a resonator, for example when the structure is a suspended cylindrical structure as shown in FIG. 7 and it is resonating in the n=2 wine-glass mode around the central axis, the existence of this extension could change the resonant frequency or create certain asymmetries in the resonant frequencies of the two modes. Therefore, it is desirable to minimize the size of this extension.

FIG. 43 illustrates another inventive technique for releasing these shells. In this technique at 4300, the shells 4302 are molded as before from a starting flat substrate, with flat portions 4304A remaining. The substrate however has regions 4304B where it has been thinned by pattering and etching the initial flat substrate. These thin regions extend all the way to the rim of device. At 4320, the shells 4302 are encapsulated in protective material 4327 while seated in a mold 4328 with a recess 4329. Therefore, when released using a wet etchant at 4340, the thin regions 4304B are completely etched away as shown by 4341, leaving behind the rim of the shell 4366 without any extensions at 4360.

In yet another inventive releasing technique as shown in FIG. 44, the flat substrate with shells 4402 at 4400 could be patterned to that it has a first thick region 4404A (i.e., the starting thickness of the original flat substrate), a second region 4404B thinner than this thick region 4404A, and a third region 4404C thinner than this second region 4404B. In other words, the substrate has three regions with three different thicknesses. The two thinner regions can be created on an initially flat substrate using techniques described previously. This substrate with these different thickness regions is molded and then released using wet etching as illustrated in FIG. 39. This released 3D part 4466 also has an extension/lip beyond the edge of the rim, but the extension is well defined because the outside perimeter of it is defined using the thinnest region that was created in the original substrate. In FIG. 44, steps 4400 and 4420 show the substrate with shells 4426 facing up when molded, whereas 4440 and 4460 shows the substrate with the three different regions 4444A, 4444B, and 4444C along with a shell 4442 facing down when molded.

FIG. 45 illustrates another inventive technique for releasing the 3D structures from their unneeded substantially flat parts. At 4500 and 4520, the flat part 4504 or 4524 of the deformed substrate 4502, the side where the substrate is concave, is placed on top of a solid meshed (or perforated) substrate 4525 with holes 4526 of different sizes and shapes as needed, where the mesh could be formed in a previously un-patterned substrate, and the support post 4523 extends to the substrate 4525. At 4540, this perforated substrate is placed inside an etch bath 4547, for example hydrofluoric acid 4548. The acid will come to the top surface of this mask through the perforations 4526, only if the mask is taller than the height of the wet etch in the bath. The wet etchant would wick through these perforations 4526. At 4560, when the molded structure with its flat part 4524 is placed on top of this perforated substrate, the wet etchant will only touch the flat parts and will etch away those parts 4569. Therefore, no protection is needed for the other regions of the molded structure, resulting in the structure 4582 at 4580. The perforations provide selective access for the etchant to the non-useful part.

FIG. 46 illustrates a process similar to FIG. 45. At 4600, the structure 4602 is shown including flat portions 4604. At 4620, FIG. 46 shows that the post 4623 part of the structure can be protected using a polymer/glue 4621 which also ensures the structure remains attached to the meshed substrate through the etch process. 4620 also shows the flat portions 4624 of the structure atop a substrate 4625 along with perforations 4626. At 4640, the structure is placed in a bath 4647 and the bath along with the substrate is filled with hydrofluoric acid 4648. At 4660 and 4680, the flat parts are etched away at parts 4669, leaving structure 4682. The attachment of the molded structure to the perforated substrate using wax or polymer/glue where the post is located can be performed before the combination is placed inside the etch bath.

Another inventive technique for releasing the molded 3D structures is illustrated in FIG. 47 at 4700, where a layer of photosensitive material or other polymer 4702 can be selectively patterned and removed over the regions of the 3D molded substrate that need to be removed, and kept in place (e.g., on top of) the useful portions of the 3D molded substrate that will form the shell 4806. In such instances, a protective metal layer 4805 may be first coated on the inside (concave) portion of the three-dimensional structure 4806. The 3D molded substrate is then placed inside the cavity of a holding wafer 4708 and the cavity is filled with a protective layer 4707, which might be photosensitive. A photosensitive material or other polymer 4702 may be disposed on an exposed surface of the protective metal layer 4805. When the photoresist layer 4702 is exposed to UV light 4721, for example at 4720, the regions of 4722 that are over flat surfaces are exposed more and the regions that are over the non-flat regions 4723 are exposed less. These less exposed regions remain behind after the photoresist layer 4722 is developed, as shown in 4740, which leaves the flat portions 4741 of the structure, the photoresist layer over non-flat regions 4743, and the protective material 4746. Note that the metal layer will reflect light back during exposure and this reflected light will cause the photoresist that is on top of the flat regions to be more exposed than the photoresist that is on the non-flat region, and as a result this photoresist will be developed away faster and easier, whereas the photoresist in the non-flat regions will substantially stay behind. In certain variations, the backside (convex shapes) of the structures 4806 may also be coated with a metal layer 4805 to provide additional protection against the acid bath and etching from the backside. Note that this technique does not require a mask since the photosensitive layer is exposed everywhere during step 4720, and the photoresist is developed away and will be perfectly aligned (self-aligned) to the edge of the rim of the 3D molded structure. In step 4740, after the photoresist is developed and any remaining materials, including the metal layer 4805 are etched away using the photoresist mask, the holding wafer is placed inside a wet etch bath, like hydrofluoric (HF) acid, and the flat regions are etched away, and the 3d molded shells are not recovered from the holding wafer and the protective polymer/wax is removed to get structure 4766 with a layer of metal coating 4765 on it at 4760. The metal coating is removed to produce the final shell structure 4768.

Another inventive technique for releasing the molded structures is illustrated in FIG. 48. Previous techniques used wet etchants to release the structures. It is also possible to release or separate structures using sandblasting. Sandblasting is frequently used to remove various materials and can be done on large substrates and it is therefore a very high volume and batch process. FIG. 48 illustrates how to use sandblasting to remove the non-useful parts of a 3D structure. At 4800, the molded structure 4806 is supported on a handle wafer 4808 that has holes in it to accommodate the 3D extensions of the substrate. The structure is then covered with some polymer 4807 (e.g., wax or Crystalbond); the top side (the concave side) is also covered with a thin layer of the same polymer or photoresist 4802. At 4820, this top side is now subjected to a sandblast jet 4823 and is sandblasted.

Note that the sandblasting will go through the top polymer layer 4822 and will then start removing the non-useful portions 4825 of the 3D structure. At 4840, some small portions of the useful parts 4844 near the top of the rim might also be removed, leaving the 3D structure 4846. However, this will not substantially change the properties of the device. The final 3D structure 4866 is then released from the handle wafer and cleaned and rinsed in step 4860. One advantage of the sandblasting approach is that it avoids the use of wet chemicals and can be done on a batch scale and could be potentially low cost and easily performed in a variety of facilities. No masking step is required and there is no need to selectively remove the top layer 4822 over the flat portions since the sandblast will remove materials from the top shown in step 4820 layer by layer.

Note that this idea can also have several variations, including the fact that the deformed substrate could be coated with a layer of metal on both surfaces to provide additional protection, and that the top photoresist could be patterned to remove the photoresist on top of the regions which we want to remove but maintained over the regions where we want to protect, and also we could place an additional hard mask, or top layer, for the sandblast on the top surface in those regions to be protected but not over the regions to be blasted so that we sandblast only those regions we want to remove and not affect the device in regions we do not want to remove. The main idea is to use sandblasting which is a low-cost and effective technique for removing material quickly. Various masking steps and different protection means can be applied to enhance or retard the sandblasting rates in different regions.

FIG. 49 shows yet another approach, which is an extension of the approach illustrated in FIG. 47 and uses a protective layer to protect the 3D molded portions and exposes the non-needed flat portions. In this approach, at 4900, many devices 4904 could be mounted on a holding wafer 4908 with holes 4902 to accommodate the 3D portions of the molded part. This approach could be performed at the wafer-level, where many molded structures are created on a single large wafer. Alternatively, this also applies to many individual molded parts that are mounted on a single holding wafer. At 4920, the front (or concave) portion of the molded structures is covered with a protective layer 4925, which might be metal, and further with a photosensitive layer. At 4940, the back side (or convex side) of the molded structures is also coated with a protective layer 4946, such as a metal layer or a photoresist. At 4960, the front side photosensitive layer is then exposed to light 4969 and the photoresist is developed away, in the same way discussed in FIG. 47. The photoresist is used as a mask to etch away the metal layer underneath it and the flat parts are then etched away in a wet etchant. The protective layers are then removed at 4980 and 4990 and the final released molded structures 4992 are cleaned and available for further processing.

FIG. 50 illustrates yet another inventive technique for releasing 3D molded parts. FIG. 48 illustrated the removal of the un-needed portions of a 3D molded substrate using sandblasting. FIG. 50 illustrates that instead of sandblasting one can use ultrasonic machining or abrasion. In this method, at 5000, the molded substrate 5006 is prepared the same way up to the point where the device is ready for sandblasting, which includes placing the molded substrate 5006 in a wafer 5008 with a hole 5009 to accommodate the structure, and the structure is formed with a protective material 5007 that extends over 5002 the flat portions. Then instead of sandblasting, at 5020 an abrasive surface 5021 is used and a slurry 5023 and ultrasonic vibrations and energy are used to agitate the slurry and remove the flat portions 5022. Note that although this approach might sound similar to the lapping and polishing technique that applicants have described previously, it is actually very different since using ultrasonic machining does not require a lapping or polishing pad that has to be removed. At 5040, the structure 5046 remains with the flat portions removed 5044. At 5060, the protective material is removed and the structure 5066 is cleaned. Ultrasonic machining can be done in a batch process on many devices at a time.

FIGS. 51 and 52 show yet another inventive technique for releasing 3D molded structures as shown in 5100 and 5200. In this technique vapor-phase etchants are used instead of liquid-phase etchants to remove the flat or non-useful portions 5104 (5204 in FIG. 52) of a 3D molded substrate 5102 (5202 in FIG. 52). Vapor-phase etching could be used to etch from one side (top or bottom, concave or convex) of the molded substrate. At 5120 and 5220, the structure is place in a wafer 5128 (or 5228 in FIG. 52) with a hole 5129 (or 5229 in FIG. 52) to accommodate the structure, and the side that is exposed is protected using a metal or other type of protective mask 5127 (or 5227 in FIG. 52) that is deposited and patterned to cover the regions 5152 (or 5225 in FIG. 52) that we do not want to etch, and leave exposed the regions that we do want to etch, as shown in 5140 and 5220. Vapor-phase etchant 5150 or (5230 in FIG. 52) will etch away the unwanted portions 5241 and not the protective mask 5147. At 5160 and 5260, the 3D structure 5162, 5262 is cleaned is all that remains. The advantage of vapor-phase etching is that the wafer does not have to be immersed in a liquid etch bath, it can be done quickly, and it can be done on large wafers. Additionally, only one side of the device it exposed to the etchant, thus in some instances not requiring the need to protect the side that is not exposed to the vapor-phase etchant.

FIG. 53 illustrates yet another inventive technique for releasing 3D molded structures from their host substrate 5322. At 5300, this technique requires wet chemical etchant 5303, 5323 but it uses a second liquid 5302, 5322 that is immiscible with the chemical etchant 5303, 5323 to ensure that the wet chemical etchant only etches the regions we want to etch and not be exposed to regions we do not want to etch, as shown in 5320.

As shown before, almost all the different 3D structures have a substantially flat part that to be removed. This means that one can always place the deformed substrate in an etch bath from the side that has this flat part. However, one needs to ensure that the wet etchant does not attack the other useful parts and although this could be done by masking or protecting the useful parts using some kind of coating as discussed above, it is possible to achieve this using the technique in FIG. 53. In this technique, we etch the deformed substrate in a wet etchant container 5301, 5321 that is filled with the etchant 5303, 5323 only to the height equal to the thickness of the material we want to remove from the deformed substrate, which might be a few hundred microns. At 5300, the etchant container is then filled with a second liquid 5302, 5322 that will float on top of the etchant 5303, 5323 and does not mix with it. This is similar to oil floating on top of water. At 5320, the deformed substrate is dropped into the container with the flat non-useful portions 5324 facing down so that only those portions that we want to etch are exposed to the etchant. The immiscible liquid will prevent the etchant from creeping up the sidewalls of the substrate and etch those regions that we do not want to etch.

Once etching of the unwanted flat parts 5324 is complete, the devices are pulled out of the bath and rinsed.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A stacked resonator structure, comprising:

a support substrate;

a resonator having a hollow hemispherical shape with an inner concave surface facing the support substrate;

a conductive material deposited on an external surface of the resonator;

a resonator support post integral with the resonator and extending from a center of the inner concave surface to the support substrate;

an electrode shell having a hollow hemispherical shape with an inner concave surface conformed with the resonator; and an electrode support post integral with the electrode shell and extending from a center of the inner concave surface of the electrode shell towards the support substrate, where the resonator is nested in the electrode shell and is configured to resonate, and the electrode shell is configured to drive the resonator electrostatically.

2. The stacked resonator structure of claim 1 wherein the electrode shell includes a lip formed along a rim thereof and the lip is attached to the support substrate.

3. The stacked resonator structure of claim 2 wherein the resonator and the support post are comprised of fused silica.

4. The stacked resonator structure of claim 1 where the inner concave surface of the electrode shell is patterned with an electrically conductive material to form multiple electrodes.

5. The stacked resonator structure of claim 1 wherein largest dimension of the resonator is less than thirty millimeters.

6. A stacked resonator structure, comprising:

a support substrate;

an inner electrode shell having a hollow hemispherical shape with an inner concave surface facing the support substrate;

an electrode support post integral with the inner electrode shell and extending from a center of the inner concave surface to the support substrate;

a resonator having a hollow hemispherical shape with an inner concave surface conformed with the inner electrode shell and is configured to resonate;

a resonator support post integral with the resonator and extending from a center of the inner concave surface of the resonator towards the support substrate; and a conductive material deposited on the inner concave surface of the resonator facing the inner electrode shell, where the inner electrode shell is nested in the resonator, and the inner electrode shell is configured to drive the resonator electrostatically.

7. The stacked resonator structure of claim 6 wherein the inner electrode shell includes a lip formed along a rim thereof and the lip is attached to the support substrate.

8. The stacked resonator structure of claim 6 wherein the resonator is comprised of fused silica.

9. The stacked resonator structure of claim 6 where an external surface of the inner electrode shell is patterned with an electrically conductive material to form multiple electrodes.

10. The stacked resonator structure of claim 6 wherein largest dimension of the resonator is less than thirty millimeters.

11. The stacked resonator structure of claim 6 further comprises an outer electrode shell having a hollow hemispherical shape with an inner concave surface conformed with the resonator, such that the resonator is nested in the outer electrode shell and the outer electrode shell is configured to drive the resonator electrostatically.

12. The stacked resonator structure of claim 6 further comprises a second resonator having a hollow hemispherical shape with an inner concave surface conformed with the resonator, where the resonator is nested in the second resonator; and an outer electrode shell having a hollow hemispherical shape with an inner concave surface conformed with the second resonator, such that the second resonator is nested in the outer electrode shell and the outer electrode shell is configured to drive the resonator electrostatically.

13. A stacked resonator assembly, comprising:

a support substrate;

a first resonator structure attached to the support substrate, wherein the first resonator structure includes a first resonator having a hollow hemispherical shape with an inner concave surface facing the support substrate;

a support post integral with the first resonator and extending from a center of the inner concave surface to the support substrate; and a first electrode shell having a hollow hemispherical shape with an inner concave surface conformed with the first resonator, where the first resonator is nested in the first electrode shell and the first electrode shell is configured to drive the first resonator electrostatically; and a second resonator structure attached to the support substrate, where the second resonator structure includes a second resonator having a hollow hemispherical shape with an inner concave surface facing the support substrate;

a support post integral with the second resonator and extending from a center of the inner concave surface to the support substrate; and a second electrode shell having a hollow hemispherical shape with an inner concave surface conformed with the second resonator, where the second resonator is nested in the second electrode shell and the second electrode shell is configured to drive the second resonator electrostatically;

wherein the inner concave surface of the first resonator is facing the inner concave surface of the second resonator.

* * * * *